(12) United States Patent
Lee et al.

(10) Patent No.: US 7,767,478 B2
(45) Date of Patent: Aug. 3, 2010

(54) THIN FILM TRANSISTOR ARRAY PANEL AND METHOD FOR MANUFACTURING THE SAME

(75) Inventors: Je-Hun Lee, Seoul (KR); Yang-Ho Bae, Suwon-si (KR); Beom-Seok Cho, Seoul (KR); Chang-Oh Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 12/031,121

(22) Filed: Feb. 14, 2008

(65) Prior Publication Data

US 2008/0138942 A1      Jun. 12, 2008

Related U.S. Application Data

(62) Division of application No. 11/249,500, filed on Oct. 14, 2005, now Pat. No. 7,352,004.

(30) Foreign Application Priority Data

Oct. 26, 2004      (KR) .................... 10-2004-0085683

(51) Int. Cl.
*H01L 21/00* (2006.01)
(52) U.S. Cl. .................... 438/30; 438/43; 438/149; 438/151; 438/160; 257/E27.111; 257/E29.147
(58) Field of Classification Search .................... 438/30, 438/43, 149, 151, 160; 257/421.414, E27.111, 257/E29.147
See application file for complete search history.

(56) References Cited

U.S. PATENT DOCUMENTS

| 6,184,964 | B1 | 2/2001 | Kameyama et al. | |
| 6,567,148 | B1 | 5/2003 | Akiyama et al. | |
| 2001/0030717 | A1* | 10/2001 | Kaneko et al. | 349/43 |
| 2002/0176032 | A1* | 11/2002 | Maeda et al. | 349/43 |
| 2004/0262569 | A1* | 12/2004 | Cho et al. | 252/79.1 |
| 2004/0263757 | A1* | 12/2004 | Kwon | 349/149 |
| 2006/0046358 | A1 | 3/2006 | Yamazaki et al. | |

FOREIGN PATENT DOCUMENTS

| JP | 10-253976 | 9/1998 |
| JP | 2000-208773 | 7/2000 |
| JP | 2004-163901 | 6/2004 |

(Continued)

*Primary Examiner*—Charles D Garber
*Assistant Examiner*—Abdulfattah Mustapha
(74) *Attorney, Agent, or Firm*—Cantor Colburn LLP

(57) ABSTRACT

The invention provides a thin film transistor (TFT) array panel that includes an insulating substrate; a gate line formed on the insulating substrate and having a first layer of an Al containing metal, a second layer of a Cu containing metal that is thicker than the first layer, and a gate electrode; a gate insulating layer arranged on the gate line; a semiconductor arranged on the gate insulating layer; a data line having a source electrode and arranged on the gate insulating layer and the semiconductor; a drain electrode arranged on the gate insulating layer and the semiconductor and facing the source electrode; a passivation layer having a contact hole and arranged on the data line and the drain electrode; and a pixel electrode arranged on the passivation layer and coupled with the drain electrode through the contact hole.

10 Claims, 58 Drawing Sheets

FOREIGN PATENT DOCUMENTS

| | | |
|---|---|---|
| KR | 10-0262062 | 4/2000 |
| KR | 1020010095037 | 11/2001 |
| KR | 1020030004871 | 1/2003 |
| KR | 1020030048605 | 6/2003 |
| KR | 1020030048606 | 6/2003 |
| KR | 1020030056254 | 7/2003 |
| KR | 1020040020604 | 3/2004 |
| KR | 1020040021169 | 3/2004 |
| KR | 1020040040929 | 5/2004 |

* cited by examiner

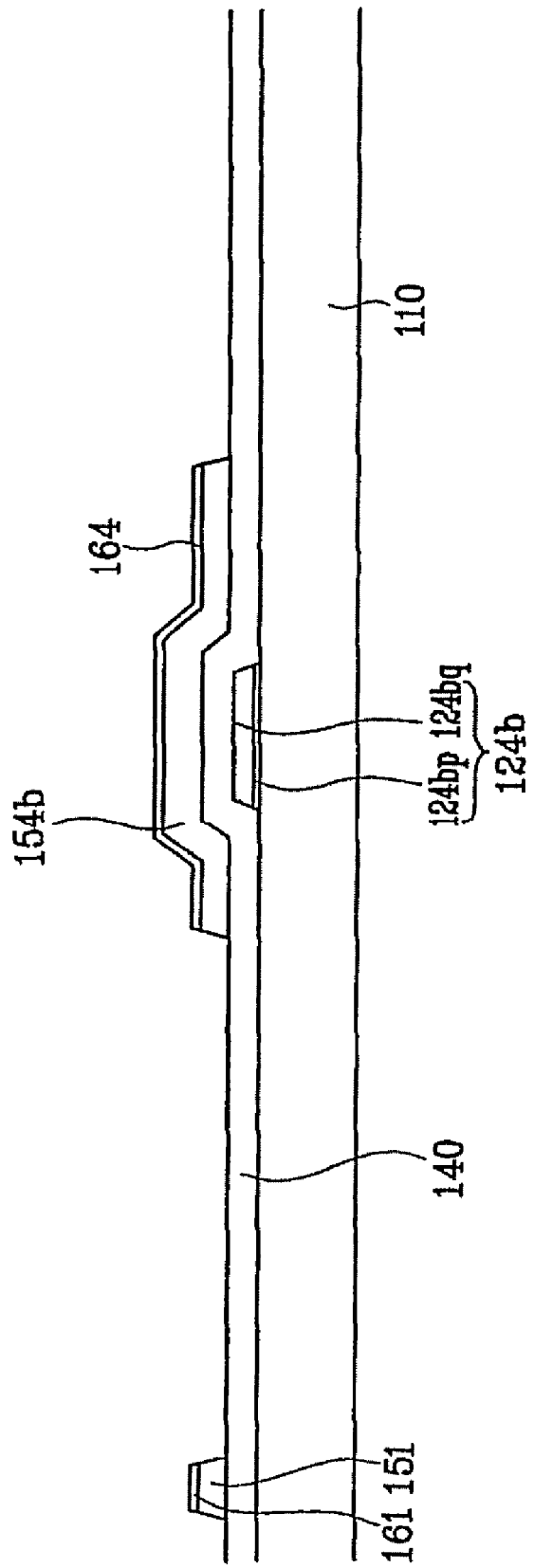

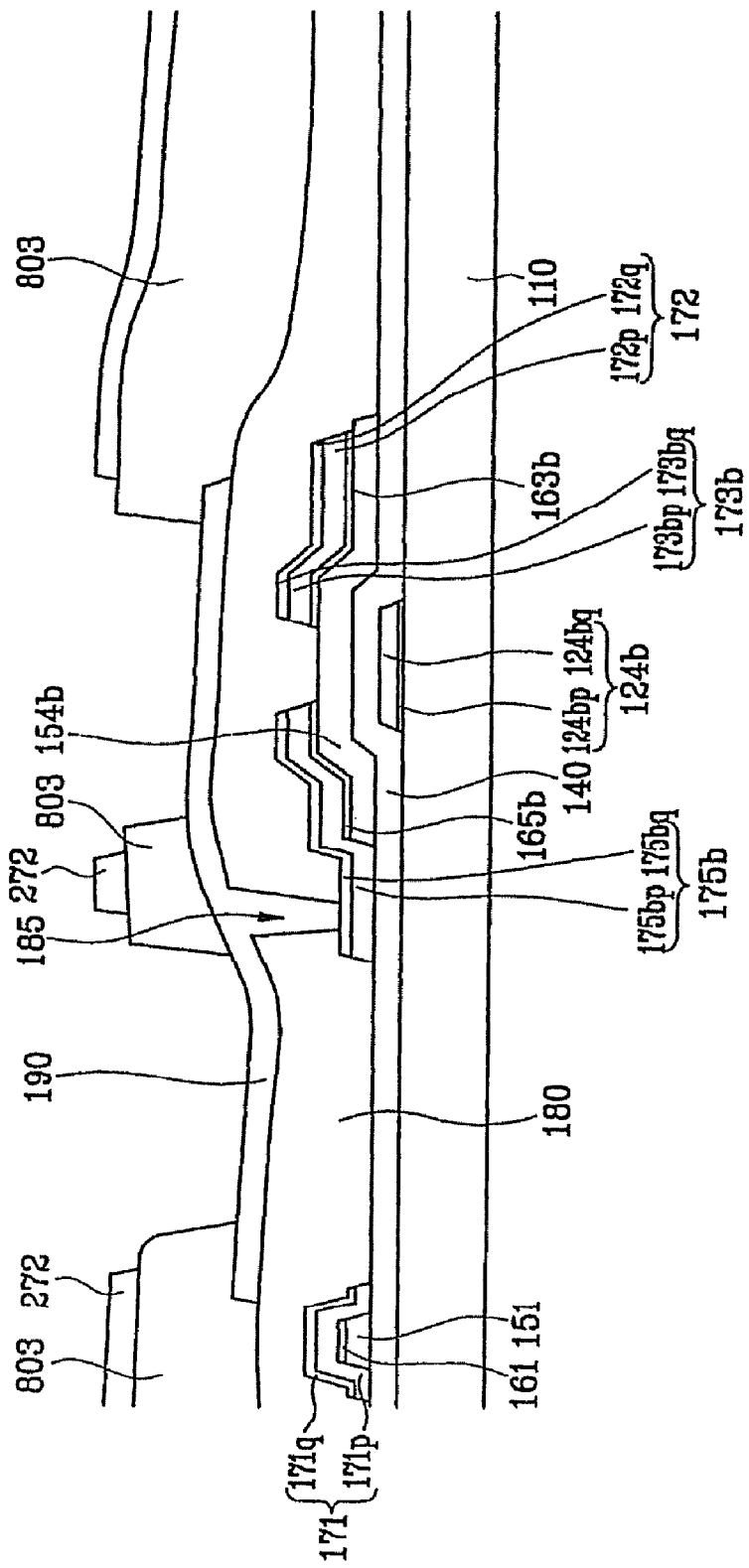

THIN FILM TRANSISTOR ARRAY PANEL AND METHOD FOR MANUFACTURING THE SAME

CROSS REFERENCE TO RELATED APPLICATION

This application is a divisional application of U.S. Application Ser. No. 11/249,500 filed Oct. 14, 2005, which claims priority to and the benefit of Korean Patent Application No. 10-2004-0085683, filed on Oct. 26, 2004, both of which are hereby incorporated by reference for all purposes as if fully set forth herein.

BACKGROUND OF THE INVENTION

1. Field of the Invention

The present description relates to a thin film transistor (TFT) array panel for a liquid crystal display (LCD) or an organic light emitting display (OLED), and a method for manufacturing the same.

2. Description of the Related Art

Liquid crystal displays (LCDs) are a popular type of flat panel display. An LCD includes a liquid crystal (LC) layer positioned between two panels provided with field-generating electrodes. The LCD displays images by applying voltages to the field-generating electrodes to generate an electric field in the LC layer that determines orientations of LC molecules in the LC layer to adjust polarization of incident light.

A common type of LCD includes two panels provided with field-generating electrodes respectively, wherein one panel has a plurality of pixel electrodes in a matrix and the other panel has a common electrode covering the entire surface of the panel.

The LCD displays images by applying a different voltage to each pixel electrode. The TFTs, which have three terminals to switch voltages applied to the pixel electrodes, are connected with the pixel electrodes, and gate lines transmitting signals to control the TFTs and data lines transmitting voltages applied to the pixel electrodes are formed on a TFT array panel.

The TFT is applied to an active matrix organic light emitting display and operates as a switching element to control respective light emitting elements.

Molybdenum (Mo), chromium (Cr), and titanium (Ti) are the materials conventionally used for forming the gate lines of a TFT array panel.

When a size of an LCD is increased, a material having low resistivity is required since the lengths of the gate and data lines are increased. Accordingly, there are limitations when applying Mo, Cr, and Ti to a large size LCD.

Copper (Cu) is a well known material used as a substitute for Mo, Cr, and Ti because it has low resistivity. However, bad adhesiveness of Cu with a glass substrate is problemsome when applying Cu to a gate line. Therefore, there is a need for a material having low resistivity and sufficient adhesive properties to be used for the gate lines of the TFT and signal lines.

SUMMARY OF THE INVENTION

The present invention provides a TFT array panel that has signal lines having low resistivity that is sufficiently with a substrate. Additional features of the invention will be set forth in the description which follows, and in part will be apparent from the description, or may be learned by practice of the invention.

The present invention discloses a thin film transistor (TFT) array panel, including an insulating substrate; a gate line formed on the insulating substrate, the gate line having a first layer that includes Al, a second layer that includes Cu containing metal and is thicker than the first layer, and a gate electrode; a gate insulating layer arranged on the gate line; a semiconductor arranged on the gate insulating layer; a data line having a source electrode, the data line being arranged on the gate insulating layer and the semiconductor; a drain electrode arranged on the gate insulating layer and the semiconductor and facing the source electrode; a passivation layer having a contact hole, the passivation layer arranged on the data line and the drain electrode; and a pixel electrode arranged on the passivation layer and coupled with the drain electrode.

The present invention also discloses a method for manufacturing a thin film transistor array (TFT) panel, including forming a gate line on an insulating substrate, the gate line having a first layer including Al, a second layer including Cu and is thicker than the first layer, and a gate electrode; sequentially depositing a gate insulating layer, a semiconductor layer, and a ohmic contact layer on the gate line; patterning the semiconductor layer and the ohmic contact layer; forming a drain electrode and a data line having a source electrode on the gate insulating layer and the ohmic contact layer, the drain electrode facing the source electrode with a gap formed therebetween; forming a passivation layer having a contact hole that exposes the drain electrode, the passivation layer being formed on the data line and the drain electrode; and forming a pixel electrode on the passivation layer, the pixel electrode being coupled with the drain electrode through the contact hole.

The present invention also discloses an organic light emitting display (OLED), including: a first semiconductor member and a second semiconductor member including a first intrinsic portion and a second intrinsic portion, respectively, and formed of an amorphous silicon or a polysilicon material; a gate conductor having a first layer that includes Al, a second layer that includes Cu and is thicker than the first layer, and a gate line having a first gate electrode that overlaps the first intrinsic portion and a second gate electrode that overlaps the second intrinsic portion; a gate insulating layer arranged between the first semiconductor member, the second semiconductor member, and the gate conductor; a data conductor that includes a data line having a first source electrode coupled with the first semiconductor member, a first drain electrode opposing the first source electrode with respect to the first intrinsic portion and coupled with the first semiconductor member, a voltage transmission line that includes a second source electrode coupled with the second semiconductor member, and a second drain electrode opposing the second source electrode with respect to the second intrinsic portion and coupled with the second semiconductor member; a pixel electrode coupled with the second drain electrode; a partition having an opening exposing the pixel electrode; an auxiliary electrode arranged on the partition and having substantially the same planar shape as the partition; an organic light emitting member arranged on the pixel electrode and positioned substantially in the opening; and a common electrode arranged on the light emitting member and the auxiliary electrode.

The present invention also discloses a thin film transistor (TFT) array panel for an LCD device, including: a lower layer formed of an Al containing metal; and an upper layer formed of a Cu containing metal that is at least about four times thicker than the lower layer, wherein the upper layer and the lower layer are patterned to form a plurality of gate lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 25A, 25B, and 25C are sectional views of the TFT array panel shown in FIG. 24 taken along the lines XXVa-XXVa', XXVb-XXVb', and XXVc-XXVc'.

FIGS. 33A and 33B are sectional views of the TFT array panel shown in FIG. 32 taken along the lines XXXIIIa-XXXIIIa' and XXXIIIb-XXXIIIb'.

DESCRIPTION OF THE ILLUSTRATED EMBODIMENTS

Figure 1:
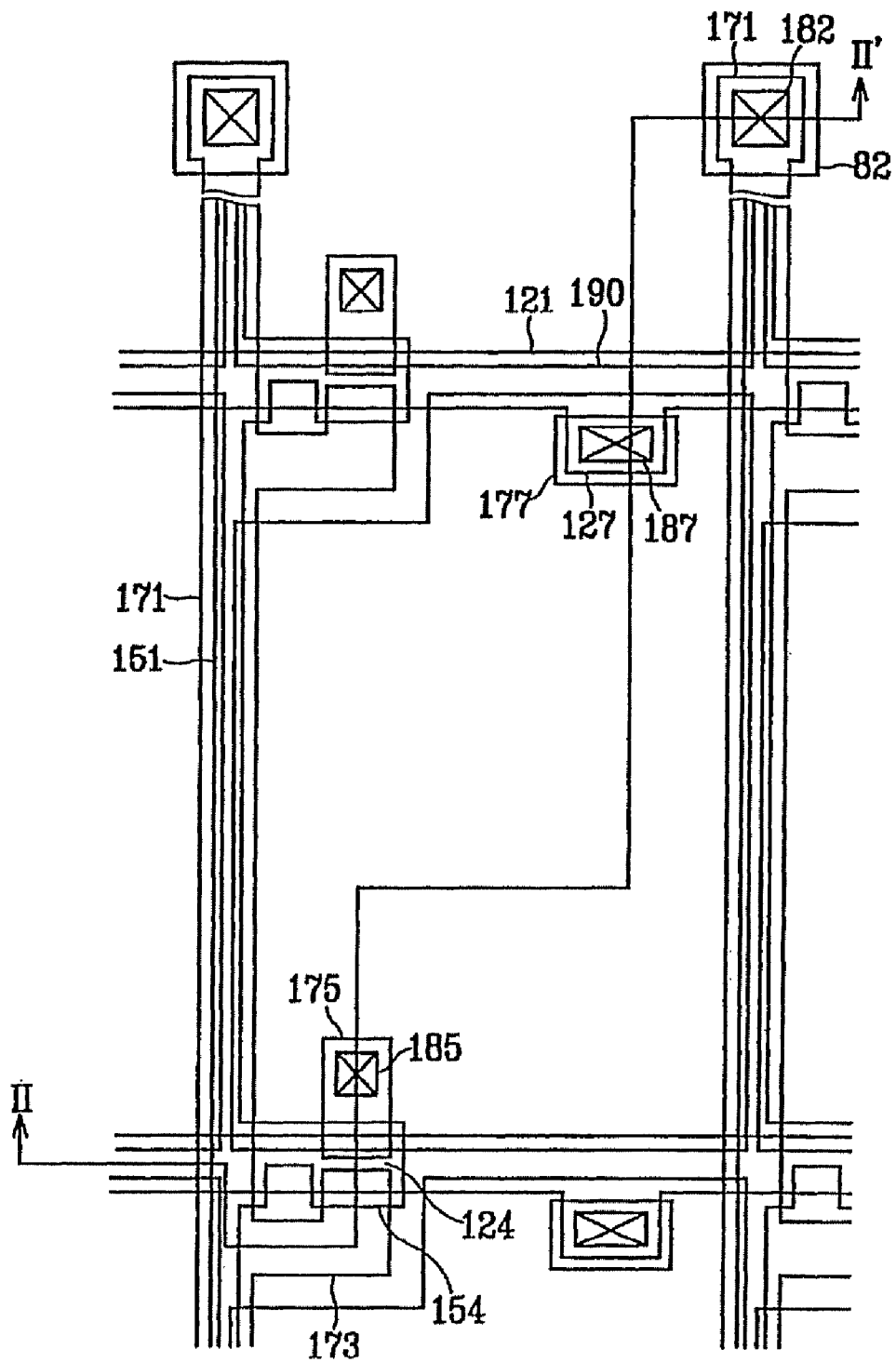
FIG. 1 is a layout view of a TFT array panel for an LCD according to an embodiment of the invention.

Embodiments of the present invention are described more fully below with reference to the accompanying drawings in which preferred embodiments of the invention are shown. The present invention may, however, be embodied in different forms and should not be construed as being limited to the embodiments set forth herein. Rather, these embodiments are provided so that this disclosure fully conveys the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

TFT array panels and manufacturing methods thereof according to embodiments of this invention are described below.

A TFT array panel for an LCD according to a first embodiment of the invention is described below with reference to FIG. 1 and FIG. 2.

Figure 2:
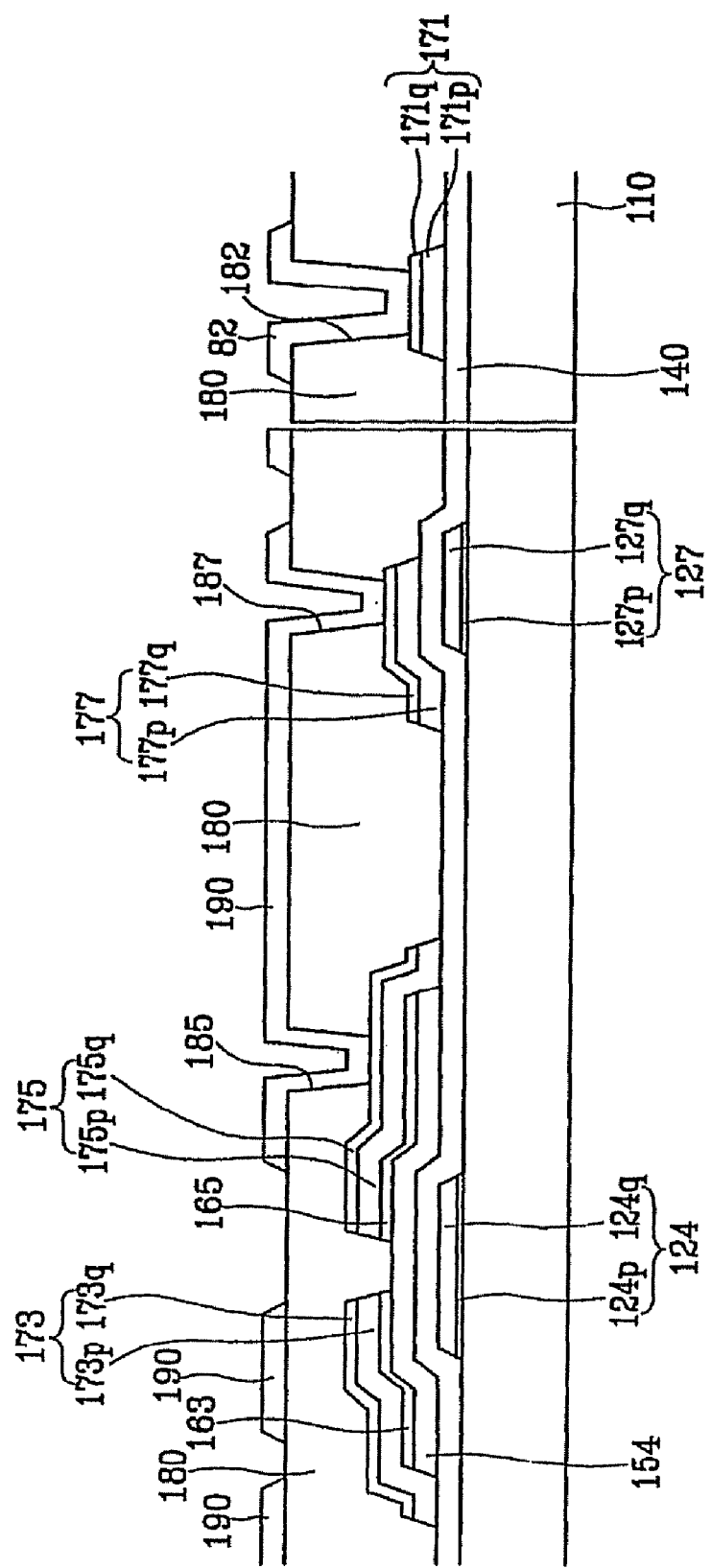
FIG. 2 is a sectional view of the TFT array panel shown in FIG. 1 taken along the line II-II.

FIG. 1 is a layout view of a TFT array panel for an LCD and FIG. 2 is a sectional view of the TFT array panel shown in FIG. 1 taken along the line II-II.

A plurality of gate lines 121 for transmitting gate signals are provided, e.g., formed, on an insulating substrate 110. The gate lines 121 are mostly formed in a horizontal direction and partial portions thereof become a plurality of gate electrodes 124. Different partial portions thereof, which extend in a lower direction, become a plurality of expansions 127.

The gate line 121 has lower layers $124p$ and $127p$ and upper layers $124q$ and $127q$. The lower layers $124p$ and $127p$ may be made of an Al-like metal such as aluminum (Al) or aluminum-neodymium (Al—Nd). The upper layers $124q$ and $127q$ may be made of a Cu-like metal such as pure Cu or a Cu alloy. As shown in FIG. 1, the upper layers $124q$ and $127q$ are thicker than the lower layers $124p$ and $127p$.

Signal lines of a large LCD may be made with Cu since Cu has a low resistivity. Accordingly, problems such as signal delay, which arise when the signal lines are lengthened, are reduced. However, Cu is not sufficiently adhesive with a glass substrate, which is problemsome when applying Cu to gate lines that are directly formed on the glass substrate.

To solve the problem of Cu having insufficient adhesiveness, an additional metal layer of Mo, Cr, or Ti may be formed under the Cu layer. However, since Mo, Cr, and Ti each have high resistivity, such materials increase resistance in the signal lines.

Thus, according to the present invention, an Al containing metal layer is applied under the Cu containing metal layer to improve adhesion with the substrate without increasing resistance. For example, Al has a much lower resistivity than Mo, Cr, and Ti, and is also sufficiently adhesive with the substrate, therefore, the combination of an Al containing metal layer and a Cu containing metal layer compliments Cu, which has low resistance.

The Cu containing metal layer is thicker than the Al containing metal layer, which assures low resistance of the signal lines. The Cu containing metal layer may be more than four times thicker than the Al containing metal layer. When the thickness of the Al containing metal layer is not sufficiently thick, the Cu containing metal layer may partially contact the substrate and/or may partially peel. When the Al containing metal layer is too thick; the signal lines may have high resistance. Therefore, according to an embodiment of the invention, the upper layers 124$q$ and 127$q$ of the Cu containing metal are formed to be more than four times thicker than the lower layers 124$p$ and 127$p$ of the Al containing metal. For example, when the upper layers 124$q$ and 127$q$ approximately 2000 Å thick, the lower layers 124$p$ and 127$p$ are approximately of 5 Å-500 Å thick.

When the lower layers 124$p$ and 127$p$ and the upper layers 124$q$ and 127$q$ are formed having the above-described thickness ratio, the upper and lower layers may be patterned with one etching step.

Generally, since Al and Cu have very different etching conditions, double layers of Al and Cu cannot be patterned together using a normal etching method. Accordingly, two etching operations with different etching conditions must be applied when patterning the double layer of Al and Cu. For instance, Cu may be rapidly etched by wet etching with an etchant of $H_2O_2$, and Al may be scarcely etched by wet etching with an etchant of $H_2O_2$. Alternatively, Al may be etched by dry etching with plasma and the Cu is scarcely etched by dry etching. Accordingly, when patterning the lower layers 124$p$ and 127$p$ of the Al containing metal and the upper layers 124$q$ and 127$q$ of the Cu containing metal, the upper layers 124$q$ and 127$q$ may be first etched by a wet etching and then the lower layers 124$p$ and 127$p$ may be etched by dry etching using the upper layer pattern as an etching mask.

According to the embodiment of the present invention, when the lower layers 124$p$ and 127$p$ are significantly thinner than the upper layers 124$q$ and 127$q$, the two layers may be patterned together with an etchant by using a galvanic effect. The galvanic effect is a tendency for metals having different electrical potentials in an electrolyte solution to oxidize and reduce. For example, when two metals having different electrical potentials are disposed in an electrolyte solution, a metal having a relatively positive potential works as a cathode and tends to reduced and the other metal having a relatively negative potential works as an anode and tends to oxidize. In this case, the etching speed (eroding speed) of the cathode metal is slower than when the cathode metal is used alone.

The etching speed (eroding speed) of the anode metal is faster than when the anode metal is used alone. Since the degree of galvanic effect is largely dependent on the area ratio of the cathode and anode, the etching rate of the upper layers and the lower layers may be controlled by adjusting the thickness of the two layers.

Al and Cu respectively have electromotive forces of about −1.66V and about +0.337V. Accordingly, Al operates as the anode and Cu operates as the cathode. The gap between the electromotive forces between Al and Cu is about 1.997V. This is a larger value than 1.86V, which is the gap between the electromotive forces between Al and Mo. Therefore, the galvanic effect may be more efficiently applied between Al and Cu than between Al and Mo.

According to the invention, the lower layers 124$p$ and 127$p$ of the Al containing metal and the upper layers 124$q$ and 127$q$ of the Cu containing metal, which are thicker than the lower layers 124$p$ and 127$p$, are sequentially deposited and etched together with an etchant such as $H_2O_2$. The lower layers 124$p$ and 127$p$ work as an anode and are etched with an increased etching speed and the upper layers 124$q$ and 127$l$ work as a cathode and are etched with a decreased etching speed, or vice-versa. Accordingly, the etching speeds of the Al layers and Cu layers may be balanced so that lateral surfaces of the lower layers 124$p$ and 127$p$ and the upper layers 124$q$ and 127$q$ have substantially the same slope.

The lateral sides of the upper layers 124$q$ and 127$q$ and lower layers 124$p$ and 127$q$ are inclined relative to a surface of the substrate 110, and the inclination angle thereof ranges about 30 to about 80 degrees.

A gate insulating layer 140 which may be made of silicon nitride (SiNx), is formed on the gate lines 121.

A plurality of semiconductor stripes 151, which may be made of hydrogenated amorphous silicon (abbreviated to "a-Si"), are formed on the gate insulating layer 140. Each semiconductor stripe 151 extends substantially in the longitudinal direction and is curved periodically. Each semiconductor stripe 151 has a plurality of projections 154 branched out or extending toward the gate electrodes 124. Each semiconductor stripe 151 widens near the gate lines 121 so that the semiconductor stripe 151 cover a sufficiently large areas of the gate lines 121.

A plurality of ohmic contact stripes 161 and islands 165, which may be made of silicide or n+ hydrogenated a-Si heavily doped with n type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edge surfaces of the semiconductor stripes 151 and the ohmic contacts 161 and 165 are tapered, and the inclination angles of the edge surfaces of the semiconductor stripes 151 and the ohmic contacts 161 and 165 may be in a range of about 30 to about 80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121 and define pixel areas substantially arranged in a matrix. A plurality of branches of each data line 171, which project toward the drain electrodes 175, form a plurality of source electrodes 173. Each pair of the source electrodes 173 and the drain electrodes 175 are separated from each other and are positioned opposite to each other with respect to a gate electrode 124.

The data line 171 and drain electrode 175 are made of one or more of Chromium (Cr), Molybdenum (Mo), Aluminum (Al), Cooper (Cu), and Tungsten (W). The data line 171 and drain electrode 175 have double layers 173p, 173q, 175p, and 175q that are made of two metals selected from among Cr, Mo, Al, Cu, and W. The data metals are selected according to resistance and contact characteristics.

A gate electrode 124, a source electrode 173, a drain electrode 175, and a projection 154 of a semiconductor stripe 151, form a TFT having a channel formed in the projection 154 disposed between the source electrode 173 and the drain electrode 175. The storage capacitor conductor 177 overlaps with the expansion 127 of the gate line 121.

The data lines 171, the drain electrodes 175, and the storage capacitor conductor 177 have tapered edge surfaces, and the inclination angles of the edge surfaces are in a range of about 30-80 degrees.

The ohmic contacts 161 and 165 are provided between the semiconductor stripe 151 and the data line 171 and between the drain electrode 175 and the projection 154 of the semiconductor stripe 151 to reduce contact resistance therebetween. The semiconductor stripe 151 is exposed between the source electrode 173 and the drain electrode 175 and at other places not covered with the data line 171 and the drain electrode 175. Most of the semiconductor stripe 151 is narrower than the data line 171 but the semiconductor stripe 151 widens near where the semiconductor stripe 151 and the gate line 121 meet to prevent disconnection of the data line 171, as discussed above.

A passivation lawyer 180 is provided on the data line 171, the drain electrode 175, the storage capacitor conductor 177, and the exposed region of the semiconductor stripe 151. The passivation layer 180 may be made of an organic material having substantial planarization properties and photosensibility, or an insulating material having a low dielectric constant such as a-Si:C:O, a Si:O:F, etc. This passivation layer 180 may be formed by plasma enhanced chemical vapor deposition (PECVD). To prevent the organic material of the passivation layer 180 from contacting with the semiconductor stripes 151 exposed between the data line 171 and the drain electrode 175, the passivation layer 180 may include an insulating layer made of SiNx or $SiO_2$ formed under the organic material layer.

A plurality of contact holes 185, 187, and 182 are formed in the passivation layer 180 to expose the drain electrode 175, the storage capacitor conductor 177, and an end portion of the data line 171, respectively.

A plurality of pixel electrodes 190 and a plurality of contact assistants 82, which are made of IZO or ITO, are arranged on the passivation layer 180.

Since the pixel electrode 190 is physically and electrically coupled with the drain electrode 175 and the storage capacitor conductor 177 through the contact holes 185 and 187, respectively, the pixel electrode 190 receives the data voltage from the drain electrodes 175 and transmits the data voltage to the storage capacitor conductor 177.

The pixel electrode 190 to which the data voltage is applied generates an electric field with a common electrode (not illustrated) of the opposite panel (not illustrated) to which a common voltage is applied, thereby rearranging the liquid crystal molecules in the liquid crystal layer.

As discussed above, the pixel electrode 190 and the common electrode form a capacitor to store and preserve the received voltage after the TFT is turned off. The capacitor is referred to hereinafter as a "liquid crystal capacitor." To enhance the voltage storage ability, another capacitor is provided, which is coupled with the liquid crystal capacitor in parallel and is referred to hereinafter as a "storage capacitor." The storage capacitor is formed at an overlap portion of the pixel electrode 190 and the adjacent gate line 121, which is referred to hereinafter as "previous gate line." The expansion 127 of the gate line 121 ensures the largest possible overlap dimension and increases storage capacity of the storage capacitor. The storage capacitor conductor 177 is connected, e.g., coupled, with the pixel electrode 190 and overlaps with the expansion 127. The storage capacitor is positioned at the bottom of the passivation layer 180 so that the pixel electrode 190 is near the previous gate line 121.

The pixel electrode 190 may overlap with the adjacent gate line 121 and the adjacent data line 171 to improve the aperture ratio. It is understood that the pixel electrode 190 may not overlap the adjacent gate line 121 and the adjacent data line 171.

The contact assistant 82 supplements and improves adhesion between the end portion of the data line 171 and the exterior devices, such as the driving integrated circuit, and protects them. The contact assistant 82 is an optional feature.

A method for manufacturing a TFT array panel is described below with reference to FIGS. 1, 2, 3A, 3B, 3C, 4A, 4B, 5A, 5B, 6A, and 6B.

FIGS. 3A, 4A, 5A, and 6A are layout views sequentially illustrating the intermediate operations of a method for manufacturing a TFT array panel for an LCD according to the embodiment shown in FIG. 1 and FIG. 2. FIG. 3B is a sectional view of the TFT array panel shown in FIG. 3A taken along the line IIIb-IIIb'. FIG. 4B is a sectional view of the TFT array panel shown in FIG. 4A taken along the line IVb-IVb' in the operation following the operation shown in FIG. 3B. FIG. 5B is a sectional view of the TFT array panel shown in FIG. 5A taken along the line Vb-Vb' in the operation following the step shown in FIG. 4B. FIG. 6B is a sectional view of the TFT array panel shown in FIG. 6A taken along the line VIb-VIb' in the operation following the operation shown in FIG. 5B.

Figure 3A:
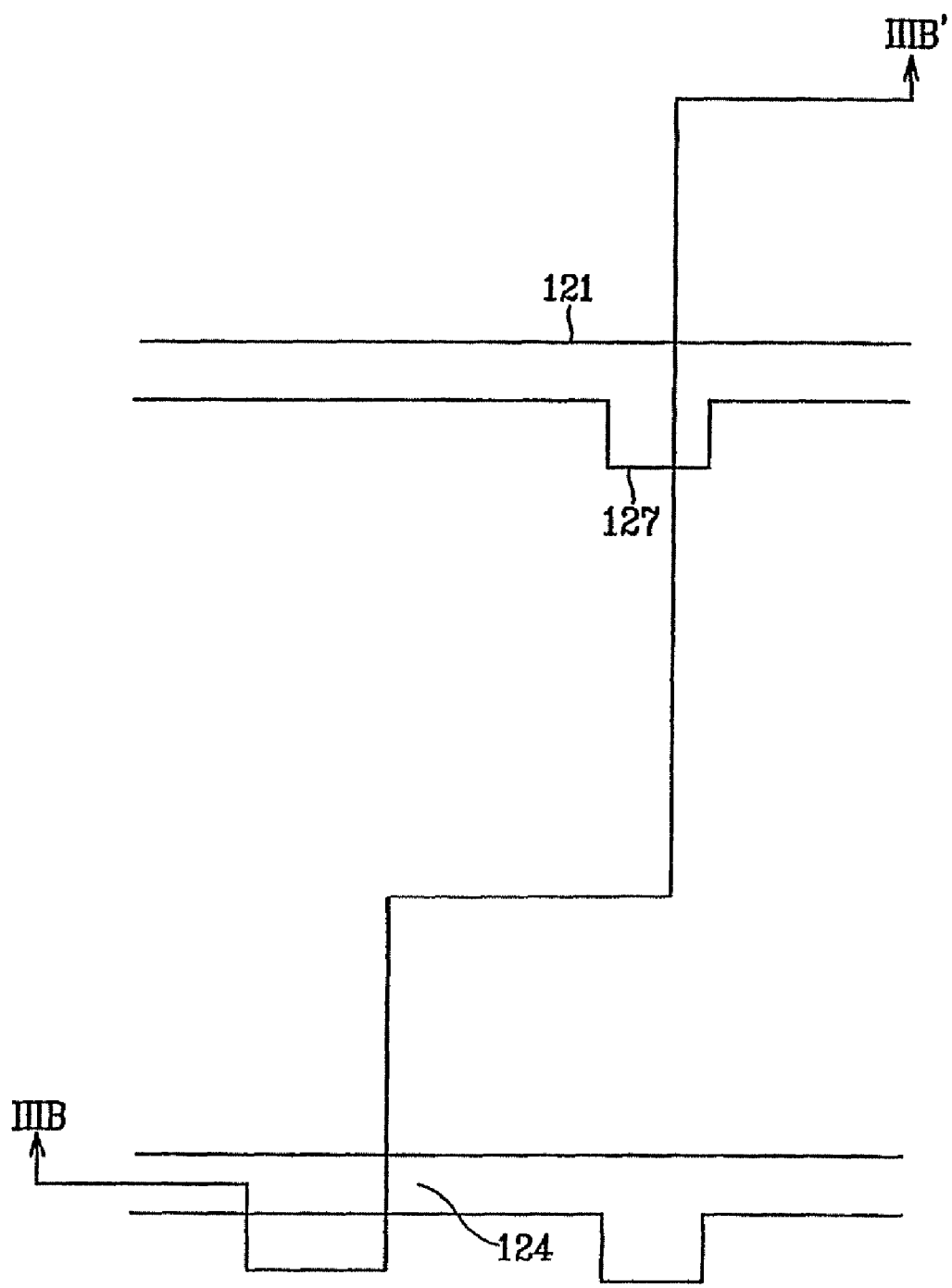
FIGS. 3A, 4A, 5A, and 6A are layout views sequentially illustrating the intermediate operations of a method of manufacturing a TFT array panel for an LCD according to the embodiment shown in FIG. 1 and FIG. 2.
Figure 3B:
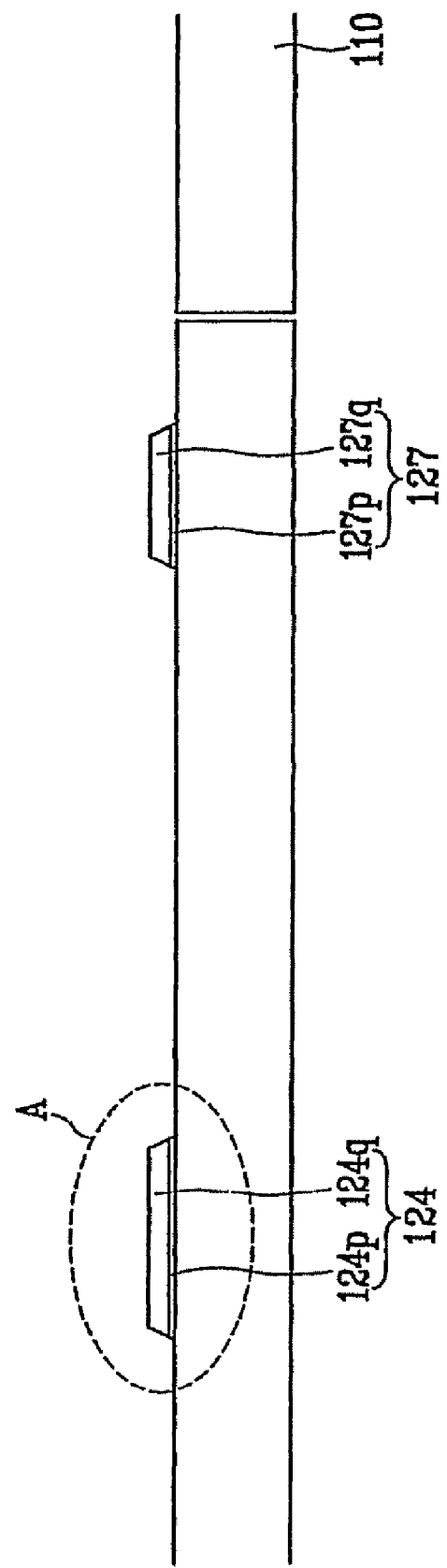
FIG. 3B is a sectional view of the TFT array panel shown in FIG. 3A taken along the line IIIb-IIIb'.

As shown in FIG. 3A and FIG. 3B, a metal layer is formed on an insulating substrate 110.

The metal layer is deposited by a Co-sputtering. Two targets are used in a same sputtering chamber for the Co-sputtering. One target is made of Al or Al—Nd. The other target is made of Cu. Here, the Al—Nd target preferably includes 2 wt % of Nd.

The Co-sputtering may be performed according to the following method.

Power is applied to the Al (or Al—Nd) target while no power is applied to the Cu target to deposit a lower layer of Al (or Al—Nd). The lower layer is preferably about 5 Å to about 500 Å thick.

Power is then switched to be applied to the Cu target and not to be applied to the Al (or Al—Nd) target to deposit an upper layer. The upper layer is preferably about 2,000 Å thick.

The upper layer and the lower layer are simultaneously etched to form a plurality of gate lines 121 having a plurality of gate electrodes 124 and expansions 127. For example, the upper layer and the lower layers may be etched using an etchant of $H_2O_2$ or an etchant containing $H_2O_2$, phosphoric acid ($H_3PO_4$), nitric acid ($HNO_3$), acetic acid ($CH_3COOH$), and deionized water. The etchant may include 50% to 80% of phosphoric acid, 2% to 10% of nitric acid, 2% to 15% of acetic acid, and deionized water to fill the residual quantity.

The etchants discussed above etch Al and Cu at different etching speeds during normal conditions. However, according to the present invention, the lower layer of Al and the upper layer of Cu are deposited with different thickness and are etched together with the etchant such that lateral sides of the lower layers 124p and 127p and the upper layers 124q and 127q have substantially the same slope.

In the present invention, the lower layer of Al is thinner thickness than the upper layer of Cu because of the etching conditions. Therefore, since Al and Cu have very different etching conditions, double layers of Al and Cu cannot be patterned together under normal etching conditions. Accordingly, two etching operations with different etching conditions should be applied to pattern the double layer of Al and Cu. For example, Cu may be rapidly etched by a wet etching with an etchant of $H_2O_2$ and Al may be scarcely etched by wet etching with an etchant of $H_2O_2$. To the contrary, Al is etched by a dry etching with plasma and Cu may be scarcely etched by dry etching. Accordingly, when patterning the lower layers 124p and 127p of the Al containing metal and the upper layers 124q and 127q of the Cu containing metal, the upper layers 124q and 127q are first etched by wet etching and then the lower layers 124p and 127p are etched by dry etching using the upper layer pattern as an etching mask.

However, according to the embodiment of the invention, when the lower layers 124p and 127p are significantly thinner than the upper layers 124q and 127q, the two layers may be patterned together with an etchant by using a galvanic effect. The galvanic effect refers to an oxidation and a reduction tendency of metals having different electrical potentials in an electrolyte solution. For example, when two metals having different electrical potentials are disposed in an electrolyte solution, a metal having a relatively positive potential operates as a cathode and may be reduced and the other metal having a relatively negative potential works as an anode and tends to be oxidized. In this case, the etching speed (eroding speed) of the cathode metal is slower when the cathode metal is disposed alone. The etching speed (eroding speed) of the anode metal is faster than when the anode metal is disposed alone. Since the degree of galvanic effect is highly dependent on the area ratio of the cathode and anode, the etching rate of the upper layers and the lower layers may be controlled by adjusting the thickness of the two layers.

Al and Cu have electromotive forces of about −1.66V and about +0.337V, respectively. Accordingly, Al operates as the anode and Cu operates as the cathode. The gap between the electromotive forces between Al and Cu is about 1.997V, which is larger than 1.86V, which is the difference between the electromotive forces of Al and Mo. This indicates that the galvanic effect may be more efficiently applied between Al and Cu than between Al and Mo.

Accordingly, in the present invention, the lower layers 124p and 127p of the Al containing metal and the upper layers 124q and 127q of the Cu containing metal, which are thicker than the lower layers 124p and 127p, are sequentially deposited and are etched together with an etchant, such as $H_2O_2$. Here, the lower layers 124p and 127p operates as an anode and are etched with an increased etching speed. The upper layers 124q and 127l operates as a cathode and are etched with a decreased etching speed. Accordingly, the etching speeds of the Al layers and Cu layers may be balanced to simultaneously etch the lower layers 124p and 127p and the upper layers 124q and 127q.

Figure 3C:
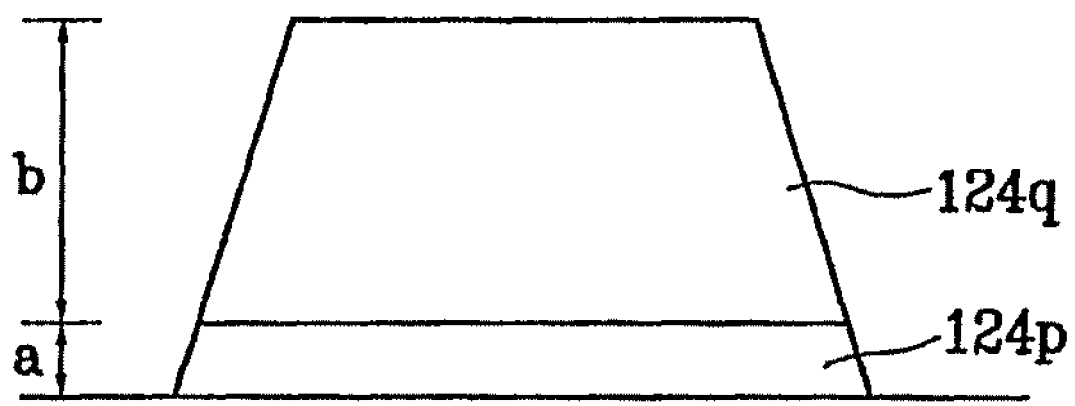
FIG. 3C is an enlarged view of the "A" portion of FIG. 3B.

Here, as shown in FIG. 3C, when the upper layers 124q and 127q are about four times thicker than the lower layers 124p and 127p, the etching speeds of the upper layers 124q and 127q and the lower layers 124p and 127p may be balanced due to the galvanic effect. For example, when the upper layers 124q and 127q are about 2,000 Å thick, the lower layers are less than or equal to about 500 Å thick.

Figure 4A:
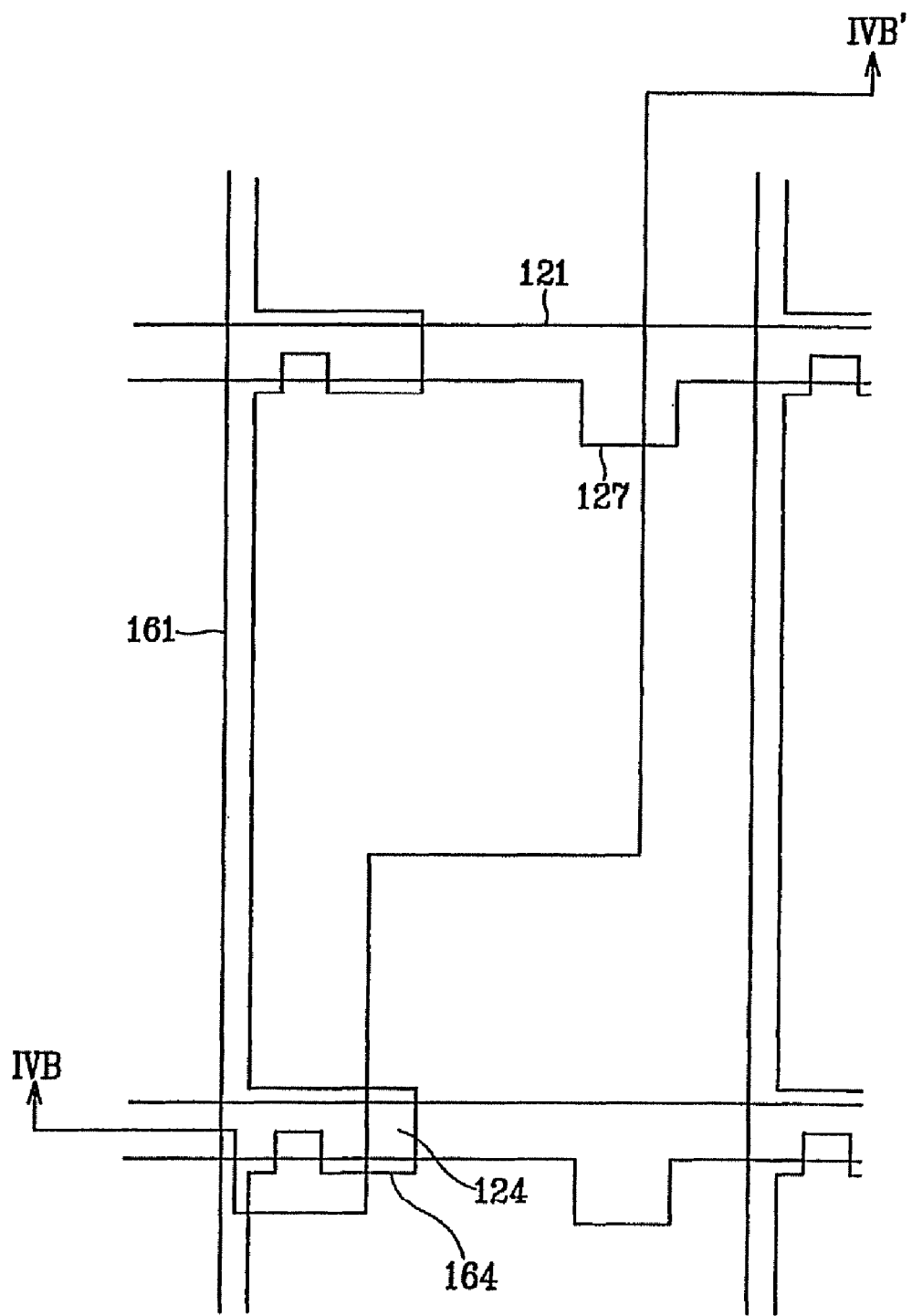
Figure 4B:
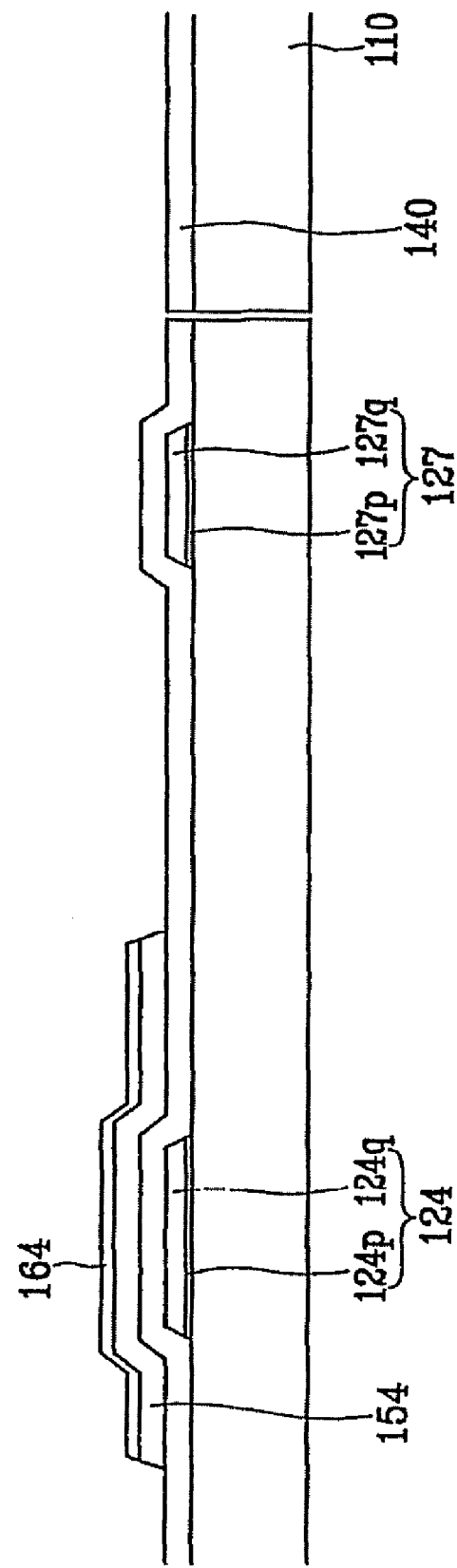
FIG. 4B is a sectional view of the TFT array panel shown in FIG. 4A taken along the line IVb-IVb' in the operation following the operation shown in FIG. 3B.

Referring to FIG. 4A and FIG. 4B, SiNx or $SiO_2$ is deposited on the gate line 121 to form a gate insulating layer 140.

The gate insulating layer 140 may be about 2,000 Å to 5,000 Å thick, and the deposition temperature may be between about 250° C. and about 500° C.

After sequential deposition of an intrinsic a-Si layer and an extrinsic a-Si layer, the extrinsic a-Si layer and the intrinsic a-Si layer are photo-etched to form a plurality of extrinsic semiconductor stripes 161 and a plurality of intrinsic semiconductor stripes 151, respectively, having projections 164 and 154.

Figure 5A:
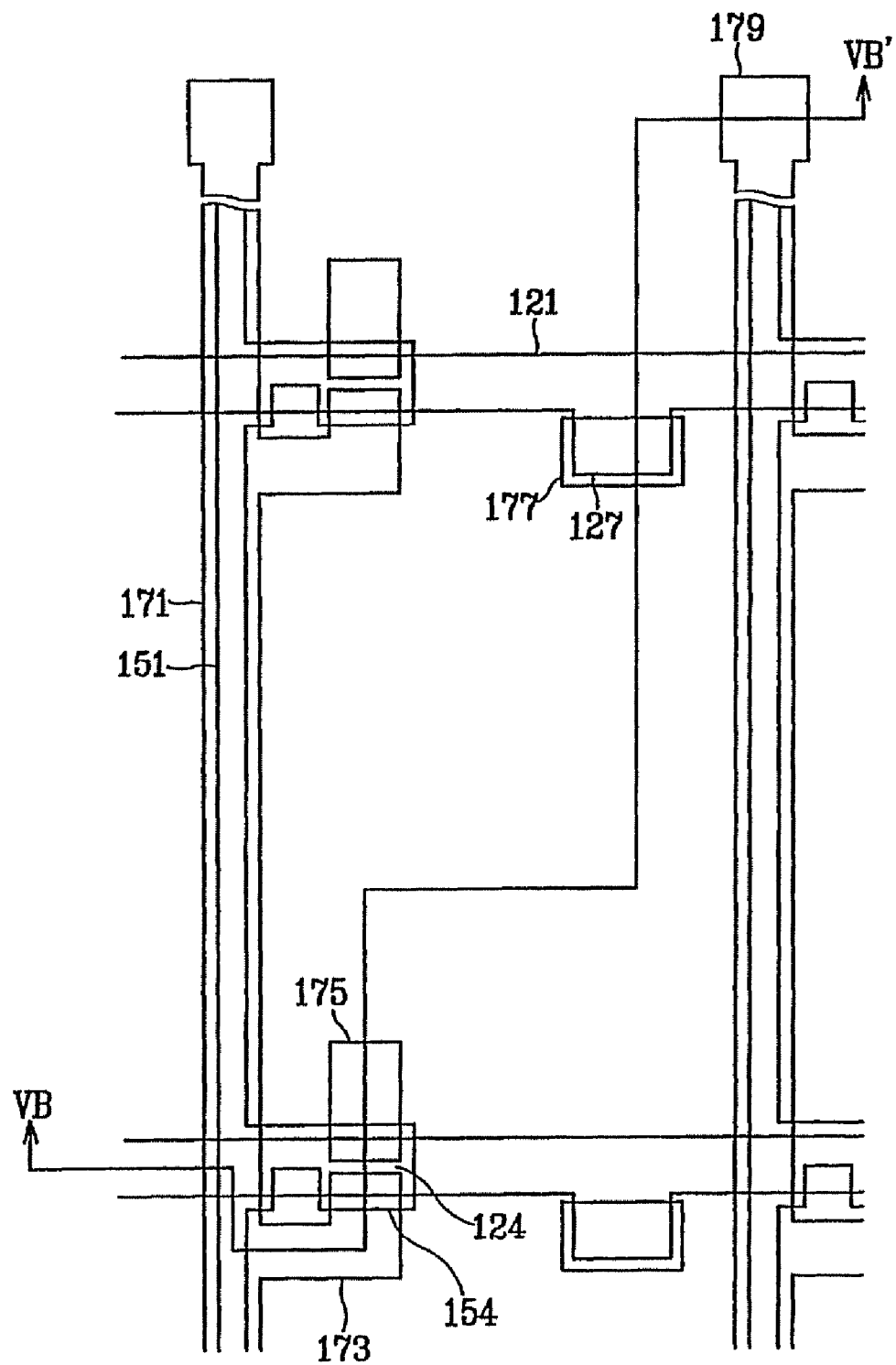
Figure 5B:
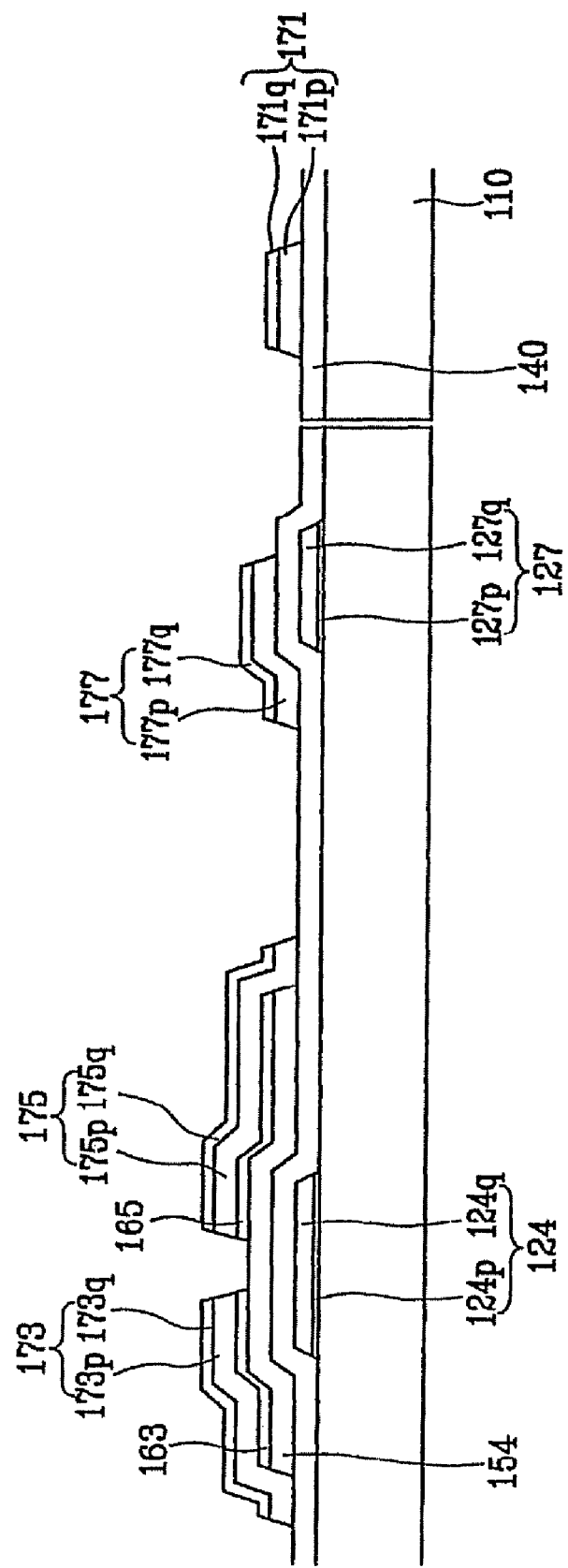
FIG. 5B is a sectional view of the TFT array panel shown in FIG. 5A taken along the line Vb-Vb' in the operation following the operation shown in FIG. 4B.

Referring to FIG. 5A and FIG. 5B, a lower metal layer and an upper metal layer are deposited on the extrinsic semiconductor stripes 161 by a deposition method such as sputtering. The lower metal layer and the upper metal layer are made of two metals selected from among Cr, Mo, Al, Cu, and W. The two layers may be about 3,000 Å thick. The sputtering temperature may be about 150° C.

The two layers are then simultaneously patterned to form data lines 171, drain electrodes 175, and storage conductors 177 by an etchant. The two layers may be etched using an etchant containing phosphoric acid, nitric acid, acetic acid, and deionized water. The etchant may include about 63% to about 70% of phosphoric acid, about 4% to about 8% of nitric acid, about 8% to about 11% of acetic acid, and deionized water to fill the residual quantity. The etchant may include more acetic acid by about 4% to about 8%.

Portions of the extrinsic semiconductor stripes 161, which are not covered with the data lines 171 and the drain electrodes 175, are then removed by etching to complete a plurality of ohmic contacts 163 and 165 and to expose portions of the intrinsic semiconductor stripes 151. Oxygen plasma treatment may then be performed to stabilize the exposed surfaces of the semiconductor stripes 151.

Figure 6A:
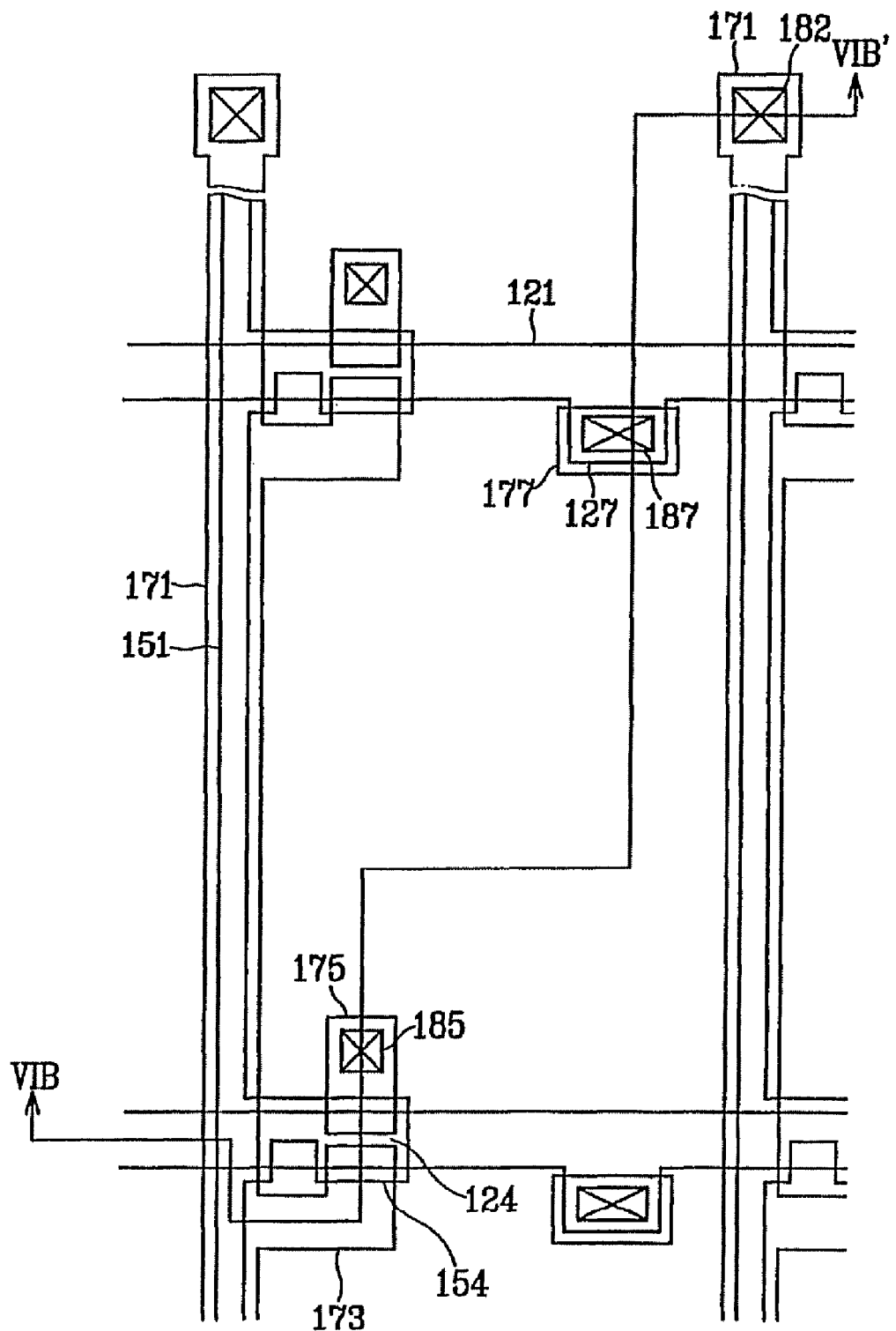
Figure 6B:
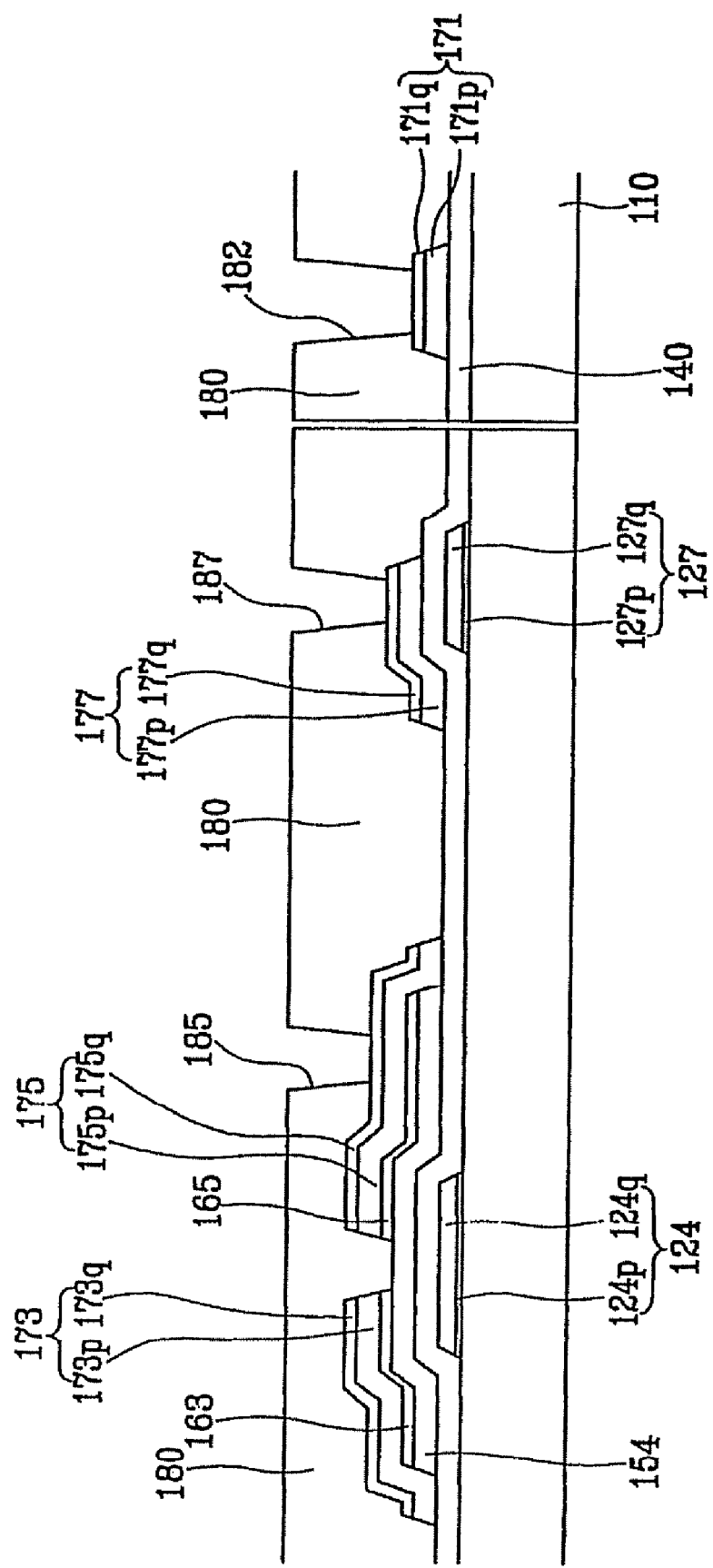
FIG. 6B is a sectional view of the TFT array panel shown in FIG. 6A taken along the line VIb-VIb' in the operation following the operation shown in FIG. 5B.

Referring to FIG. 6A and FIG. 6B, a passivation layer 180 is deposited and dry etched along with the gate insulating layer 140 to form a plurality of contact holes 185, 187, and 182. The gate insulating layer 140 and the passivation layer 180 may be etched using an etch condition having substantially the same etch ratio for both the gate insulating layer 140 and the passivation layer 180.

As shown in FIG. 1 and FIG. 2, a plurality of pixel electrodes 190 and a plurality of contact assistants 82 may be formed by sputtering and photo-etching an IZO layer or an ITO layer.

According to another embodiment of the invention, the data lines and the semiconductors are formed using different photo etching processes having different photo masks than was described in the first embodiment. However, the data lines and the semiconductors may be simultaneously formed by a photo etching process using a same photo mask to reduce production cost. Such an embodiment is described below with reference to the drawings.

Figure 7:
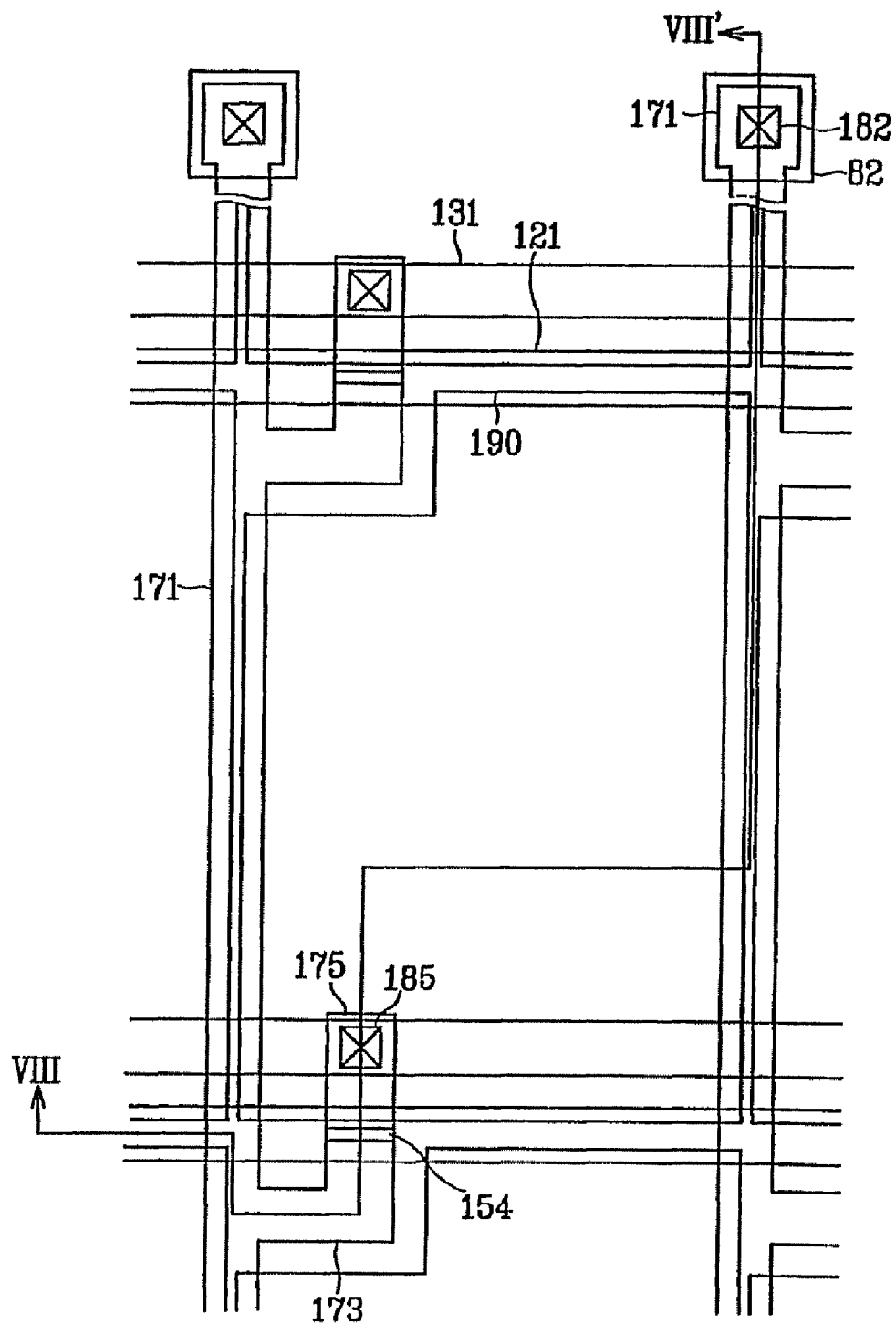
FIG. 7 is a layout view of a TFT array panel for an LCD according to another embodiment of the invention.
Figure 8:
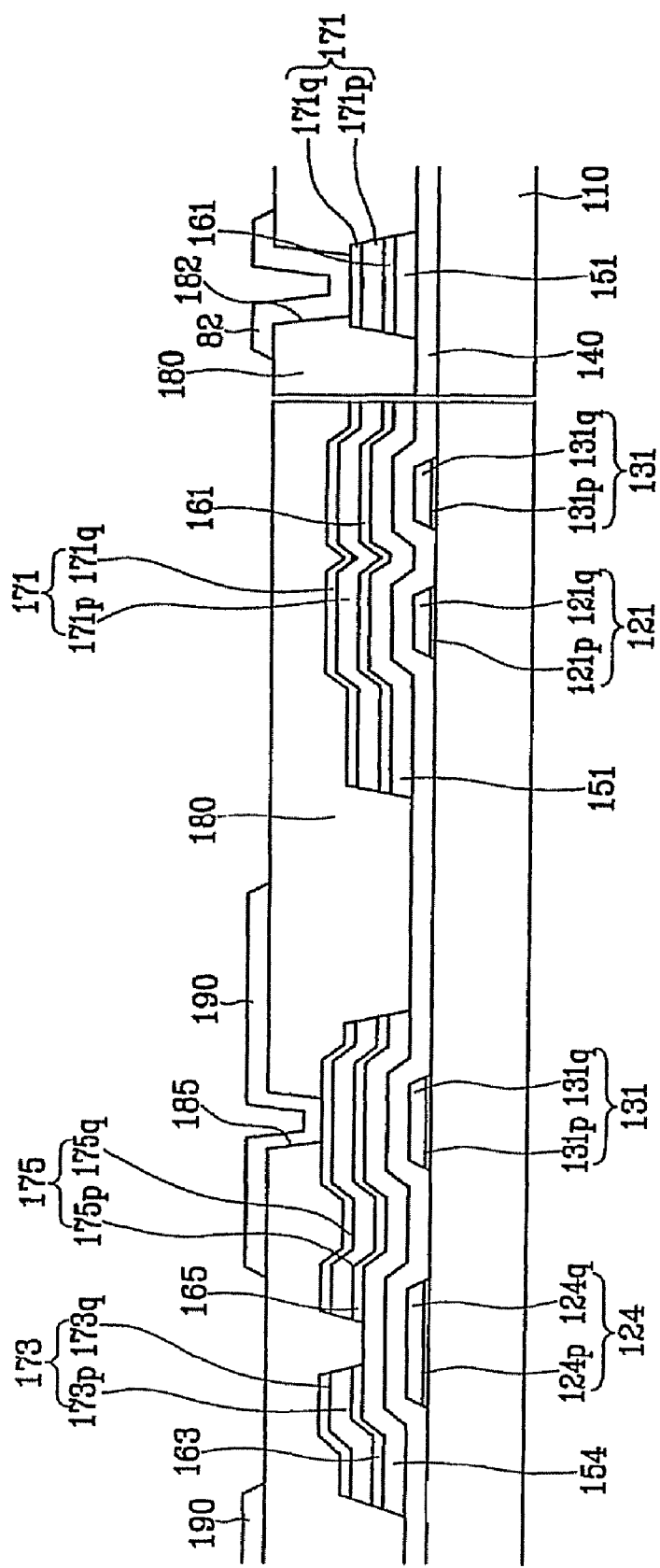
FIG. 8 is a sectional view of the TFT array panel shown in FIG. 7 taken along the line VIII-VIII'.
Figure 9A:
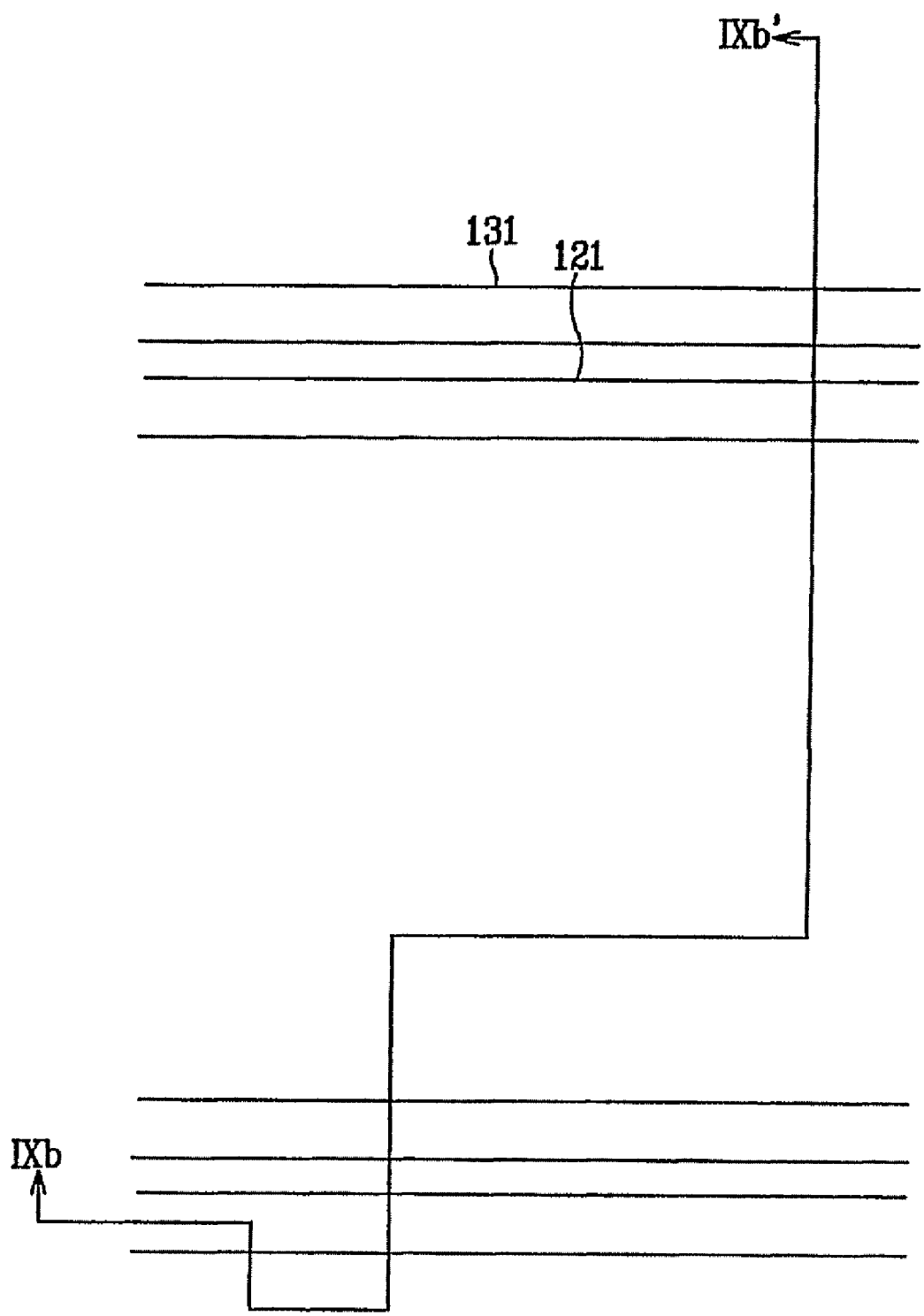
FIGS. 9A, 12A, and 13A are layout views of the TFT array panel shown in FIG. 7 and FIG. 8 during intermediate operations of a manufacturing method according to an embodiment of the invention.
Figure 9B:
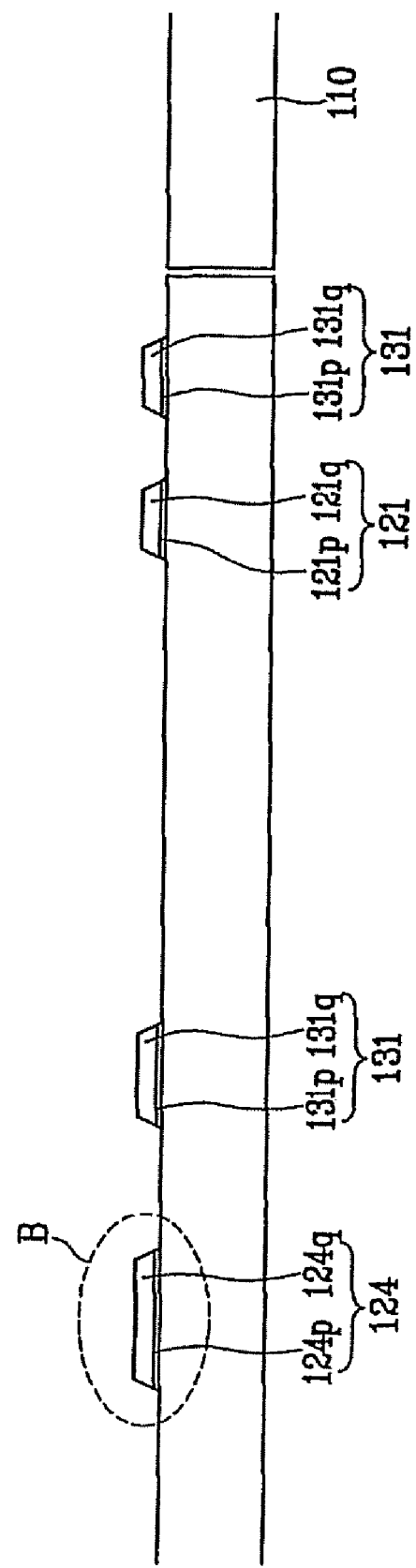
FIGS. 9B, 10, 11, 12B, and 13B are sectional views of the TFT array panel shown in FIG. 7 and FIG. 8 during intermediate operations of a manufacturing method according to an embodiment of the invention.
Figure 9C:
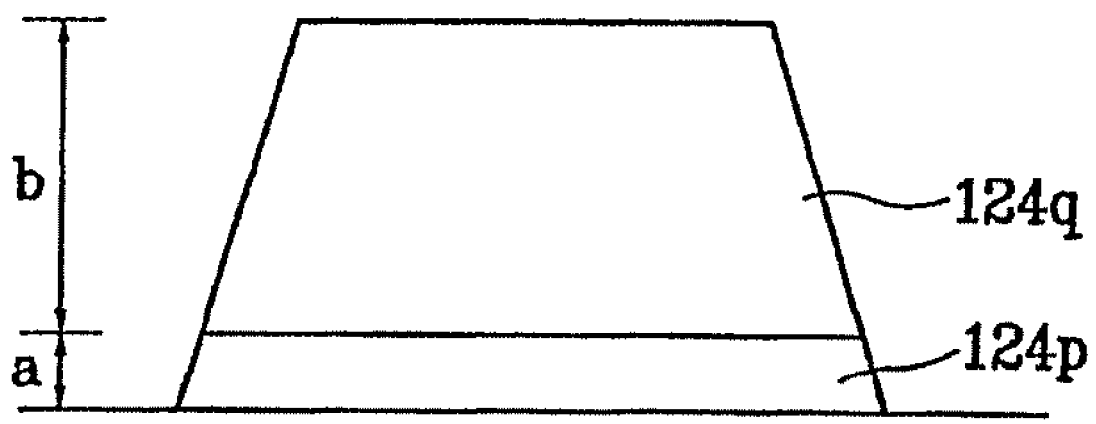
FIG. 9C is an enlarged view of the "B" portion of FIG. 9B.

FIG. 7 is a layout view of a TFT array panel for an LCD according to another embodiment of the invention. FIG. 8 is a sectional view of the TFT array panel shown in FIG. 7 taken along the line VIII-VIII'.

Referring to FIG. 7 and FIG. 8, a plurality of gate lines 121 including a plurality of gate electrodes 124 and a plurality of storage electrode lines 131, which are electrically separated from the gate lines 121, are formed on a substrate 110.

The gate line 121 and the storage lines 131 have lower layers 121p and 131p and upper layers 121q and 131q. The lower layers 121p and 131p may be made of an Al containing metal, such as aluminum (Al) or aluminum-neodymium (Al—Nd). The upper layers 121q and 131q may be made of Cu.

In addition, the lateral sides of the lower layers 121p and 131p and the upper layers 121q and 131q are inclined relative to a surface of the substrate 110, and the inclination angle thereof ranges from about 30 to about 80 degrees.

A gate insulating layer 140, which may be made of silicon nitride (SiNx), is formed on the gate lines 121 and the storage electrode lines 131.

A plurality of semiconductor stripes 151, which may be made of hydrogenated amorphous silicon (abbreviated to "a-Si"), are formed on the gate insulating layer 140. Each semiconductor stripe 151, may extend substantially in the longitudinal direction and may include a plurality of projections 154 extending toward the gate electrodes 124. The projections 154 have portions overlapping the storage electrode line 131.

A plurality of ohmic contact stripes 161 and islands 165, which may be made of silicide or n+ hydrogenated a-Si heavily doped with n type impurity, are formed on the semiconductor stripes 151. Each ohmic contact stripe 161 may include a plurality of projections 163, and the projections 163 and the ohmic contact islands 165 are located in pairs on the projections 154 of the semiconductor stripes 151.

The lateral sides of the semiconductors 151 and the ohmic contacts 161 and 165 are inclined relative to a surface of the substrate 110, and the inclination angles thereof may range from about 30 to about 80 degrees.

A plurality of data lines 171 and a plurality of drain electrodes 175 are formed on the ohmic contacts 161 and 165 and the gate insulating layer 140.

The data lines 171 for transmitting data voltages extend substantially in the longitudinal direction and intersect the gate lines 121 to define pixel regions arranged in a matrix. A plurality of branches of each data line 171, which project toward the drain electrodes 175, form a plurality of source electrodes 173. Each pair of the source electrodes 173 and the drain electrodes 175 are separated from each other, and are opposite to each other, with respect to a gate electrode 124.

The data line 171 and drain electrode 175 are made of one or more of Cr, Mo, Al, Cu, and tungsten (W). The data line 171 and drain electrode 175 have multiple layers; e.g., double layers 173$p$, 173$q$, 175$p$, and 175$q$, which may be made of two metals selected from among Cr, Mo, Al, Cu, and tungsten (W). The data metals are selected under considering such properties as resistance and contact characteristics.

The ohmic contacts 161 and 165 are only arranged or interposed between the underlying semiconductors 151 and the overlying data lines 171 and drain electrodes 175, and the ohmic contacts 161 and 165 reduce the contact resistance therebetween. The semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and portions of the semiconductor stripes 151 that are not covered with the data lines 171 and the drain electrodes 175. The passivation layer 180 may be made of a photosensitive organic material having a good flatness characteristic, a dielectric insulating material having a dielectric constant less than 4.0, such as a-Si:C:O and a-Si:O:F, formed by plasma enhanced chemical vapor deposition (PECVD), or an inorganic material such as silicon nitride and silicon oxide.

The passivation layer 180 includes a plurality of contact holes 182 and 185.

A plurality of pixel electrodes 190 and a plurality of contact assistants 82 are formed on the passivation layer 180.

The pixel electrodes 190 are physically and electrically connected, e.g., coupled, with the drain electrodes 175 through the contact holes 185, such that the pixel electrodes 190 receive the data voltages from the drain electrodes 175. The pixel electrodes 190 supplied with the data voltages generate electric fields, in cooperation with a common electrode (not shown) provided on another panel (not shown), which reorient liquid crystal molecules in a liquid crystal layer (not shown) disposed therebetween.

A pixel electrode 190 and a common electrode form a liquid crystal capacitor, which stores applied voltages when the TFT is turned off. An additional capacitor referred to as a "storage capacitor" is connected in parallel to the liquid crystal capacitor. The storage capacitors are implemented by overlapping the pixel electrodes 190 with the storage lines 131. The storage electrode lines 131 are supplied with a predetermined voltage such as the common voltage. The storage electrode lines 131 may be omitted when the storage capacitance generated by the overlapping of the gate lines 121 and the pixel electrodes 190 is sufficient. The storage electrode lines 131 may be formed along a boundary of the pixels to enhance aperture ratio.

A method of manufacturing the TFT array panel illustrated in FIG. 7 and FIG. 8 is described below with reference to FIGS. 7, 8, 9A, 9B, 9C, 10, 11, 12A, 12B, 13A, 13B, and 13C.

A lower metal layer, which may be formed of Al or Al alloy and an upper metal layer of Cu, which is thicker than the lower metal layer, are formed on an insulating substrate 110. The insulating substrate 110 may be formed of glass and the lower and upper metal layers may be formed thereon by sputtering.

The upper metal layer and the lower metal layer are then simultaneously patterned to form a plurality of gate lines 121 having gate electrodes 124 and storage electrode lines 131. For example, the lower metal layer and the upper metal layer may have a thickness ratio of about 1:4. The upper and lower layers may be etched using an etchant of $H_2O_2$ or an etchant containing $H_2O_2$, phosphoric acid ($H_3PO_4$), nitric acid ($HNO_3$), acetic acid ($CH_3COOH$), and deionized water. The etchant may include about 50% to about 80% of phosphoric acid, about 2% to about 10% of nitric acid, about 2% to about 15% of acetic acid, and deionized water to fill the residual quantity.

The etchants listed above etch Al and Cu at very different etching speeds during normal conditions. However, in the present invention, the lower layer of Al and the upper layer of Cu have different thickness and are etched together with the etchants such that lateral sides of the lower layers 121$p$ and 131$p$ and the upper layers 121$q$ and 131$q$ have substantially the same slope.

The upper layers 121$q$ and 131$q$ of the Cu containing metal are preferably more than four times thicker than the lower layers 121$p$ and 131$p$ of the Al containing metal. For example, when the upper layers 121$q$ and 131$q$ are about 2000 Å thick, the lower layers 121$p$ and 131$p$ are about 5 Å to about 500 Å thick.

The thickness ratio between the upper layers 121$q$ and 131$q$ and the lower layers 121$p$ and 131$p$ determined by considering such things as etching conditions for low resistance, adhesiveness to the substrate, and simultaneous etching. When the lower layers 121$p$ and 131$p$ are less than about 5 Å thick, the upper layers 121$q$ and 131$q$ may contact the substrate 110 and may be partially peeled. To the contrary, when the thickness of the lower layers 121$p$ and 131$p$ is too thick, high resistance of signal lines may be problemsome and the two layers 121$p$, 131$p$, 121$q$, and 131$q$ cannot be simultaneously.

Figure 10:
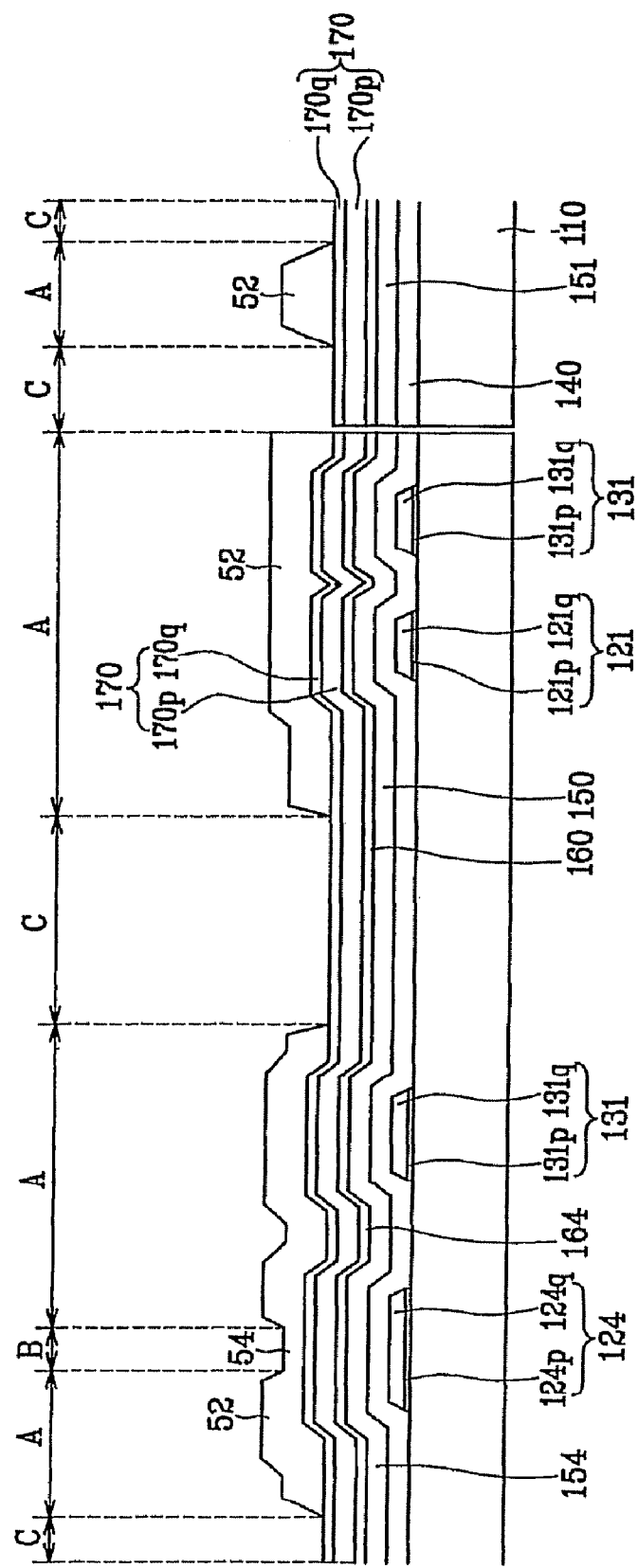

Referring to FIG. 10, a gate insulating layer 140 made of SiNx, an intrinsic semiconductor layer 150, and an extrinsic semiconductor layer 160 are sequentially deposited. The intrinsic semiconductor layer 150 may be made of hydrogenated amorphous silicon (abbreviated to "a-Si") and the extrinsic semiconductor layer 160 may be made of silicide or n+ hydrogenated a-Si heavily doped with n type impurity.

A lower metal layer and an upper metal layer are deposited on the extrinsic semiconductor stripes 161. This may be performed using a deposition method such as sputtering. The lower metal layer and the upper metal layer are made of two metals selected from among Cr, Mo, Al, Cu, and W. The two layers are then simultaneously patterned to form data lines 171 and drain electrodes 175 by an etchant. The etchant may include about 63% to about 70% of phosphoric acid, about 4% to about 8% of nitric acid, about 8% to about 11% of acetic acid, and deionized water to fill the residual quantity. The etchant may include more acetic acid by about 4% to about 8%.

A photoresist film is applied on the upper layer 170q. The photoresist film is exposed to light through an exposure mask (not shown), and developed such that the developed photoresist has a positional dependent thickness as shown in FIG. 10. The developed photoresist includes a plurality of first portions 54, second portion 52, and third portions. The first portions 54 are located on channel areas B, the second portions 52 are located on the data line areas A, and no reference numeral is assigned to the third portions that are located on remaining areas C since they have substantially no thickness. As shown in FIG. 10, the thickness ratio of the first portions 54 to the second portions 52 is adjusted depending upon the process conditions in the subsequent process steps. For example, the thickness of the first portions 54 is preferable equal to or less than half of the thickness of the second portions 52; e.g., the second portion 52 is at least twice as thick as the first portion 54.

The position-dependent thickness of the photoresist may be obtained using several techniques, for example, by providing translucent areas on the exposure mask as well as transparent areas and light blocking opaque areas. The translucent areas may have a slit-like pattern, a lattice-like pattern, or a thin film(s) having an intermediate transmittance or an intermediate thickness. When using a slit pattern, the width of the slits or the distance between the slits is preferably less than the resolution of a light exposer used for the photolithography. When using a reflowable photoresist, after forming a photoresist pattern made of a reflowable material using a normal exposure mask with only transparent areas and opaque areas, the reflowable material may reflow onto areas without the photoresist, thereby forming thin portions.

Next, the photoresist film 52 and 54 and the underlying layers are etched such that the data lines 171, drain electrodes 175, and the underlying layers remain on the data areas A, only the intrinsic semiconductor layer remains on the channel areas B, and the gate insulating layer 140 is exposed on the remaining areas C.

A method for forming at least the above described structure is discussed below.

Figure 11:
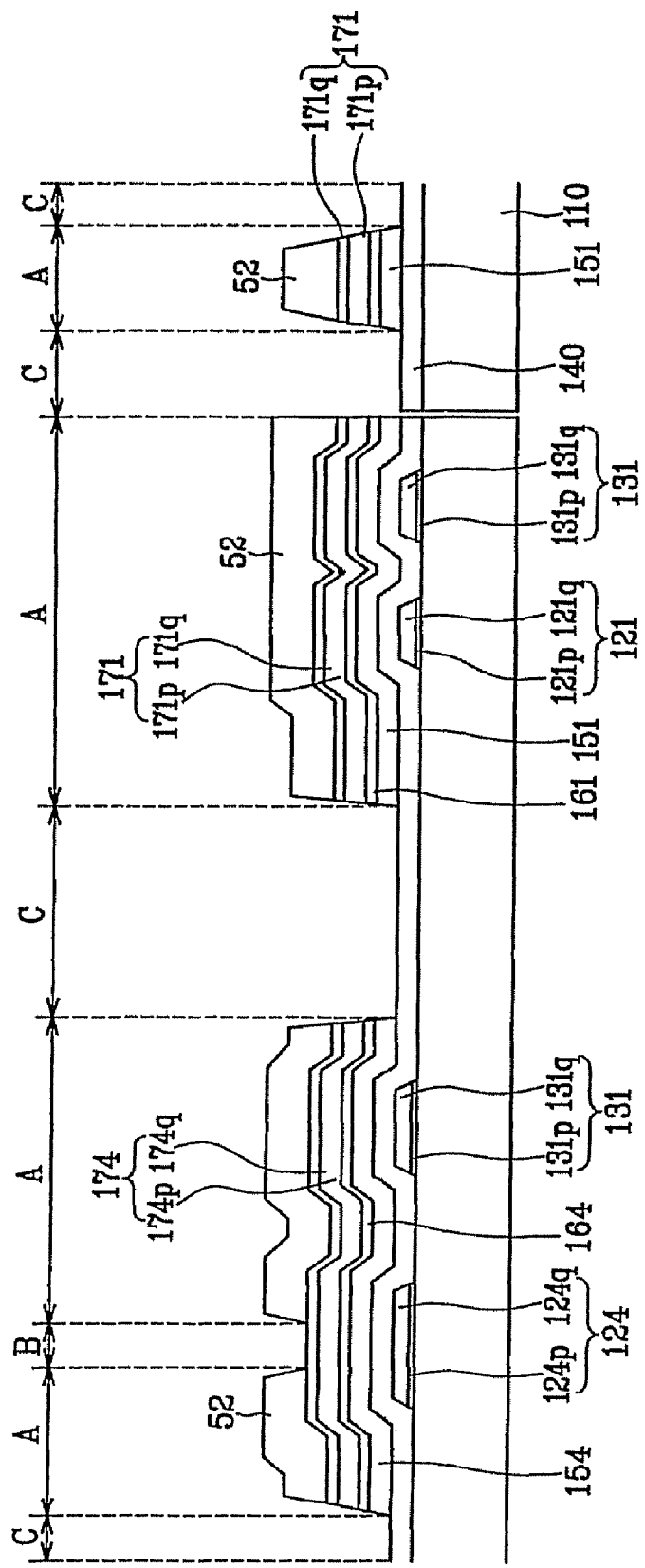

Referring to FIG. 11, the exposed portions of the first layer and the second layers 170p on the other areas C are removed to expose the underlying portions of the extrinsic semiconductor layer 160.

The exposed portions of the extrinsic semiconductor layer 160 and the underlying portions of the intrinsic semiconductor layer 150 on the areas C as well as the photoresist pattern 54 and 52 are then removed by dry etching to expose source and drain (S/D) metals 174 of the area B.

The photoresist pattern 54 of the channel areas B may be removed by an etching process that simultaneously removes the extrinsic semiconductor 160 and the intrinsic semiconductor 150, or by separate etching processes. Residual photoresist of the photoresist pattern 54 in the channel area B may be removed by using an ashing procedure. In this operation, the semiconductor stripes 151 are completely formed.

When the S/D metals are able to be etched by dry etching, the S/D metals may be sequentially etched along with the extrinsic semiconductor layer 161 and the intrinsic semiconductor layer 150 to simplify the manufacturing process. In this case, the three layers 170, 160, and 150 (not specifically shown) may be sequentially etched in a dry etching chamber, which is referred to as an "in-situ" method.

Figure 12A:
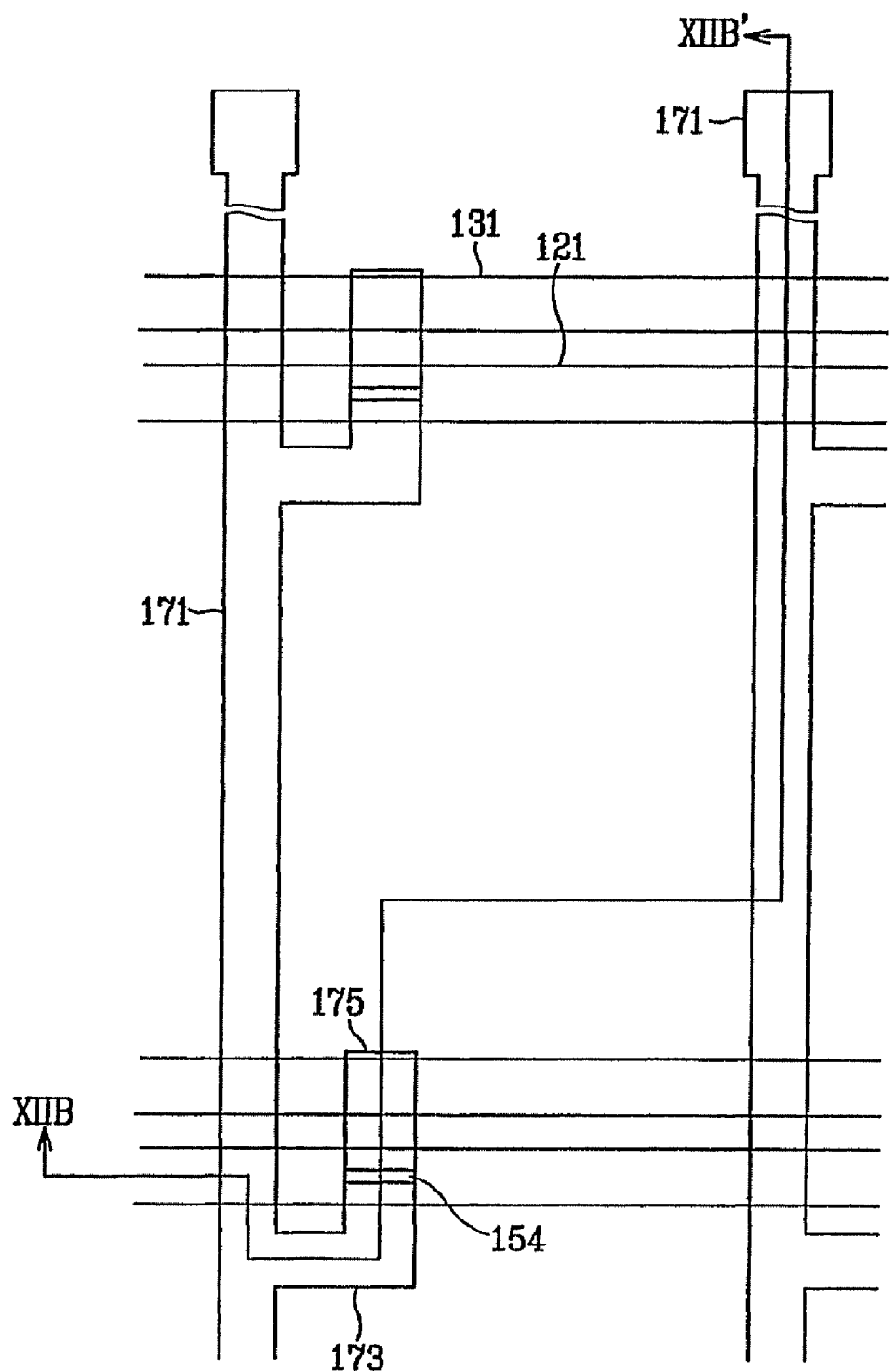
Figure 12B:
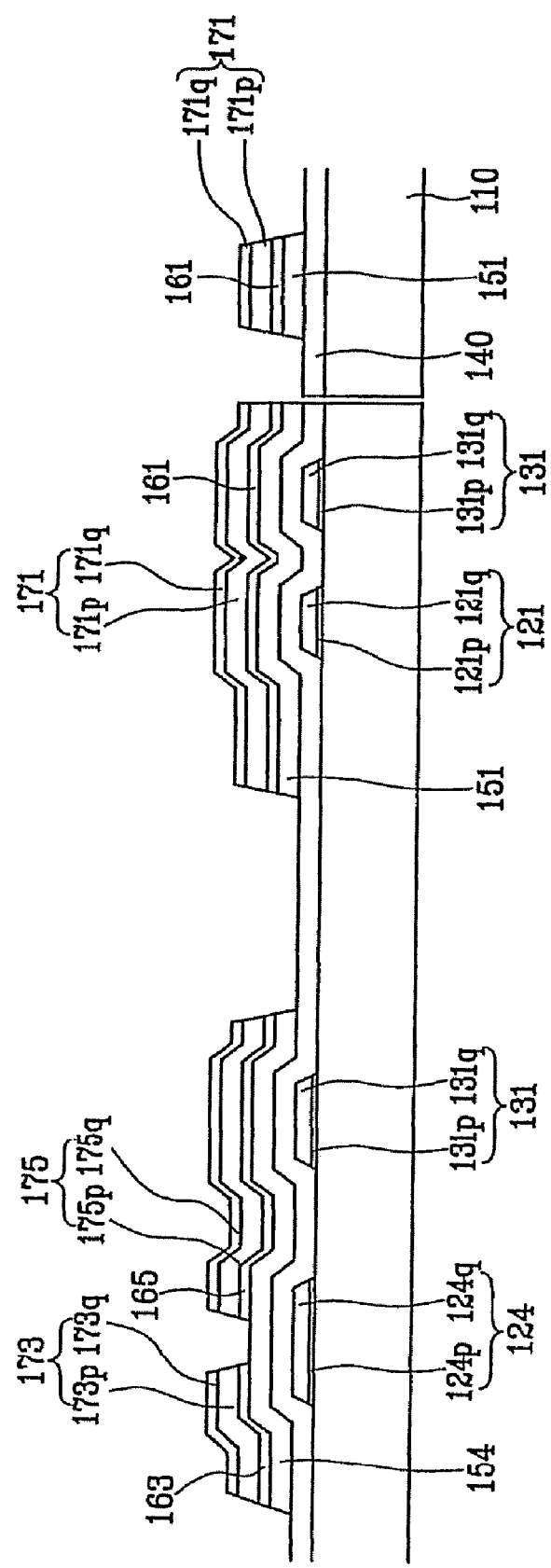

As shown in FIG. 12A and FIG. 12B, portions of the S/D metals 174 and the underlying portions of the extrinsic semiconductor layer 164 on the channel areas B are then removed by etching. The exposed portions of the semiconductor 154 may be etched to reduce the thickness of the semiconductor 154 and to partially remove and the second portion 52 of the photoresist pattern.

Accordingly, the source electrodes 173 and the drain electrodes 175 are separated from each other, and, simultaneously, the data lines 171 and the ohmic contacts 163 and 165 thereunder are completed.

The residual second portions 52 of the photoresist pattern left on the data areas A are then removed.

Figure 13A:
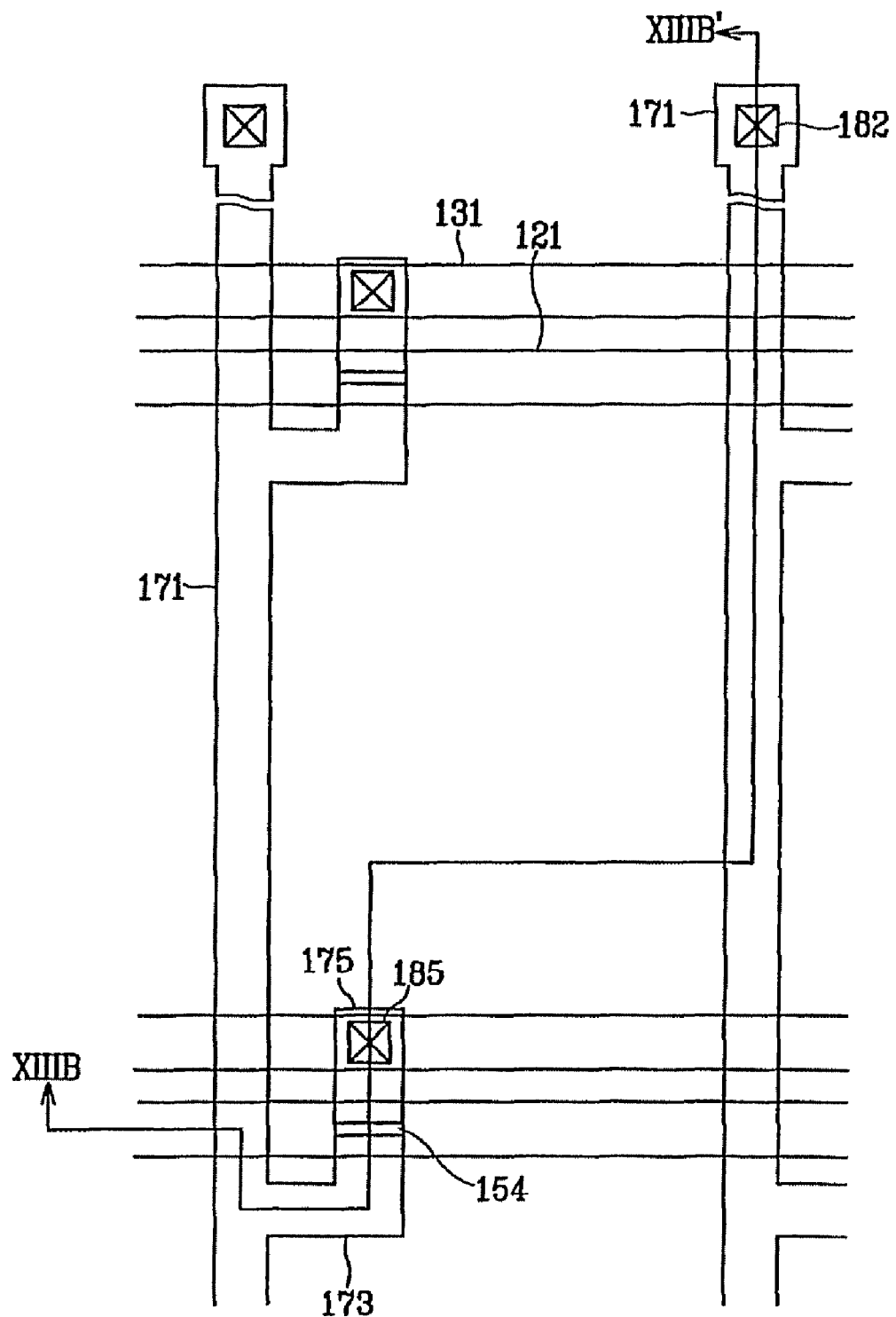
Figure 13B:
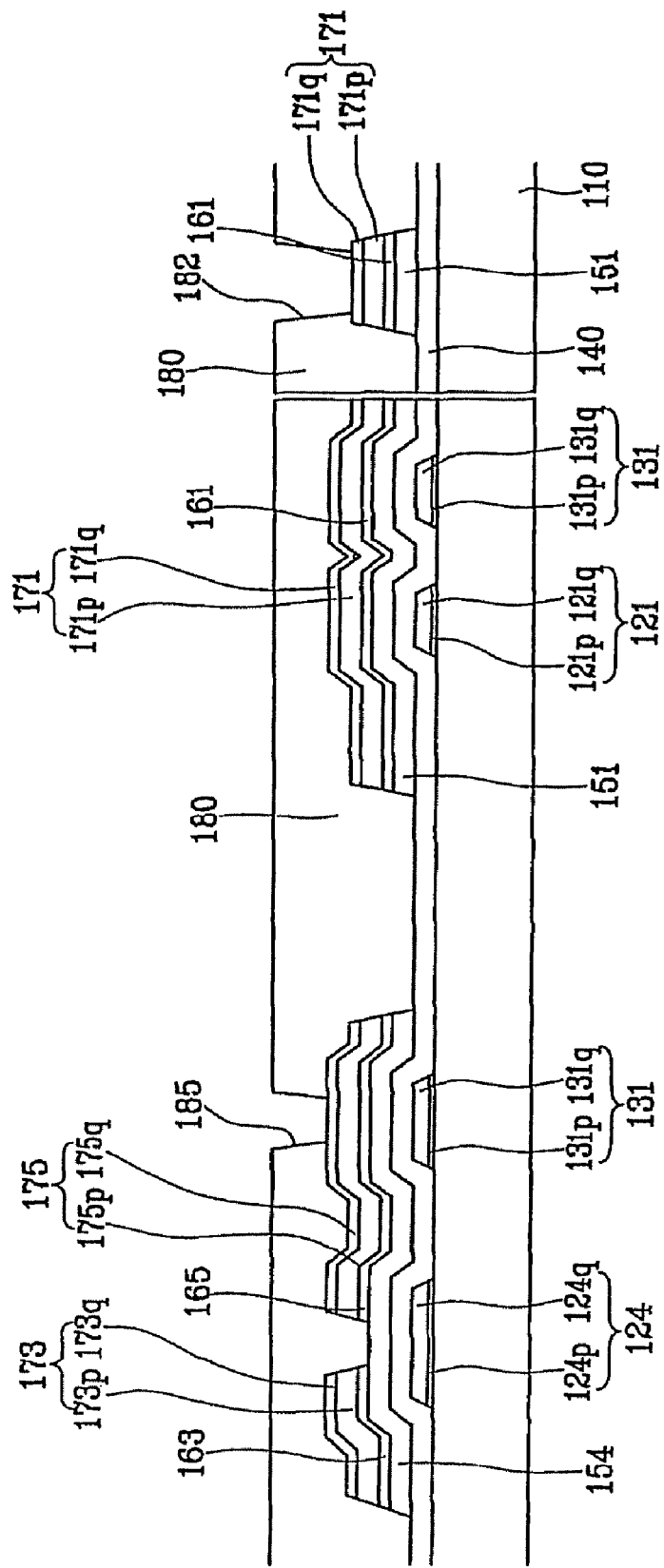

As shown in FIG. 13A and FIG. 13B, a passivation layer 180 is formed to cover the data lines 171, the drain electrodes 175, and the portions of the semiconductor stripes 151 are not covered with the data lines 171 and the drain electrodes 175. The passivation layer 180 may be formed of a photosensitive organic material having properties such as a good flatness characteristic, a dielectric insulating material having a low dielectric constant less than 4.0, such as a-Si:C:O and a-Si:O:F, formed by plasma enhanced chemical vapor deposition (PECVD), or an inorganic material such as silicon nitride and silicon oxide.

The passivation layer 180 is then photo-etched to form a plurality of contact holes 185 and 182. When the passivation layer 180 is formed with a photosensitive material, the contact holes 185 and 182 may only be formed by photolithography.

As shown in FIG. 7 and FIG. 8, a plurality of pixel electrodes 190 and a plurality of contact assistants 82 are then formed by sputtering and photo-etching an IZO layer or an ITO layer. The pixel electrodes 190 and the contact assistants 82 are respectively connected, e.g., coupled, with the drain electrodes 175 and an end of the data lines 171 through the contact holes 185 and 182.

The present embodiment illustrates a TFT array panel having color filters, however, it is understood that the color fillers are not always necessary.

Figure 14A:
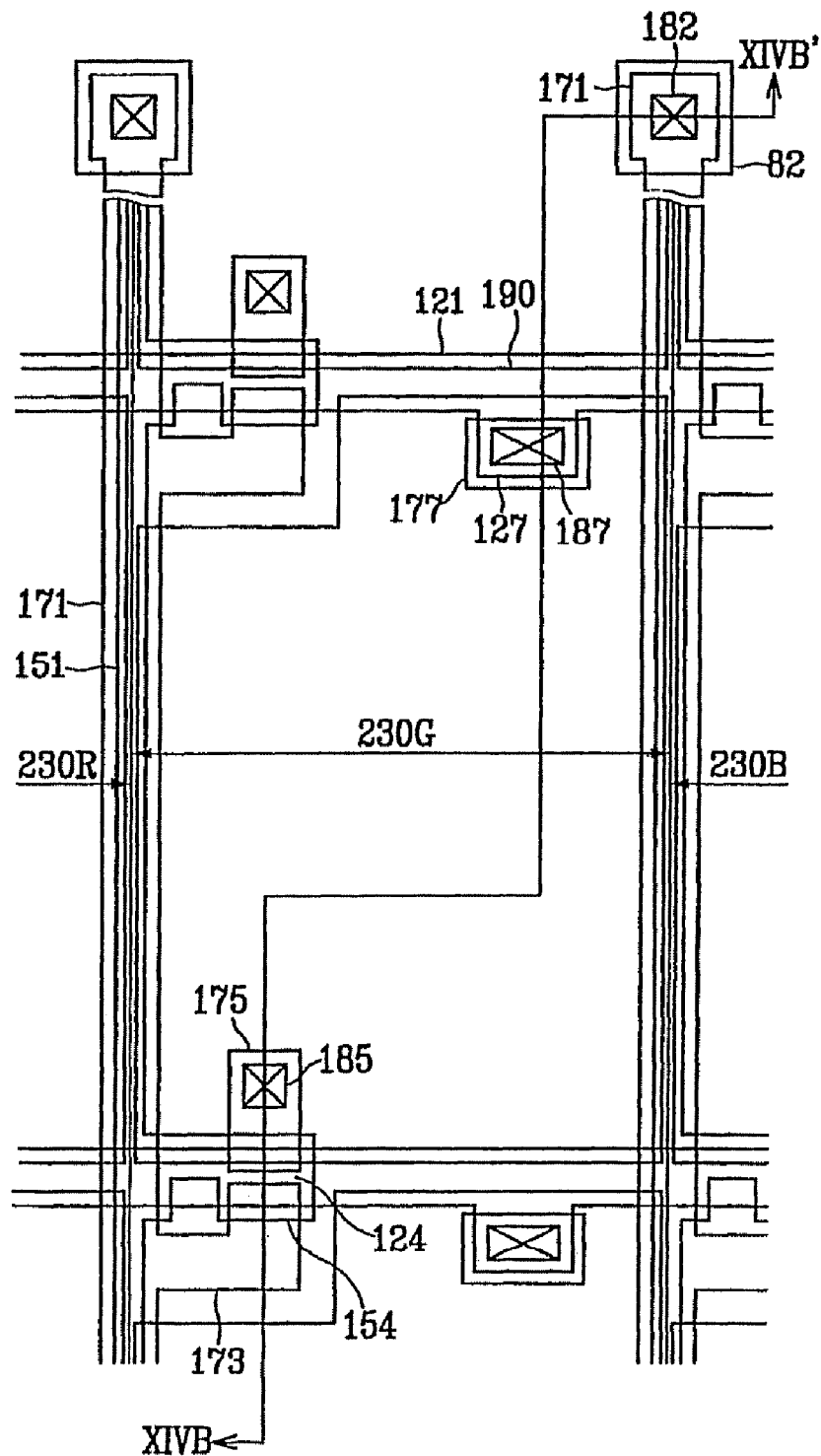
FIG. 14A is a layout view of a TFT array panel for an LCD according to another embodiment of the invention.
Figure 14B:
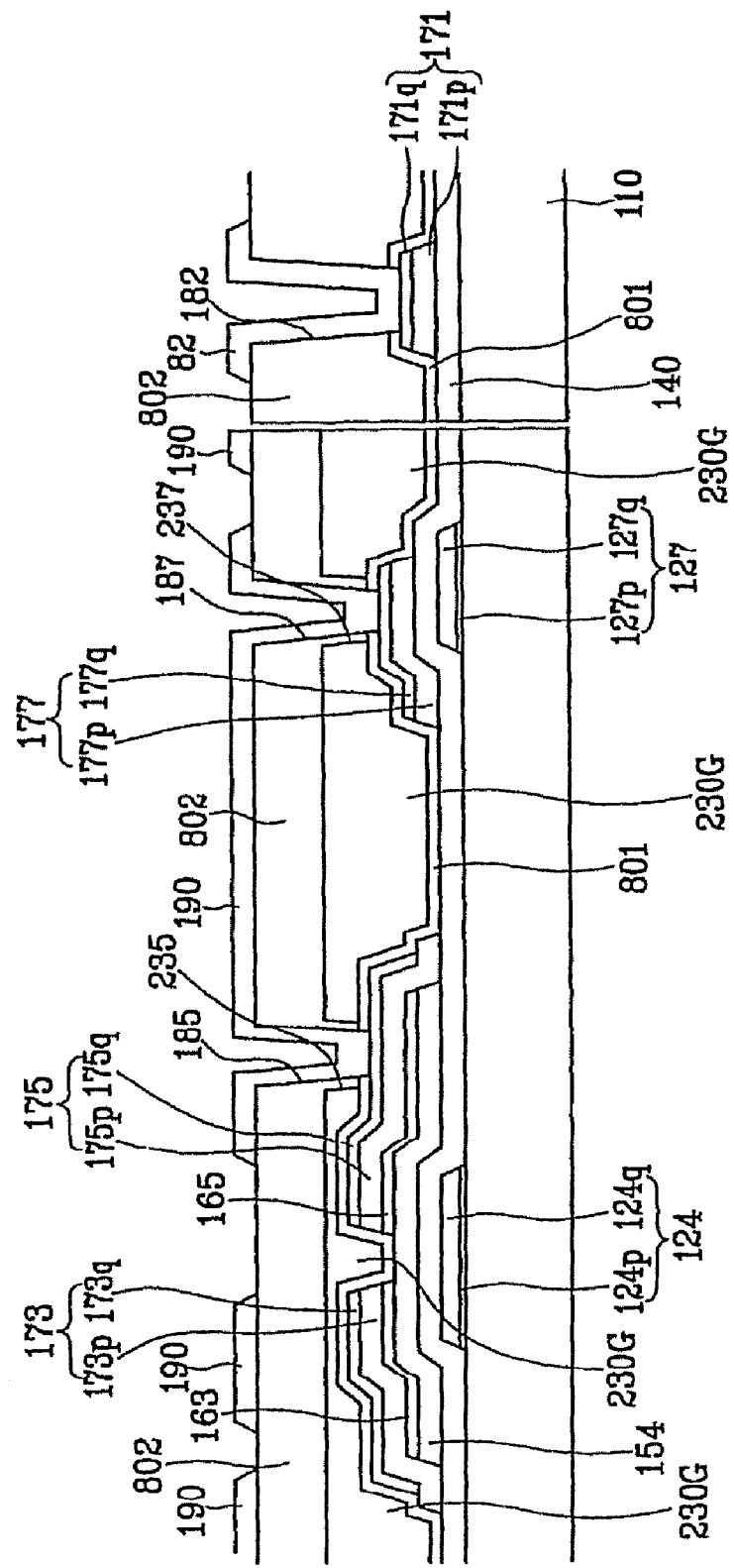
FIG. 14B is a sectional view of the TFT array panel shown in FIG. 14A taken along the line XIVB-XIVB'.

FIG. 14A is a layout view of a TFT array panel for an LCD according to another embodiment of the invention. FIG. 14B is a sectional view of the TFT array panel shown in FIG. 14A taken along the line XIVB-XIVB'.

A plurality of gate lines 121 for transmitting gate signals are formed on an insulating substrate 110. As shown, the gate lines 121 are mostly formed in the substantially horizontal direction and partial portions thereof form a plurality of gate electrodes 124. Also, different partial portions of the gate lines 121, which extend in a downward direction, become a plurality of expansions 127.

The gate line 121 has lower layers 124p and 127p and upper layers 124q and 127q. The lower layers 124p and 127p may be made of an Al containing metal such as aluminum (Al) or aluminum-neodymium (Al—Nd). The upper layers 124q and 127q may be of a Cu containing metal such as pure Cu or a Cu alloy. For example, the upper layers 124q and 127q may be thicker than the lower layers 124*p* and 127*p*, e.g., the upper layers 124*q* and 127*q* are preferably more than four times thicker than the lower layers 124*p* and 127*p*

When the Al containing metal layer is too thin, the Cu containing metal layer may contact the substrate and/or may be partially peeled. To the contrary, when the Al containing metal layer is too thick, high resistance of signal lines is problemsome. Accordingly, it is preferable that the upper layers 124*q* and 127*q* of the Cu containing metal are more than four times thicker than the lower layers 124*p* and 127*p* of the Al containing metal.

The lateral sides of the upper layers 124*q* and 127*q* and lower layers 124*p* and 127*q* are inclined relative to a surface of the substrate 110, and the inclination angle thereof ranges from about 30 to about 80 degrees.

A gate insulating layer 140, which may be made of silicon nitride (SiNx), is formed on the gate lines 121.

A plurality of semiconductor stripes 151, which may be made of hydrogenated amorphous silicon (abbreviated to "a-Si"), are formed on the gate insulating layer 140. Each semiconductor stripe 151 extends substantially in the longitudinal direction and is curved at various portions thereof. Each semiconductor stripe 151 has a plurality of projections 154 extending toward the gate electrodes 124. The width of each semiconductor stripe 151 increases near the gate lines 121 such that the semiconductor stripe 151 covers sufficient areas of the gate lines 121.

A plurality of ohmic contact stripes 161 and islands 165, which may be made of silicide or n+ hydrogenated a-Si heavily doped with n type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edge surfaces of the semiconductor stripes 151 and the ohmic contacts 161 and 165 are tapered. The inclination angles of the tapered edge surfaces of the semiconductor stripes 151 and the ohmic contacts 161 and 165 are preferably in a range of about 30 to about 80 degrees.

A plurality of data lines 171, a plurality of drain electrodes 175, and a plurality of storage capacitor conductors 177 are formed on the ohmic contacts 161 and 165 and the gate insulating layer 140.

The data lines 171 for transmitting data voltages extend substantially in the longitudinal direction and intersect the gate lines 121 to define pixel regions arranged in a matrix. A plurality of branches of each data line 171, which extend toward the drain electrodes 175, form a plurality of source electrodes 173. Each pair of the source electrodes 173 and the drain electrodes 175 are separated from each other, and are opposite to each other with respect to a gate electrode 124.

A gate electrode 124, a source electrode 173, a drain electrode 175, and a projection 154 of a semiconductor stripe 151, together form a TFT having a channel formed in the projection 154 that is disposed between the source electrode 173 and the drain electrode 175. The storage capacitor conductor 177 is overlapped with the expansion 127 of the gate line 121.

The data lines 171, the drain electrode 175, and the storage capacitor conductor 177 may be made of a metal such as Cr, Ti, Ag, Mo, Ta, and an Al containing metal (Al, or Al-alloy). When the data lines 171, the drain electrode 175, and the storage capacitor conductor 177 include an Al containing metal layer, the data lines 171, the drain electrode 175, and the storage capacitor conductor 177 may further include another layer made of Cr, Ti, Ta, Mo, or an alloy thereof having good physical, chemical, and electrical contact characteristics with other materials such as indium tin oxide (ITO) and indium zinc oxide (IZO).

The data lines 171, the drain electrodes 175, the storage capacitor conductor 177 have tapered edge surfaces, and the inclination angles of the edge surfaces are in a range of about 30 to about 80 degrees.

The ohmic contacts 161 and 165 are only arranged between the semiconductor stripe 151 and the data line 171 and between the drain electrode 175 and the projection 154 of the semiconductor stripe 151 to reduce contact resistance therebetween. The semiconductor stripe 151 is exposed at an area between the source electrode 173 and the drain electrode 175 and at other areas not covered with the data line 171 and the drain electrode 175. Most of the semiconductor stripe 151 is narrower than the data line 171, however, the semiconductor stripe 151 widens near an area where the semiconductor stripe 151 and the gate line 121 meet each other in order to prevent disconnection of the data line 171, as discussed above.

According to an embodiment of the invention, the color filters 230R, 230G, and 230B are formed on the data line 171, the drain electrode 175, and the storage capacitor conductor 177. The color filters 230R, 230G, and 230B are formed along pixel columns that are partitioned by data lines 171. The red, green, and blue color filters 230R, 230G, and 230B are activated in turn.

The color filters 230R, 230G, and 230B are not formed on the end portions of the gate lines 121 and the data lines 171, which are connected; e.g., coupled, with external circuits. Two adjacent color filters 230R, 230G, and 230B overlap each other on the data lines 171. Accordingly, the overlapped color fillers 230R, 230G, and 230B prevents or substantially prevents light leakage that may arise around a pixel area. All of the red, green, and blue color filters 230R, 230G, and 230B may be arranged on the data line 171 to overlap each other.

A first interlayer insulating layer 801 is formed under the color filters 230R, 230G, and 230B to prevent pigments of the color filters 230R, 230G, and 230B from flowing or permeating into the semiconductor protrusion 154. A second interlayer insulating layer 802 may be formed on the color filters 230R, 230G, and 230B to prevent pigments of the color filters 230R, 230G, and 230B from flowing into a liquid crystal layer (not illustrated).

The interlayer insulating layer 801 and 802 may be made of an insulating material having a low dielectric constant such as a-Si:C:O and a Si:O:F or SiNx.

As discussed above, when the color filters 230R, 230G, and 230B are arranged on the TFT array panel and overlap each other on the data line 171, the opposite panel may only have a common electrode. Accordingly, assembling of the TFT panel and opposite panel is easy and the such arrangement increase aperture ratio.

In the second interlayer insulating layer 802, a plurality of contact holes 185, 187, and 182 are formed to expose the drain electrode 175, the storage capacitor conductor 177, and an end portion of the data line 171, respectively.

A plurality of pixel electrodes 190 and a plurality of contact assistants 82, which are made of IZO or ITO, are formed on the second interlayer insulating layer 802.

Since the pixel electrode 190 is physically and electrically connected; e.g., coupled, with the drain electrode 175 and the storage capacitor conductor 177 through the contact holes 185 and 187, respectively, the pixel electrode 190 receives the data voltage from the drain electrodes 175 and transmits the data voltage to the storage capacitor conductor 177.

The pixel electrode 190 where the data voltage is applied generates an electric field with a common electrode (not illustrated) of the opposite panel (not illustrated) to which a common voltage is applied, so that the liquid crystal molecules in the liquid crystal layer are rearranged according to the applied voltage.

The contact assistant 82 supplements adhesion between the end portion of the data line 171 and the exterior devices, such as the driving integrated circuit, and provides protection. The contact assistant 82 is optional.

A method for manufacturing a TFT array panel is described below with reference to FIGS. 15A, 16A, and 16B as well as FIG. 14A and FIG. 14B.

Figure 15A:
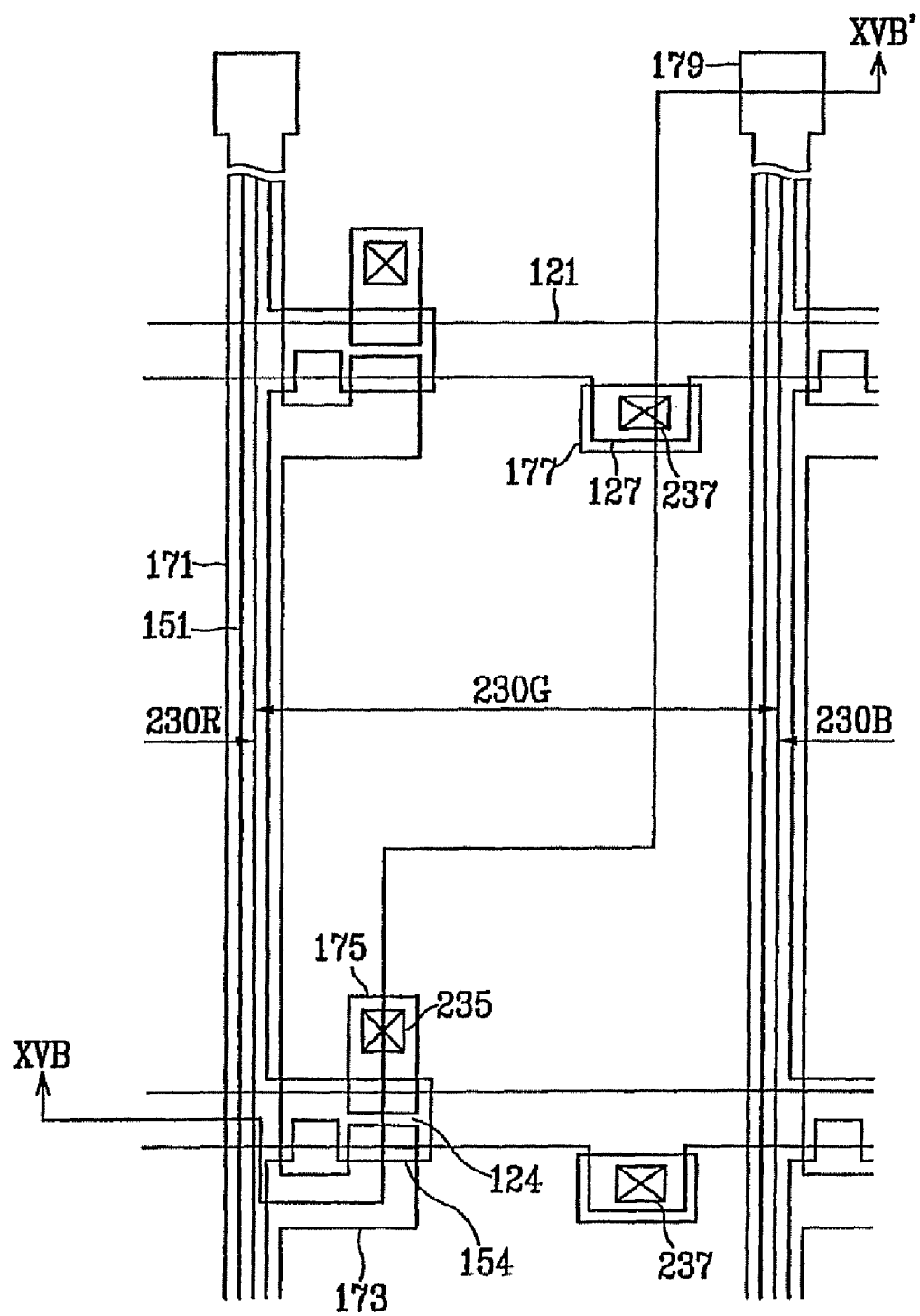
FIG. 15A and FIG. 16A are layout views of the TFT array panel shown in FIG. 14A and FIG. 14B during intermediate operations of a manufacturing method according to an embodiment of the invention.
Figure 15B:
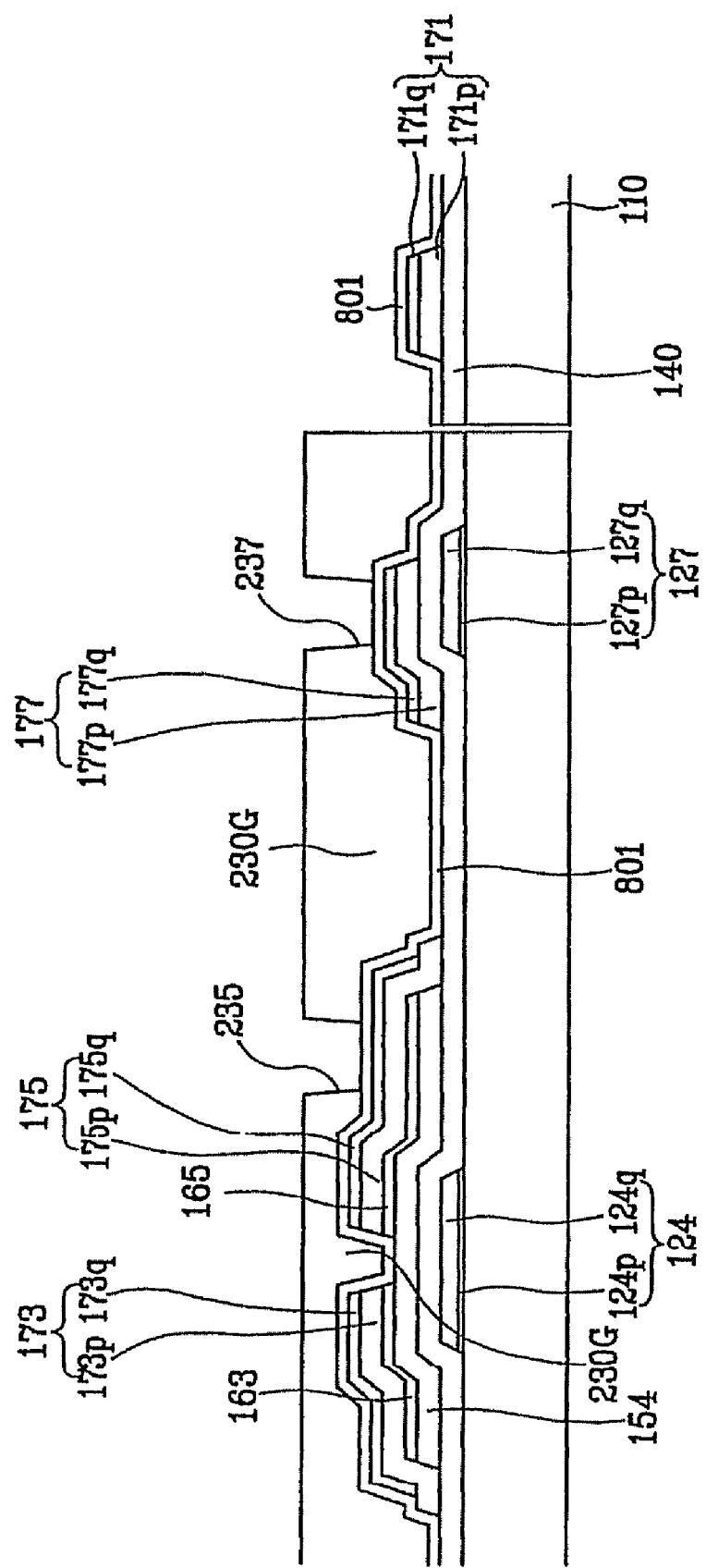
FIG. 15B is a sectional view of the TFT array panel shown in FIG. 15A taken along the line XVB-XVB'.

Referring to FIG. 15A and FIG. 15B, a lower metal layer of Al or Al alloy and an upper metal layer of Cu, which is thicker than the lower metal layer, are formed on an insulating substrate 110 of glass by sputtering.

The upper metal layer and the lower metal layer are simultaneously patterned to form a plurality of gate lines 121 having gate electrodes 124 and storage electrode lines 131. For example, the lower metal layer and the upper metal layer may have a thickness ratio of about 1:4. The upper and lower layers are preferably etched using an etchant of $H_2O_2$ or an etchant containing $H_2O_2$, phosphoric acid ($H_3PO_4$), nitric acid ($HNO_3$), acetic acid ($CH_3COOH$), and deionized water. The etchant may include about 50% to about 80% of phosphoric acid, about 2% to about 10% of nitric acid, about 2% to about 15% of acetic acid, and deionized water to fill the residual quantity.

A gate insulating layer 140, a plurality of semiconductor stripes 151, a plurality of ohmic contact assistants 161 and 165, a plurality of data lines 171, and drain electrodes 175 are sequentially formed on the gate lines 121.

Organic photo-resist materials respectively including pigments of red, green, and blue are applied and patterned using a photo process to sequentially form a plurality of color filters 230R, 230G, and 230B. For example, a first interlayer insulating layer 801 made of an inorganic insulating material, such as SiNx or $SiO_2$, is formed on the data lines 171 and drain electrodes 175 before the color filters 230R, 230G, and 230B are formed. The first interlayer insulating layer 801 prevents pigments of the color filters 230R, 230G, and 230B from permeating or flowing into the semiconductor protrusion 154. At this time, openings 235 and 237 exposing the drain electrode 175 and the storage capacitor conductor 177 are simultaneously formed.

Figure 16A:
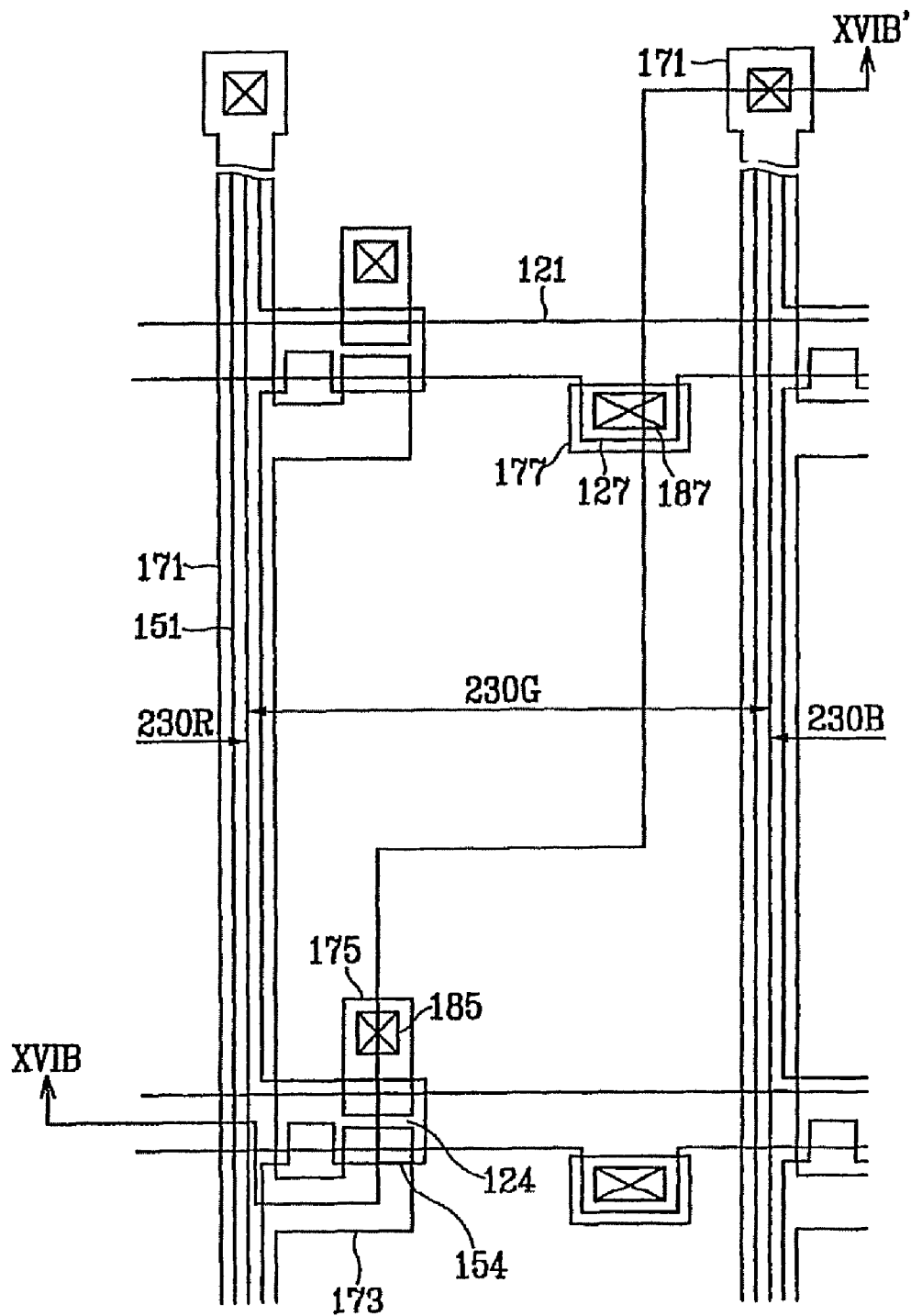
Figure 16B:
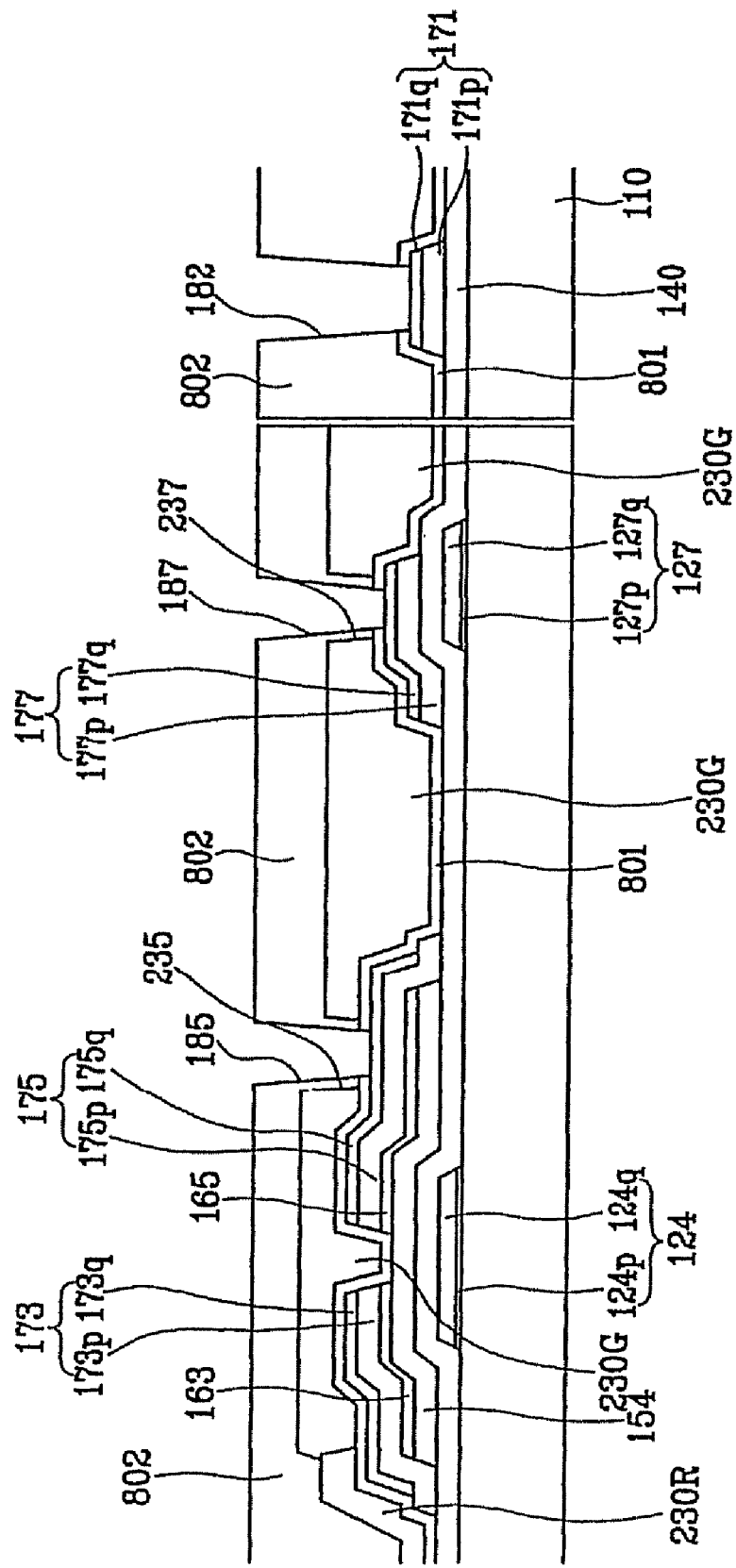
FIG. 16B is a sectional view of the TFT array panel shown in FIG. 16A taken along the line XVIB-XVIB'.

Referring to FIG. 16A and FIG. 16B, a second interlayer insulating layer 802 is formed by coating an organic insulating film having a low dielectric constant and a good flatness characteristic, or by coating the PECVD of a low dielectric insulating material, such as a-Si:C:O and a-Si:O:F, having a dielectric constant less than about 4.0

The first interlayer insulating layer 801 and the second interlayer insulating layer 802 are photo-etched to form a plurality of contact holes 182, 185, and 187. The contact holes 185 and 187 exposing the drain electrodes 175 and the storage capacitor conductor 177 are formed in the openings 235 and 237 of the color filters 230R, 230G, and 230B As shown in FIG. 14B, a plurality of pixel electrodes 190 and a plurality of contact assistants 82 are then formed thereon, e.g., by sputtering and photo-etching an IZO layer or an ITO layer. The pixel electrodes 190 are connected; e.g., coupled, with the drain electrodes 175 and the storage capacitor conductor 177 through the contact holes 185 and 187.

A TFT panel for an active matrix organic light emitting display (AM-OLED) according to another embodiment of the invention is described below.

Figure 17:
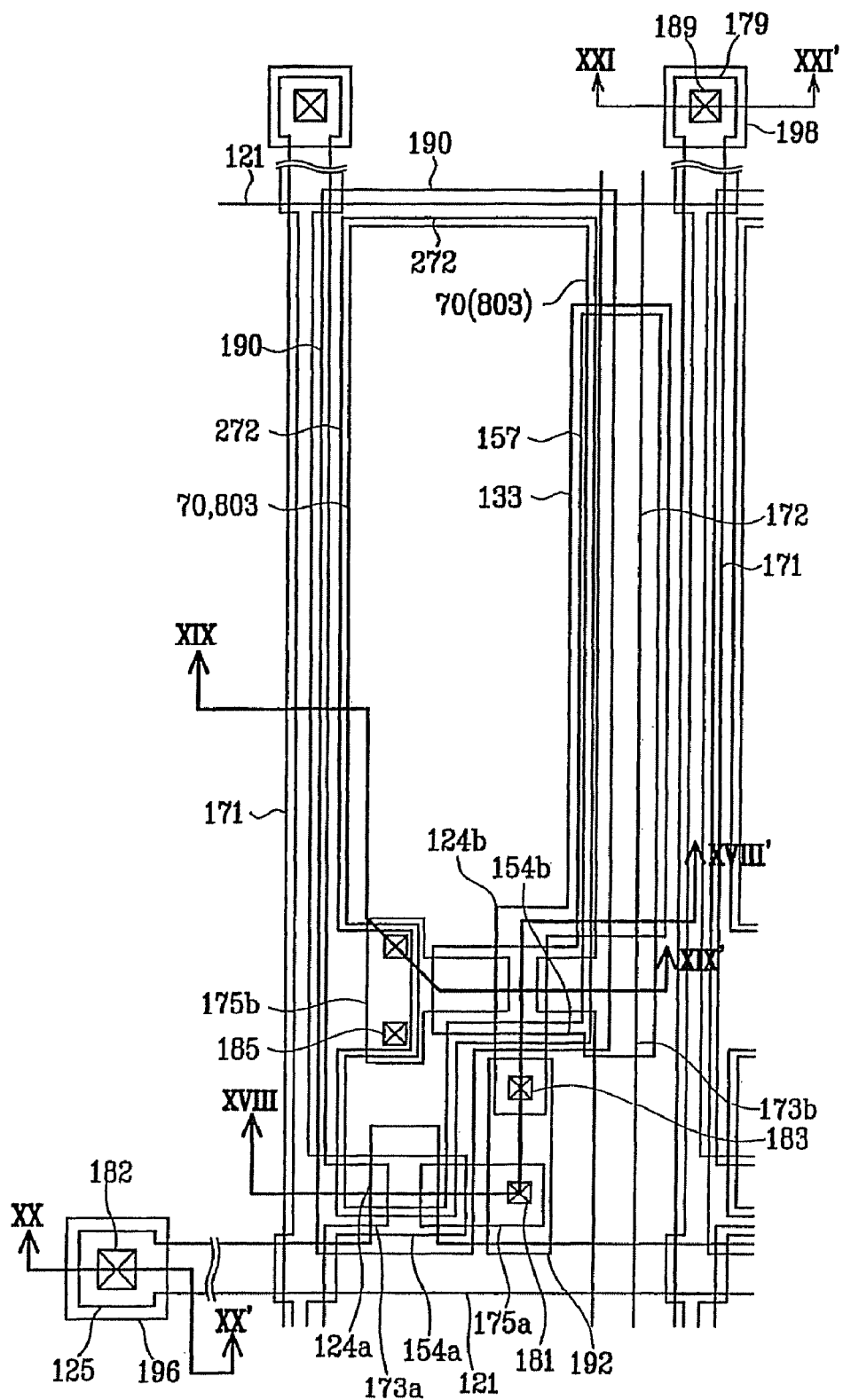
FIG. 17 is a layout view of a TFT array panel for an OLED according to another embodiment of the invention.
Figure 18:
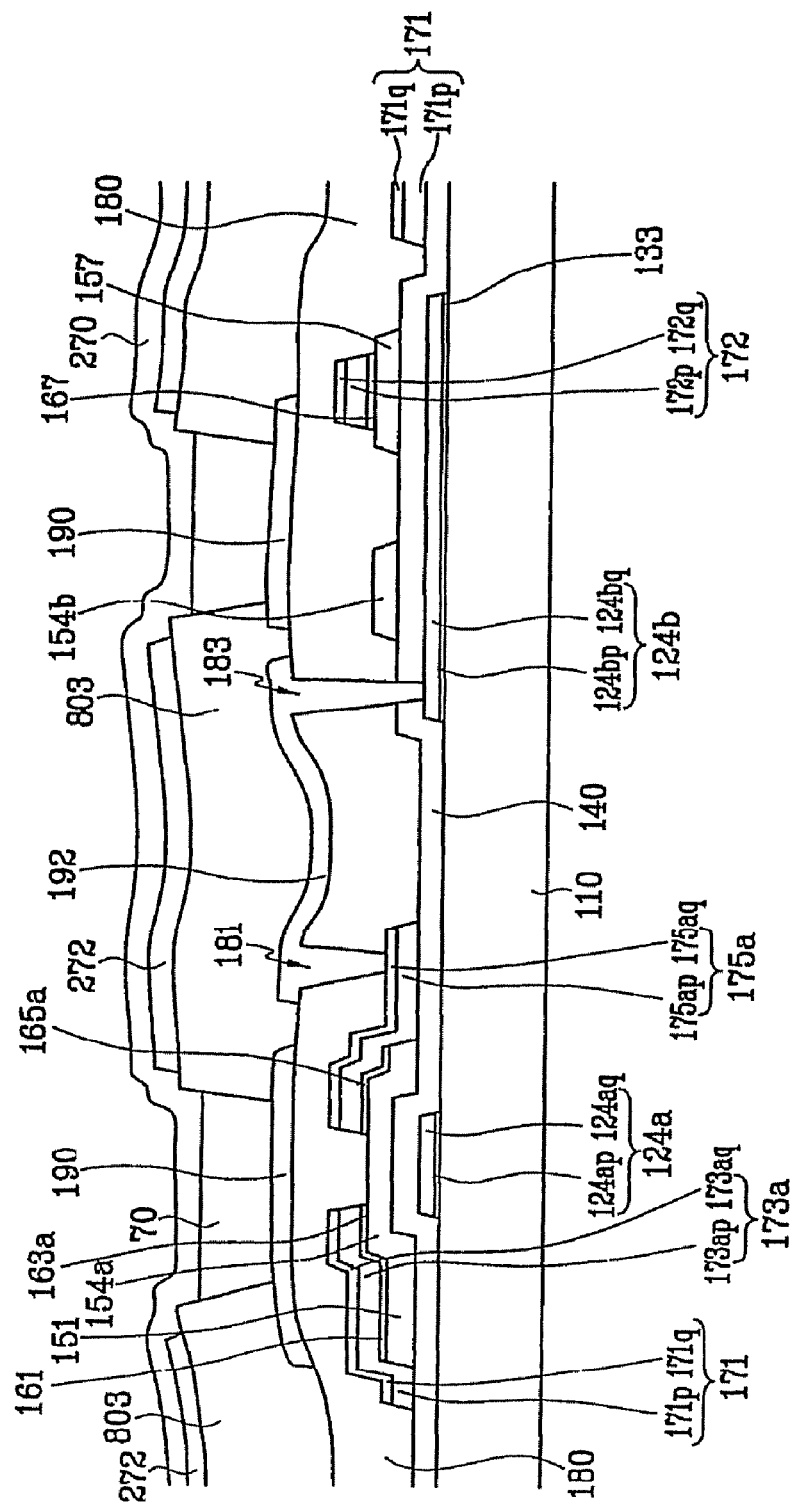
FIG. 18 and FIG. 19 are sectional views of the TFT array panel shown in FIG. 17 taken along the line XVIII-XVIII' and the line XIX-XIX', respectively.
Figure 19:
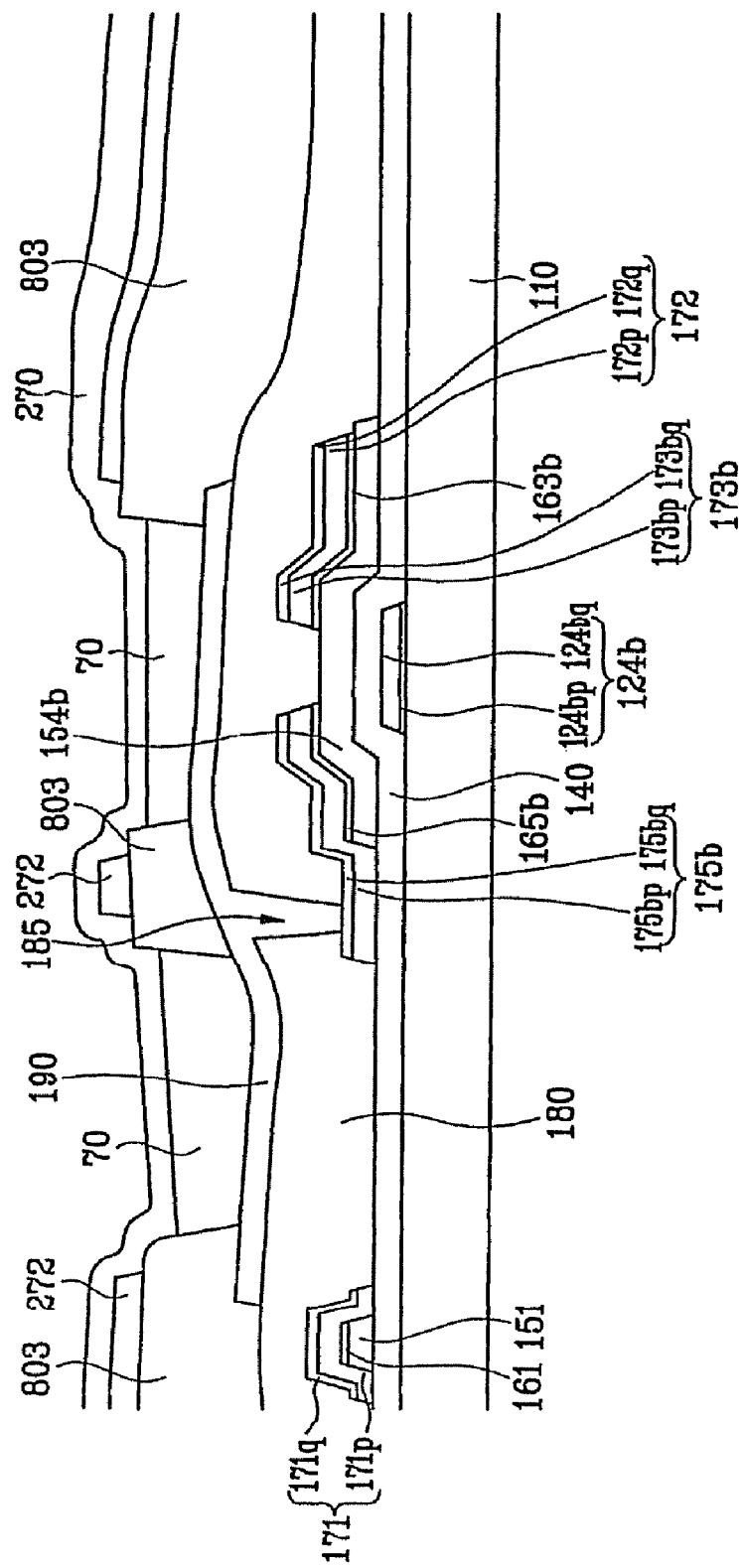
Figure 20:
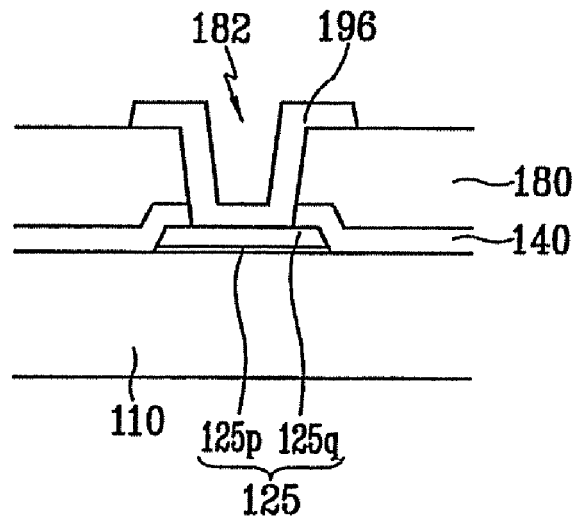
FIG. 20 and FIG. 21 are sectional views of the TFT array panel shown in FIG. 17 taken along the line XX-XX' and the line XXI-XXI', respectively.
Figure 21:
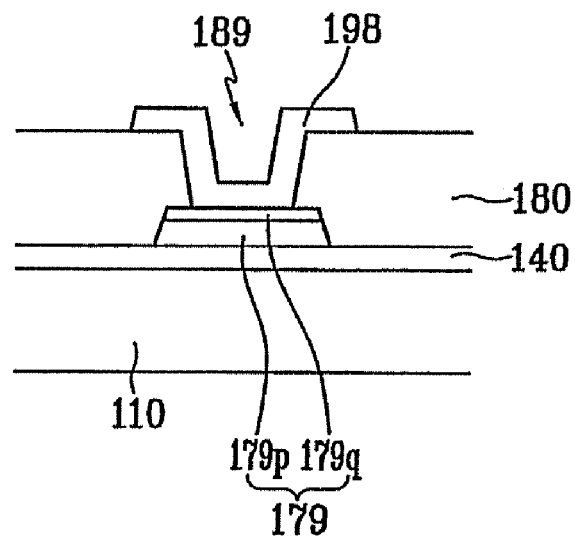

FIG. 17 is a layout view of a TFT array panel for an LCD according to another embodiment of the invention. FIG. 18 and FIG. 19 are sectional views of the TFT array panel shown in FIG. 17 taken along the line XVIII-XVIII' and the line XIX-XIX', respectively. FIG. 20 and FIG. 21 are sectional views of the TFT array panel shown in FIG. 17 taken along the line XX-XX' and the line XXI-XXI', respectively.

A plurality of gate conductors that include a plurality of gate lines 121 including first gate electrodes 124a and a plurality of second gate electrodes 124b are formed on an insulating substrate 110, such as transparent glass.

The gate lines 121, transmitting gate signals, extend substantially in a transverse direction and are separated from each other. As shown, the first gate electrodes 124a extends upward. The gate line 121 may extend to be connected; e.g., coupled, with a driving circuit (not shown) integrated on the substrate 110, or the gate line 121 may have an end portion (not shown) having a sufficient area for connection with another layer or an external driving circuit mounted or attached on the substrate 110 or on another device, such as a flexible printed circuit film (not shown), that may be attached with the substrate 110.

Each of the second gate electrodes 124b is separated from the gate lines 121 and include a storage electrode 133 extending substantially in a transverse direction between two adjacent gate lines 121.

The gate lines 121, the first gate electrode 124a and the second gate electrode 124b, and the storage electrode 133 have lower layers 124ap and 124bp and upper layers 124aq and 124bq. The lower layers 124ap and 124bp may be made of an Al containing metal such as aluminum (Al) or aluminum-neodymium (Al—Nd). The upper layers 124aq and 124bq may be made of Cu.

The upper layers 124aq and 124bq are thicker than the lower layers 124ap and 124bp. For example, the upper layers 124aq and 124bq are preferably more than four times thicker than the lower layers 124ap and 124bp when considering such properties as low resistance, adhesiveness, and simultaneous etching.

The lateral sides of the gate conductors 121 and 124b are inclined relative to a surface of the substrate 110 and the inclination angle thereof ranges from about 30 degrees to about 80 degrees.

A gate insulating layer 140, which may be made of silicon nitride (SiNx), is formed on the gate conductors 121 and 124b.

A plurality of semiconductor stripes 151 and islands 154b, which may be made of hydrogenated amorphous silicon (abbreviated to "a-Si") or polysilicon, are formed on the gate insulating layer 140. Each semiconductor stripe 151 extends substantially in the longitudinal direction and has a plurality of projections 154a extending toward the first gate electrodes 124a. Each semiconductor island 154b crosses a second gate electrode 124b and includes a portion 157 that overlaps the storage electrode 133 of the second gate electrode 124b.

A plurality of ohmic contact stripes 161 and ohmic contact islands 163b, 165a, and 165b, which may be made of silicide or n+ hydrogenated a-Si heavily doped with n type impurity such as phosphorous, are formed on the semiconductor stripes 151 and islands 154b. Each ohmic contact stripe 161 includes a plurality of projections 163a, and the projections 163a and the ohmic contact islands 165a are located in pairs on the projections 154a of the semiconductor stripes 151. The ohmic contact islands 163b and 165b are located in pairs on the semiconductor islands 154b and the semiconductor islands 154b includes a portion 167 that overlaps the storage electrode 133 of the second gate electrode 124b.

The lateral sides of the semiconductor stripes and islands 151 and 154b and the ohmic contacts 161, 163b, 165a, and 165b are inclined relative to a surface of the substrate, and the inclination angles thereof are preferably between about 30 degrees to about 80 degrees.

A plurality of data conductors including a plurality of data lines 171, a plurality of voltage transmission lines 172, and a plurality of first drain electrodes 175a and second drain electrodes 175b are formed on the ohmic contacts 161, 163b, 165b, and 165b and the gate insulating layer 140.

The data lines 171 extend substantially in the longitudinal direction and intersect the gate lines 121. Each data line 171 includes a plurality of first source electrodes 173a, an end portion thereof having a sufficient area for contact with another layer or an external device. The data lines 171 may be directly connected; e.g., coupled, with a data driving circuit for generating the gate signals, which may be integrated on the substrate 110.

The voltage transmission lines 172 for transmitting driving voltages extend substantially in the longitudinal direction and intersect the gate lines 121. Each voltage transmission line 172 includes a plurality of second source electrodes 173b. The voltage transmission lines 172 may be connected; e.g., coupled, with each other. The voltage transmission lines 172 overlap the storage region 157 of the semiconductor islands 154b.

The first drain electrode 175a and the second drain electrode 175b are separated from the data lines 171 and the voltage transmission lines 172 and from each other. Each pair of the first source electrodes 173a and the first drain electrodes 175a are arranged opposite to each other with respect to a first gate electrode 124a, and each pair of the second source electrodes 173b and the second drain electrodes 175b are arranged opposite to each other with respect to a second gate electrode 124b.

A first gate electrode 124a, a first source electrode 173a, a first drain electrode 175a, and a projection 154a of a semiconductor stripe 151, together form a switching TFT having a channel formed in the projection 154a arranged between the first source electrode 173a and the first drain electrode 175a. Meanwhile, a second gate electrode 124b, a second source electrode 173b, a second drain electrode 175b, and a semiconductor island 154b, together form a driving TFT having a channel formed in the semiconductor island 154b arranged between the second source electrode 173b and the second drain electrode 175b.

The data conductors 171, 172, 175a, and 175b are made of a metal such as Cr, Mo, Al, Cu, and W. The data conductors 171, 172, 175a, and 175b have tapered lateral sides relative to the surface of the substrate 110, and the inclination angles of the tapered lateral sides range from about 30 degrees to about 80 degrees.

The ohmic contacts 161, 163b, 165b, and 165b are only arranged between the underlying semiconductor stripes 151 and islands 154b and the overlying data conductors 171, 172, 175a, and 175b thereon and reduce the contact resistance therebetween. The semiconductor stripes 151 include a plurality of portions that are not covered with the data conductors 171, 172, 175a, and 175b.

Most of the semiconductor stripe 151 is narrower than the data line 171; however, the semiconductor stripe 151 widens near where the semiconductor stripe 151 and the gate line 121 meet each other in order to prevent disconnection of the data line 171, as discussed above.

A passivation layer 180 may be formed on the data conductors 171, 172, 175a, and 175b and the exposed portions of the semiconductor stripes 151 and islands 154b. The passivation layer 180 may preferably be made of an inorganic material, such as silicon nitride or silicon oxide, a photosensitive organic material having a good flatness characteristic, or a low dielectric insulating material having a dielectric constant less than 4.0, such as a-Si:C:O and a-Si:O:F, formed by plasma enhanced chemical vapor deposition (PECVD). The passivation layer 180 may include a lower layer of an inorganic insulator and an upper layer of an organic insulator.

The passivation layer 180 includes a plurality of contact holes 185, 183, 181, 182, and 189 exposing portions of the first drain electrode 175a, a second gate electrode 124b, the second drain electrodes 175b, and end portions 125 and 179 of the gate line 121 and the data line 171, respectively.

The contact holes 182 and 189 expose the end portions 125 and 179 of the gate line 121 and the data line 171 to connect them with external driving circuits. Anisotropic conductive films are arranged between the output terminals of the external driving circuit and the end portions 125 and 175 to assist with electrical connection and physical adhesion. However, when driving circuits are directly formed on the substrate 110, contact holes are not formed. When gate driving circuits are directly formed on the substrate 110 and data driving circuits are formed as separate chips, only a contact hole 189 exposing the end portion 179 of the data line 171 is formed.

A plurality of pixel electrodes 190, a plurality of connecting members 192, and a plurality of contact assistants 196 and 198 are formed on the passivation layer 180.

The pixel electrodes 190 are connected; e.g., coupled, with the second drain electrodes 175b through the contact holes 185. The connecting member 192 connects the first drain electrode 175a with the second gate electrode 124b through the contact holes 181 and 183. The contact assistants 196 and 198 are connected; e.g., coupled, with the end portions 196 and 198 of the gate line 121 and the data line 171 through the contact holes 182 and 189, respectively.

The pixel electrode 190, the connecting member 192, and the contact assistants 196 and 198 may be made of a transparent conductor material such as ITO or IZO.

A partition 803, an auxiliary electrode 272, a plurality of light emitting members 70, and a common electrode 270 may be formed on the passivation layer 180 and the pixel electrodes 190.

The partition 803 may be made of an organic or inorganic insulating material and forms frames of organic light emitting cells. The partition 803 may be formed along boundaries of the pixel electrodes 190 and defines space for filling with an organic light emitting material.

The light emitting member 70 is arranged on the pixel electrode 190 and surrounded by the partition 803. The light emitting member 70 may be made of one light emitting material that emits a red light, a green light or a blue light. Red, green, and blue light emitting members 70 are sequentially and repeatedly disposed on the substrate.

The auxiliary electrode 272 has substantially the same planar pattern as the partition 803. The auxiliary electrode 272 contacts the common electrode 270 to reduce resistance of the common electrode 270.

The common electrode 270 is formed on the partition 803, the auxiliary electrode 272, and the light emitting member 70. The common electrode 270 is made of a metal having low resistance, such as Al. This embodiment illustrates a back emitting OLED. However, when a front emitting OLED or both sides emitting OLED is used, the common electrode 270 may be made of a transparent conductor such as ITO or IZO.

A method for manufacturing the TFT array panel shown in FIGS. 17, 18, 19, 20, and 21 according to an embodiment of the invention is described below, with reference to FIGS. 17-33B.

FIGS. 22, 24, 26, 28, 30, 32, and 34 are layout views of the TFT array panel shown in FIGS. 17, 18, 19, 20, and 21 during intermediate operations of a manufacturing method according to an embodiment of the invention.

Figure 22:
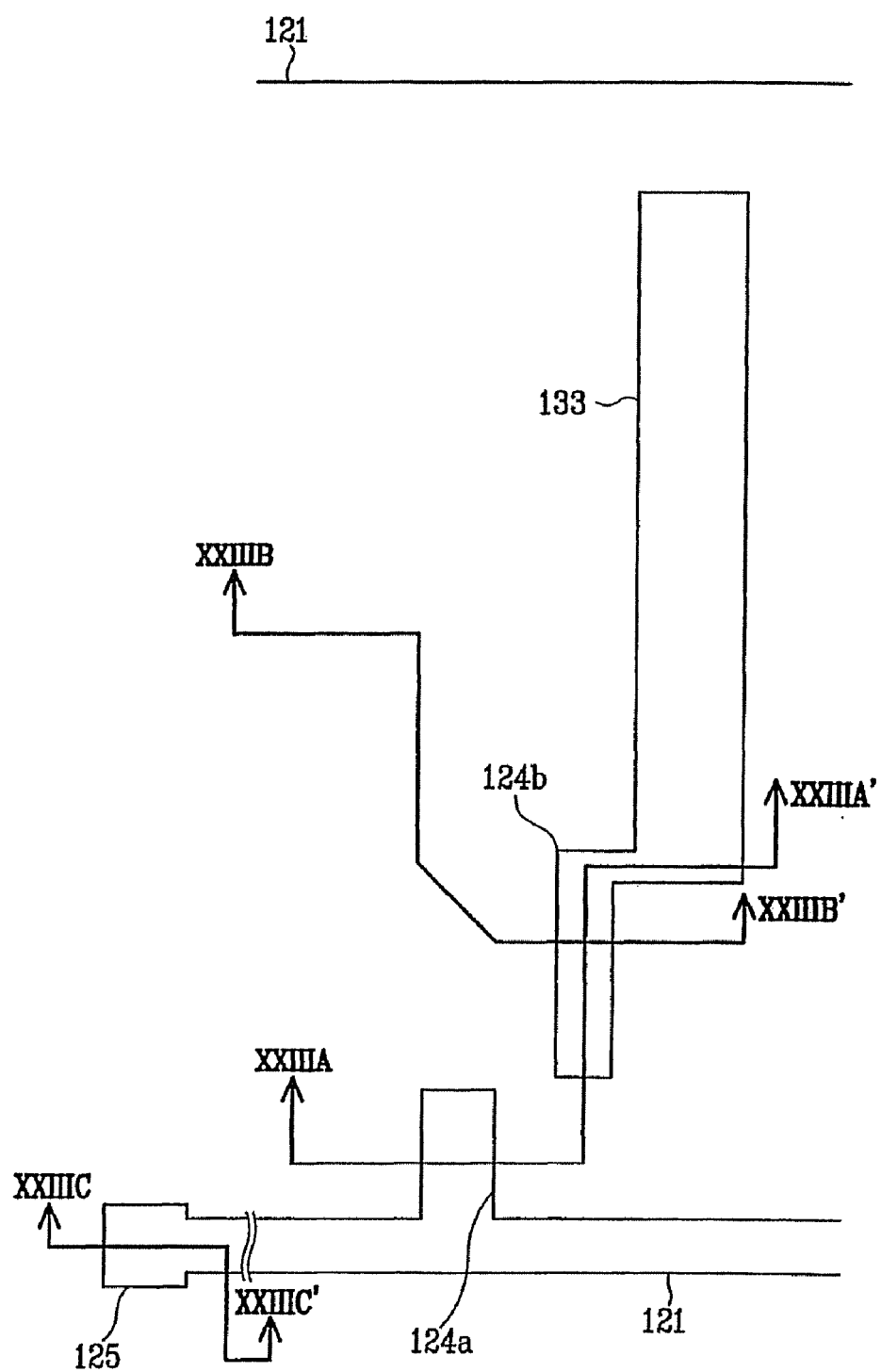
FIGS. 22, 24, 26, 28, 30, 32, and 34 are layout views of the TFT array panel shown in FIGS. 17, 18, 19, 20, and 21 during intermediate operations of a manufacturing method according to an embodiment of the invention.
Figure 23A:
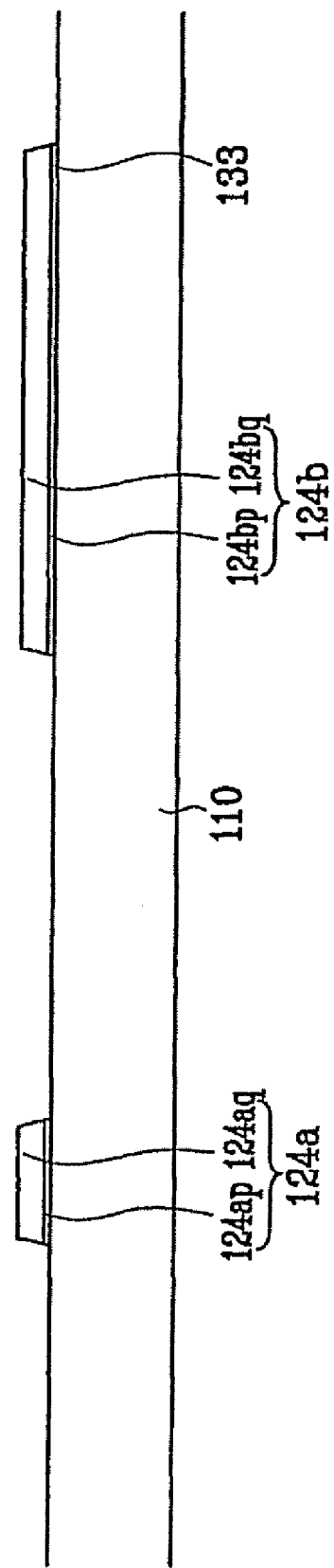
FIGS. 23A, 23B, and 23C are sectional views of the TFT array panel shown in FIG. 22 taken along the lines XXIIIa-XXIIIa', XXIIIb-XXIIIb', and XXIIIc-XXIIIc'.
Figure 23B:
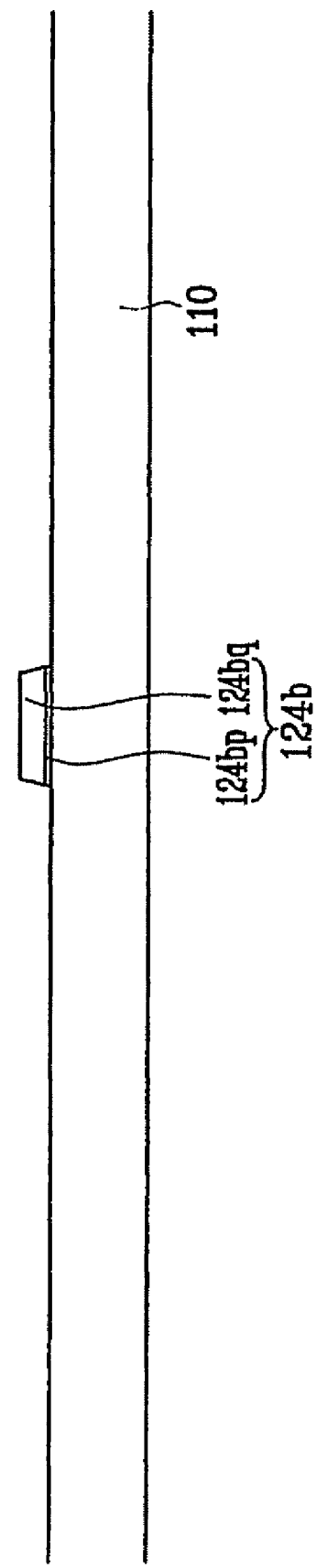
Figure 23C:
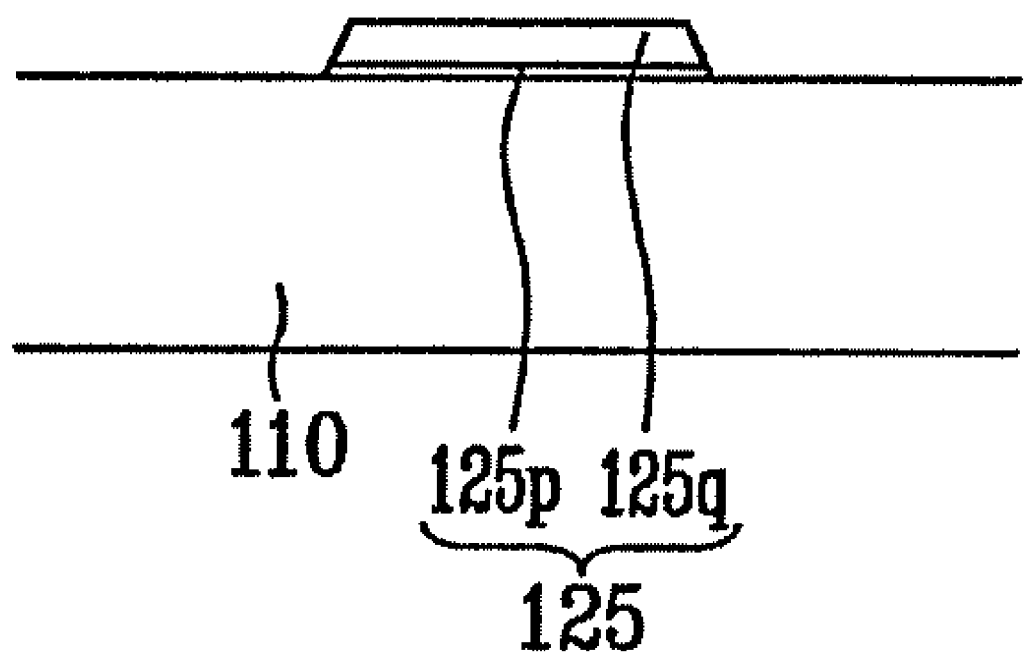
Figure 24:
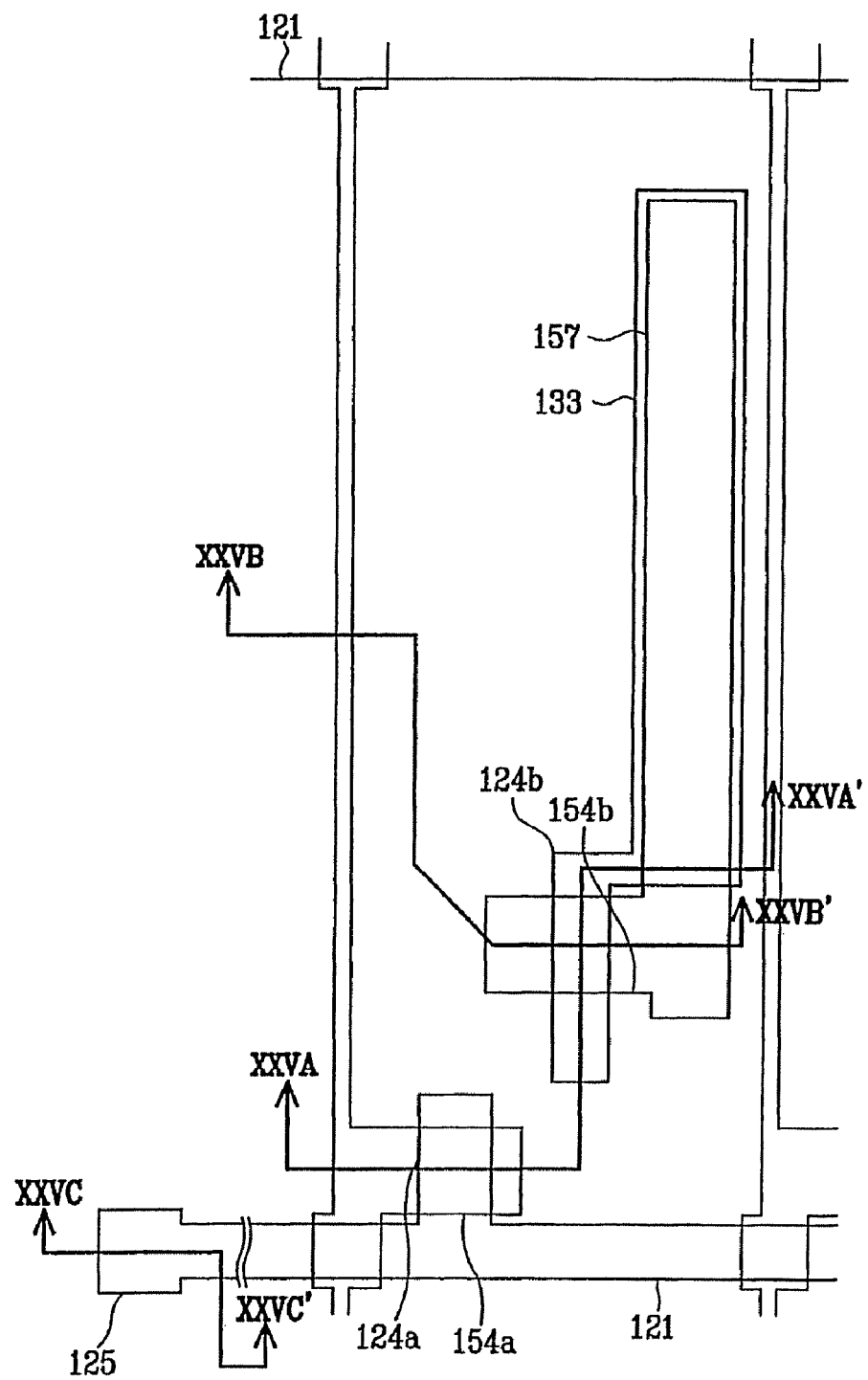
Figure 25A:
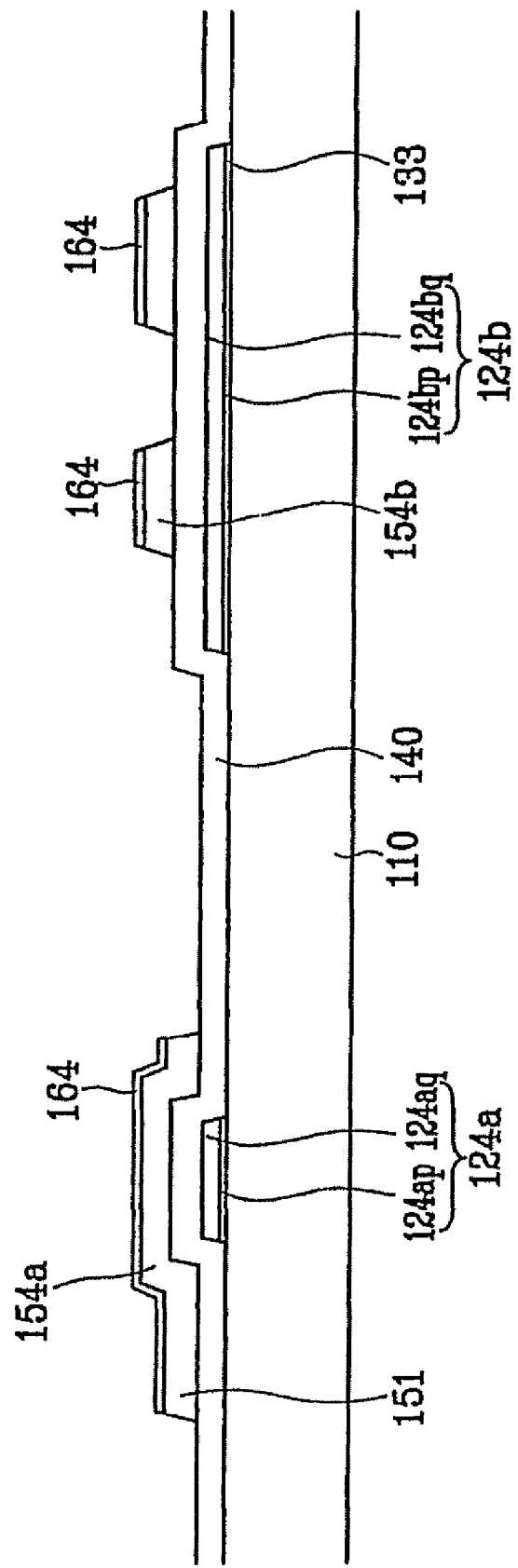
Figure 25C:
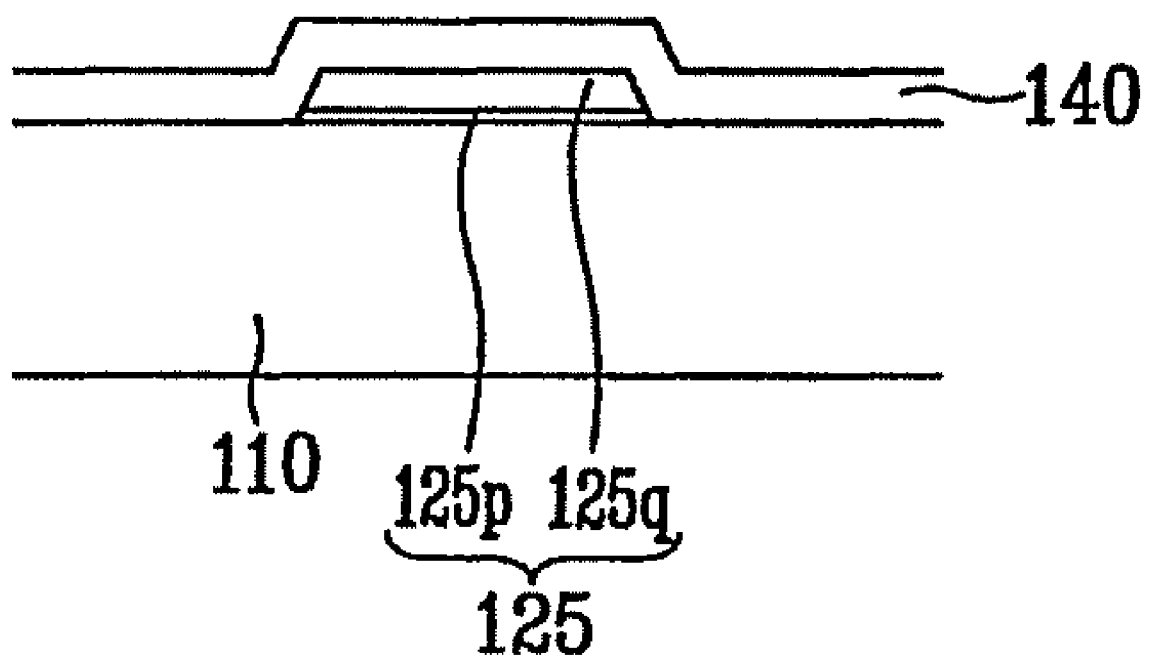
Figure 26:
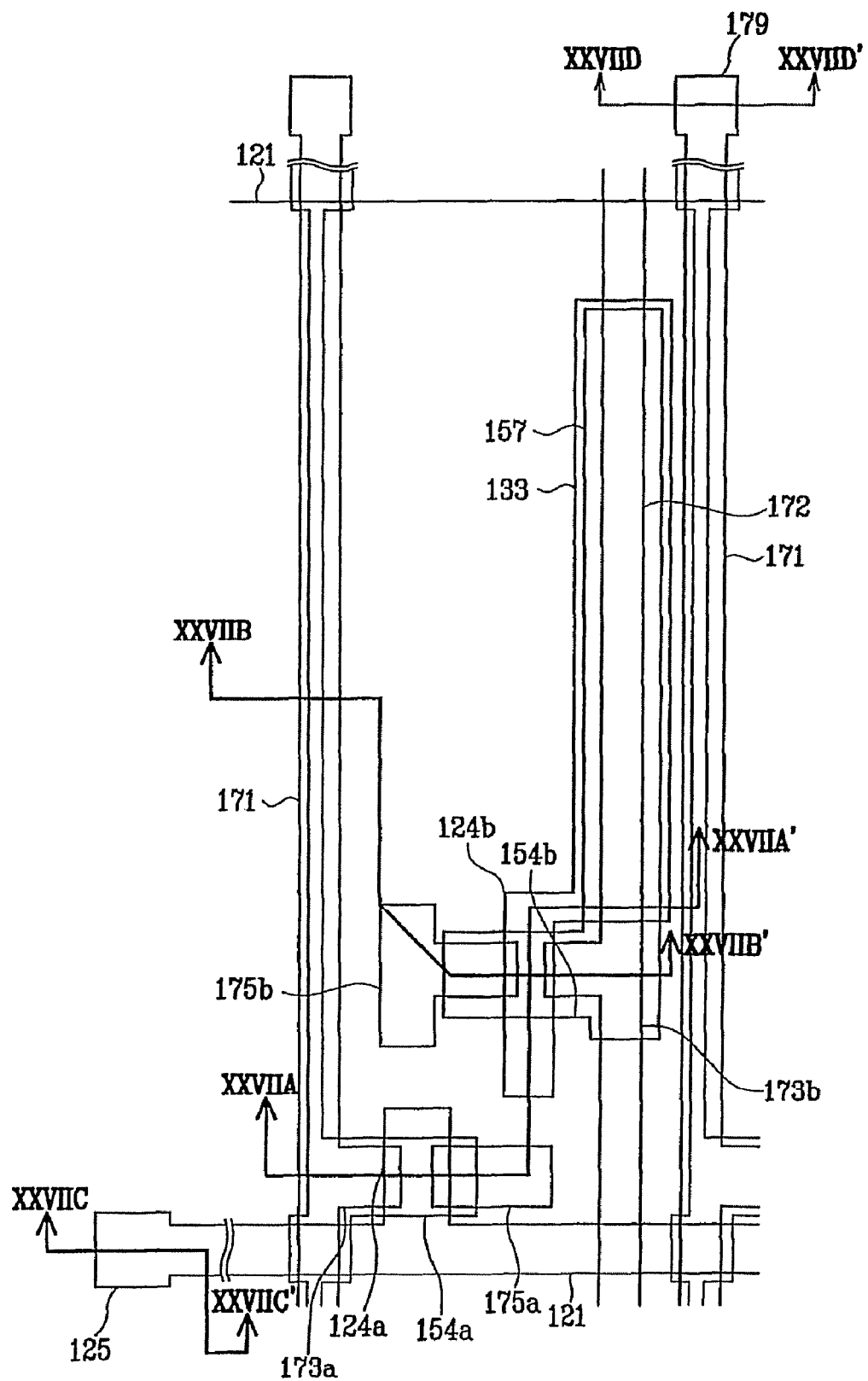
Figure 27A:
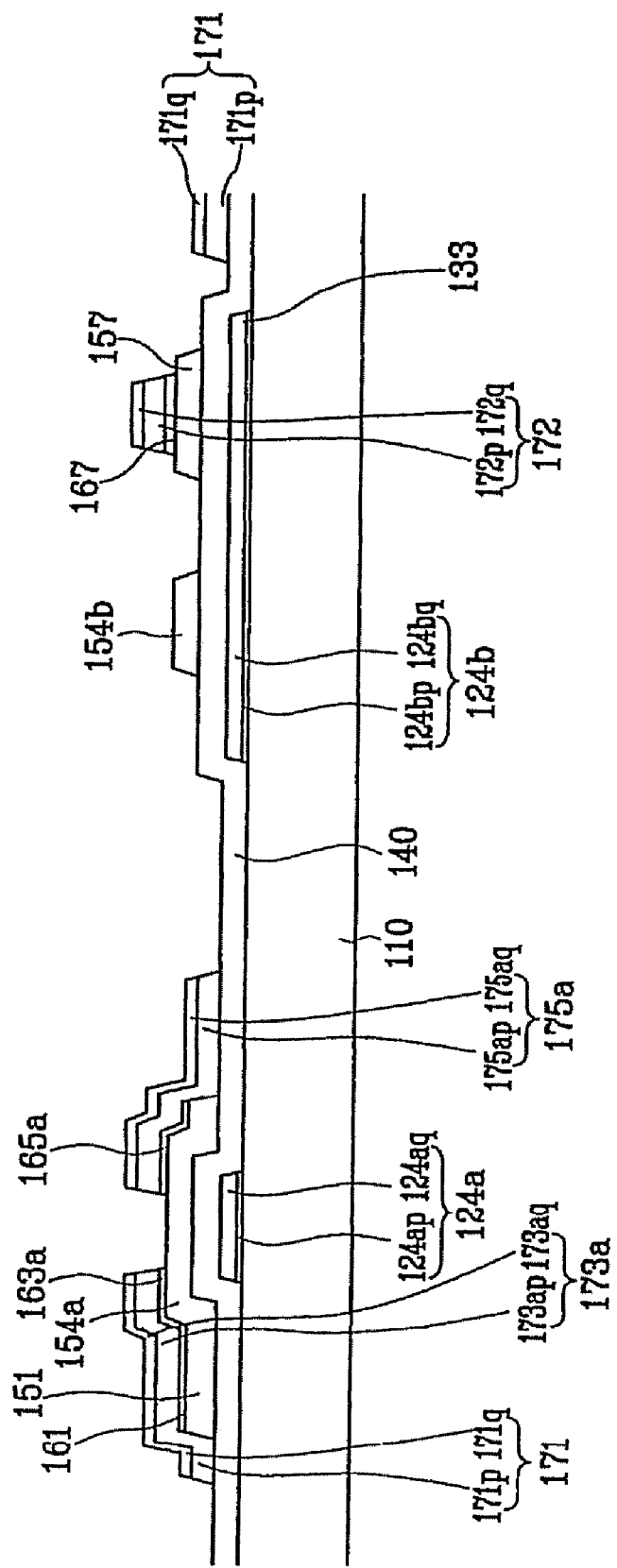
FIGS. 27A, 27B, 27C, and 27D are sectional views of the TFT array panel shown in FIG. 26 taken along the lines XXVIIa-XXVIIa', XXVIIb-XXVIIb', XXVIIc-XXVIIc', and XXVIId-XXVIId'.
Figure 27B:
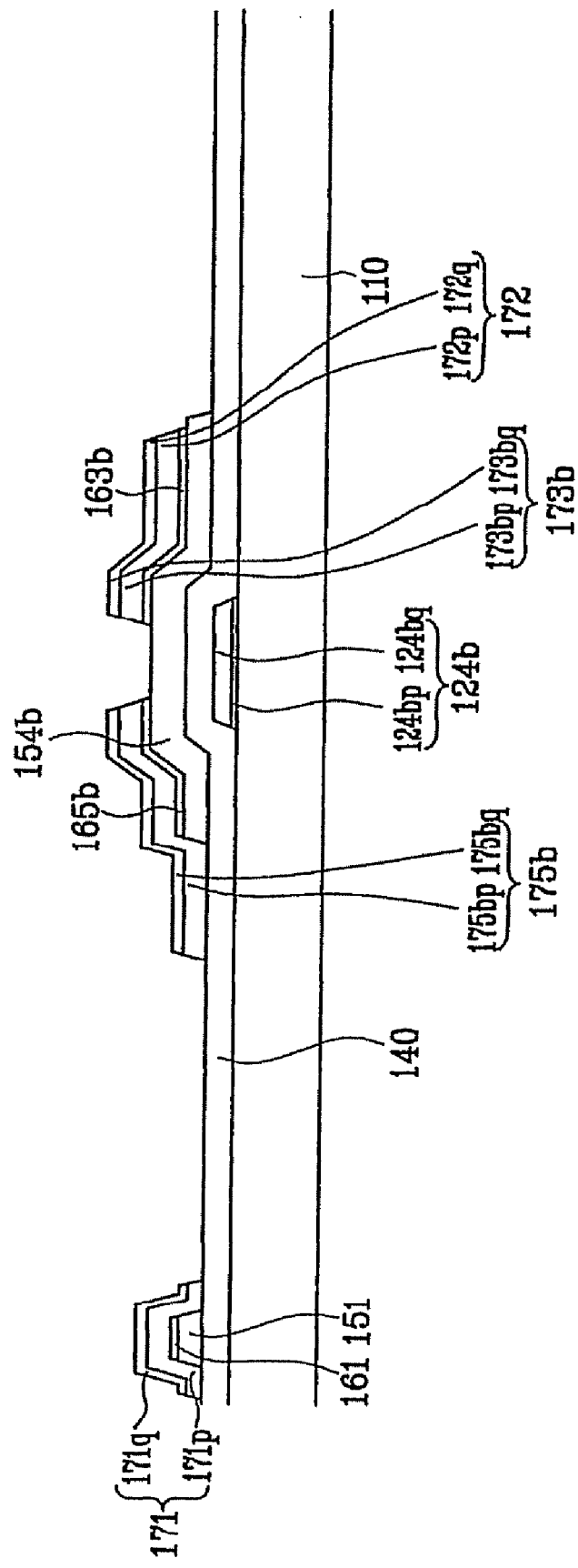
Figure 27C:
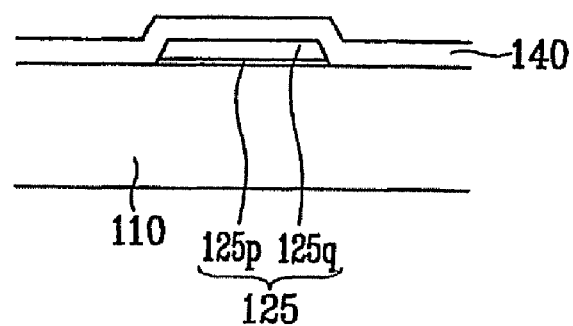
Figure 27D:
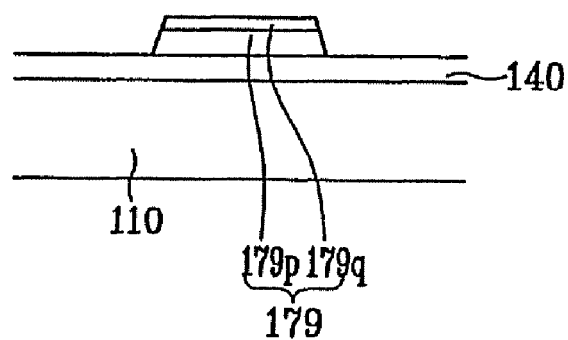
Figure 28:
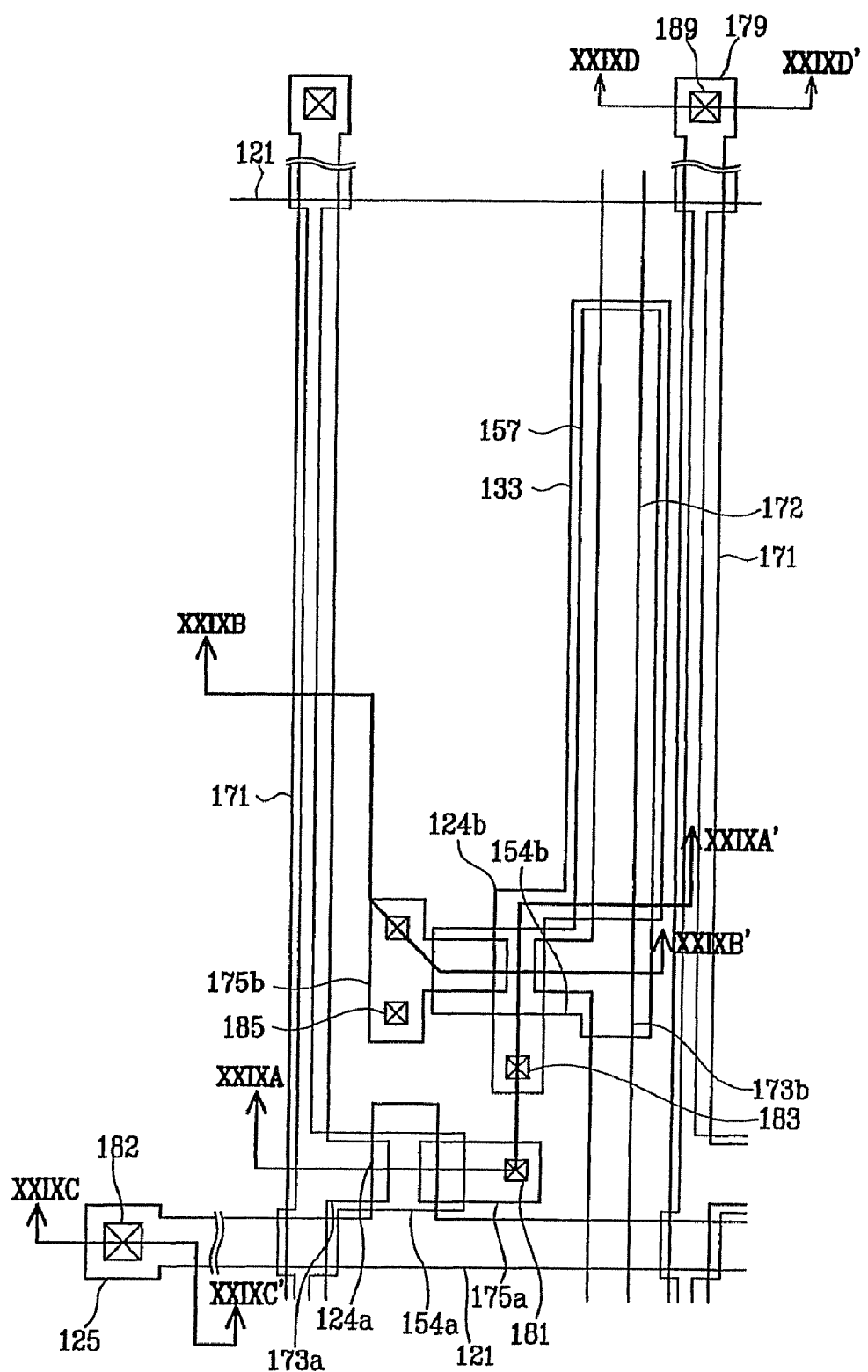
Figure 29A:
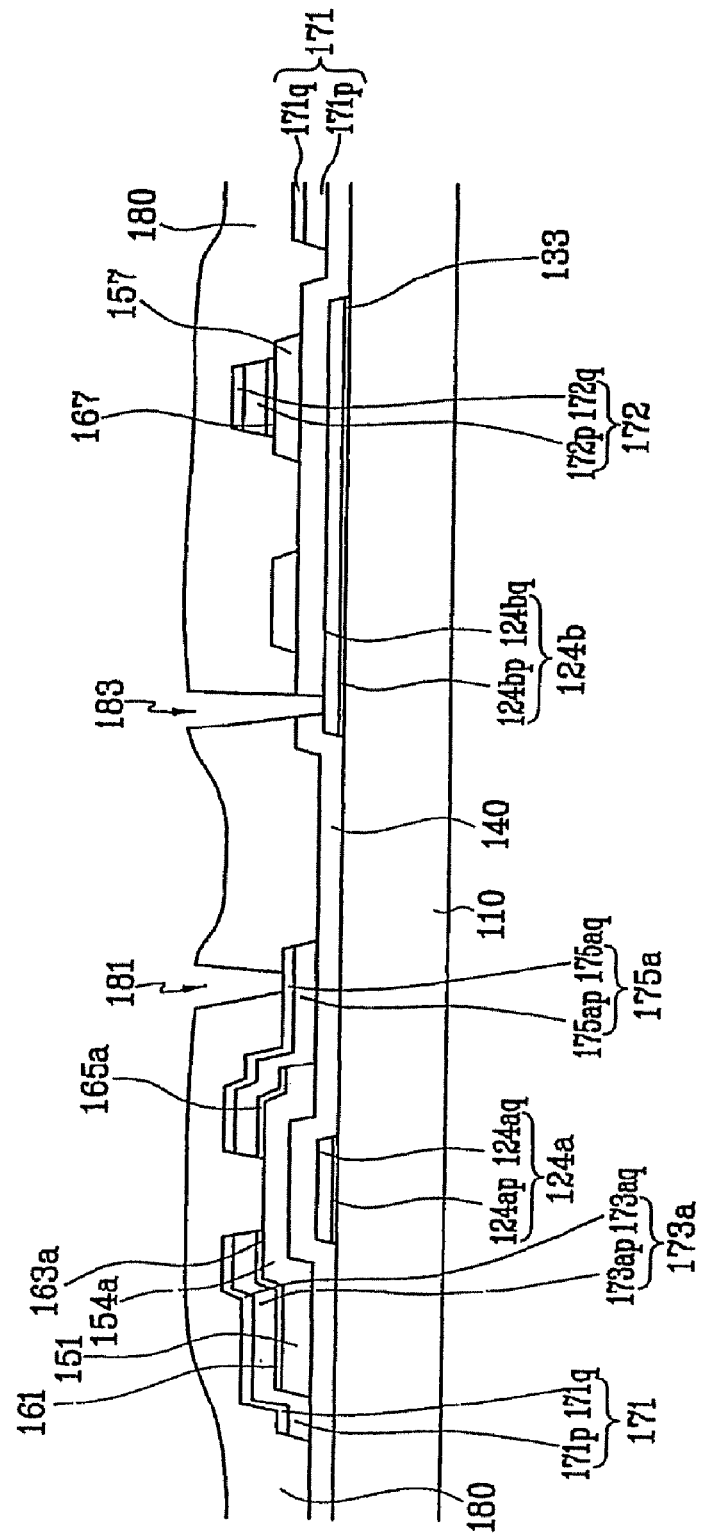
FIGS. 29A, 29B, 29C, and 29D are sectional views of the TFT array panel shown in FIG. 28 taken along the lines XXIXa-XXIXa', XXIXb-XXIXb', XXIXc-XXIXc', and XXIXd-XXIXd'.
Figure 29B:
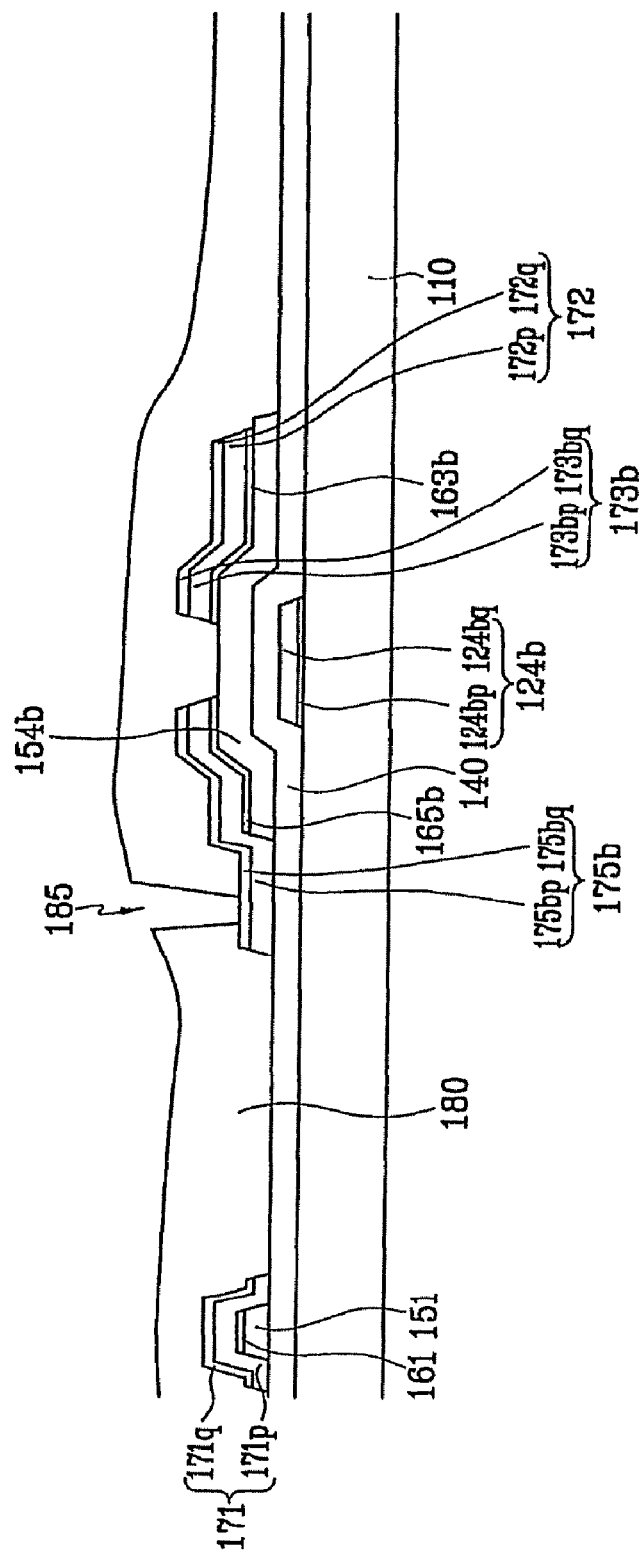
Figure 29C:
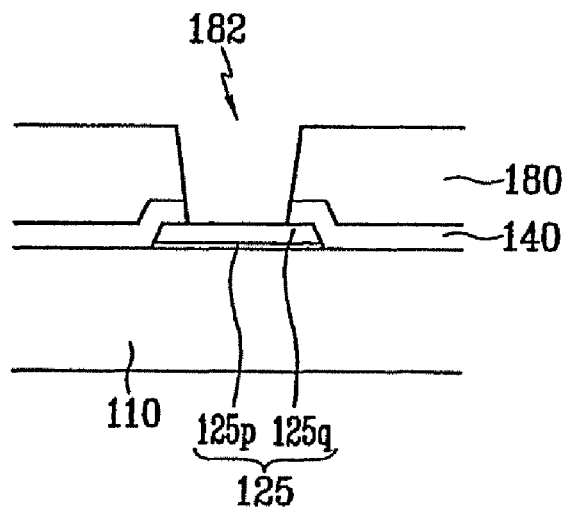
Figure 29D:
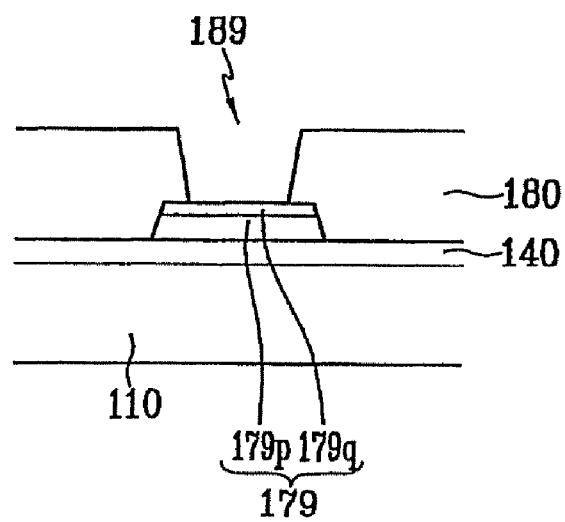
Figure 30:
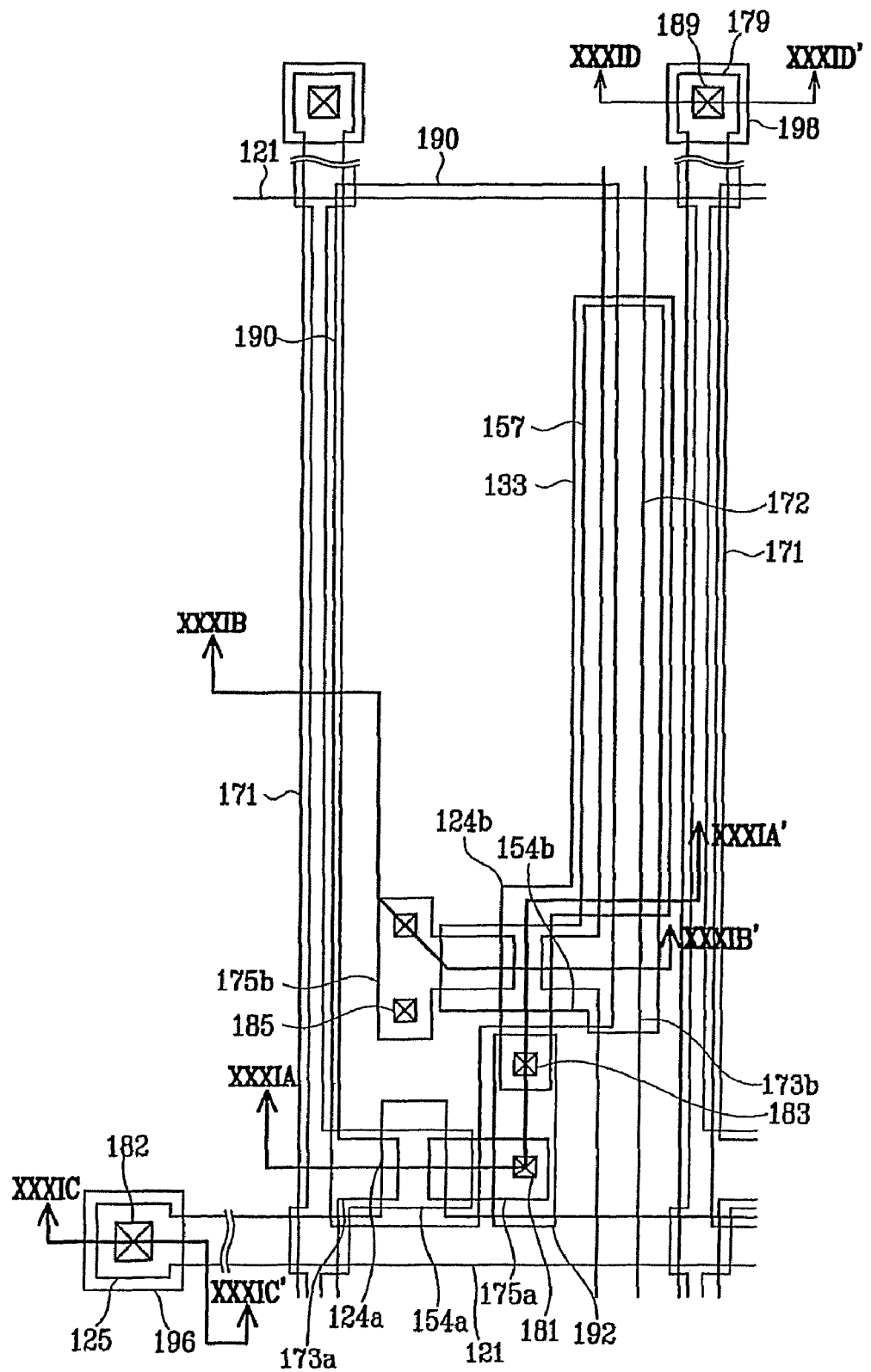
Figure 31A:
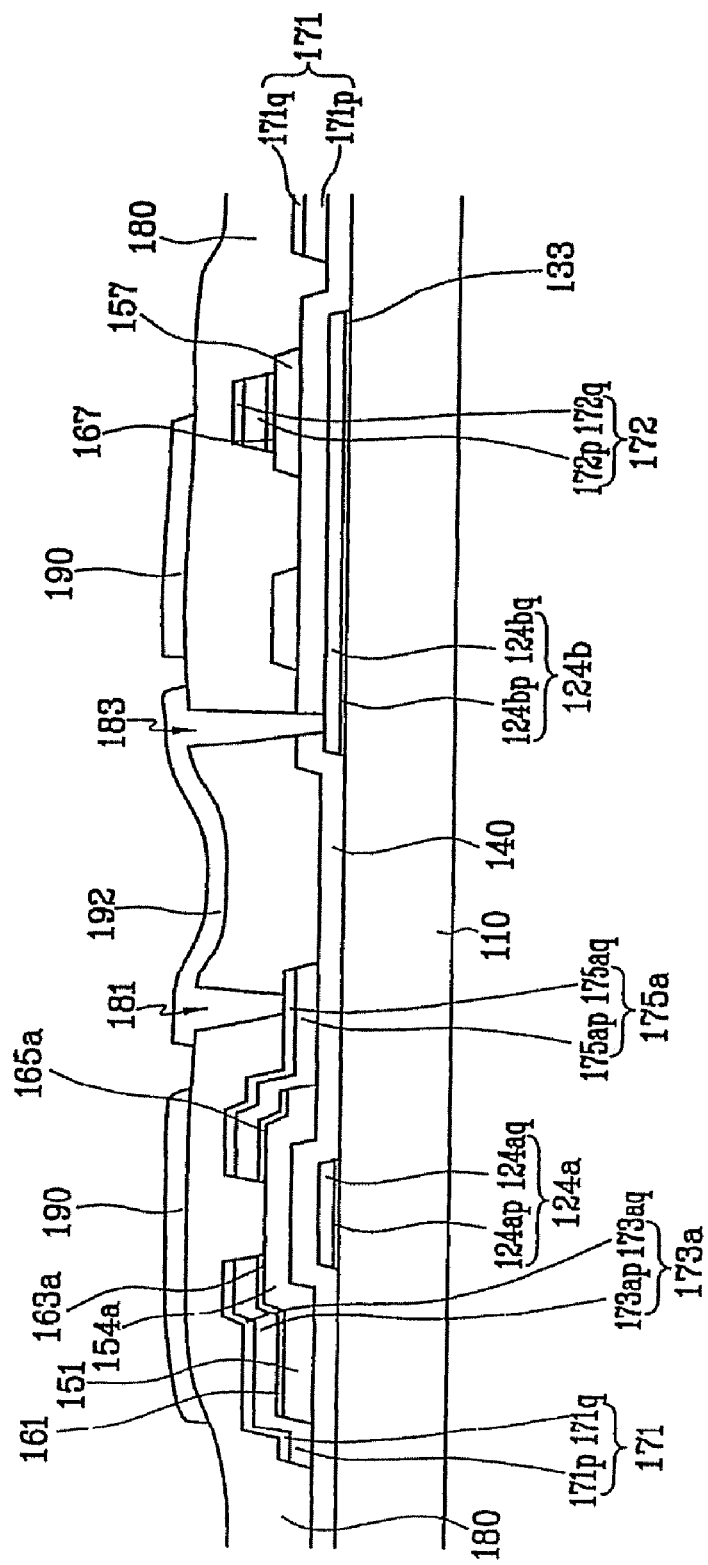
FIGS. 31A, 31B, 31C, and 31D are sectional views of the TFT array panel shown in FIG. 30 taken along the lines XXXIa-XXXIa', XXXIb-XXXIb', XXXIc-XXXIc', and XXXId-XXXId'.
Figure 31B:
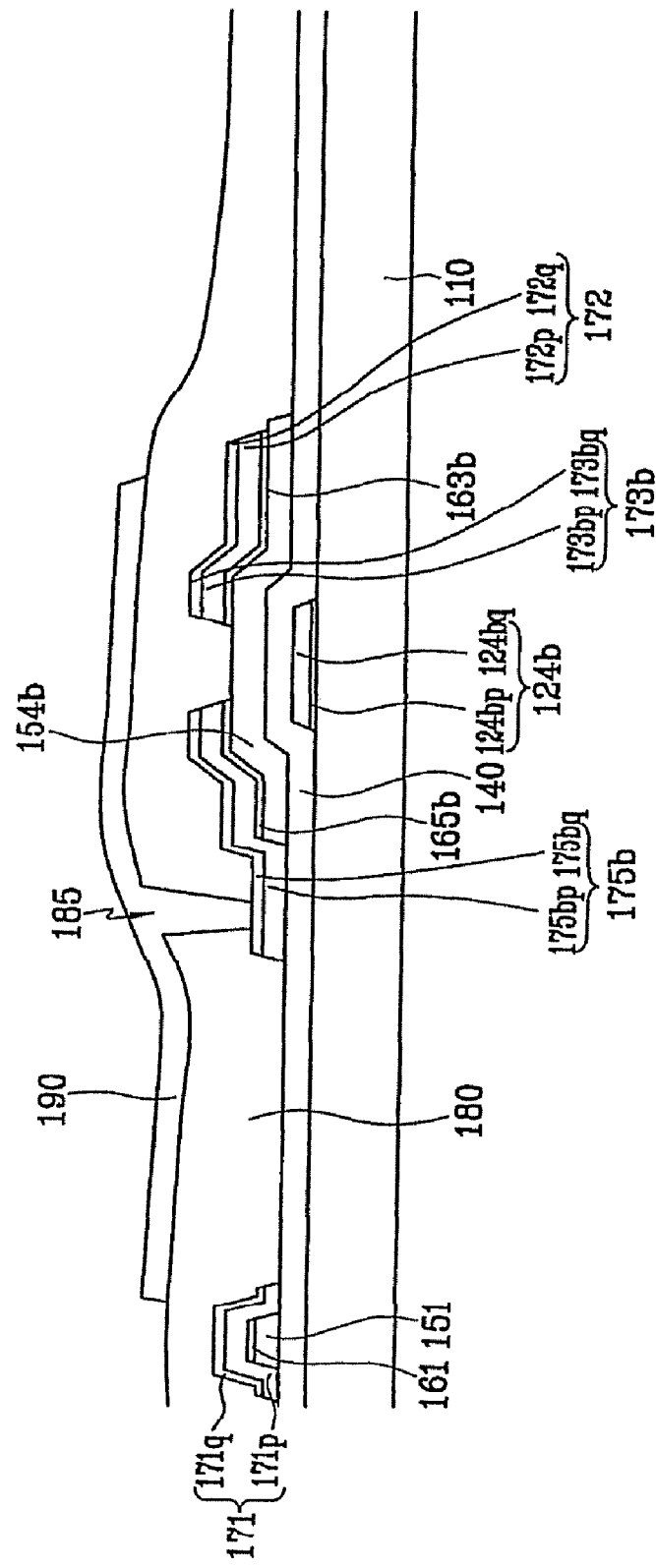
Figure 31C:
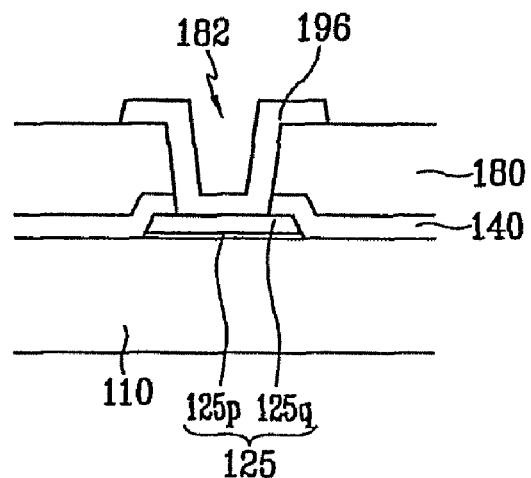
Figure 31D:
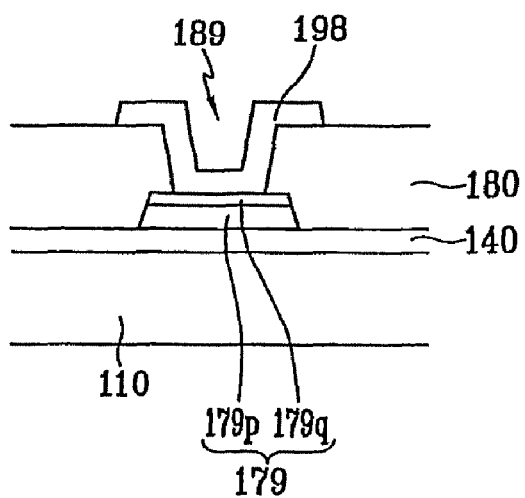
Figure 32:
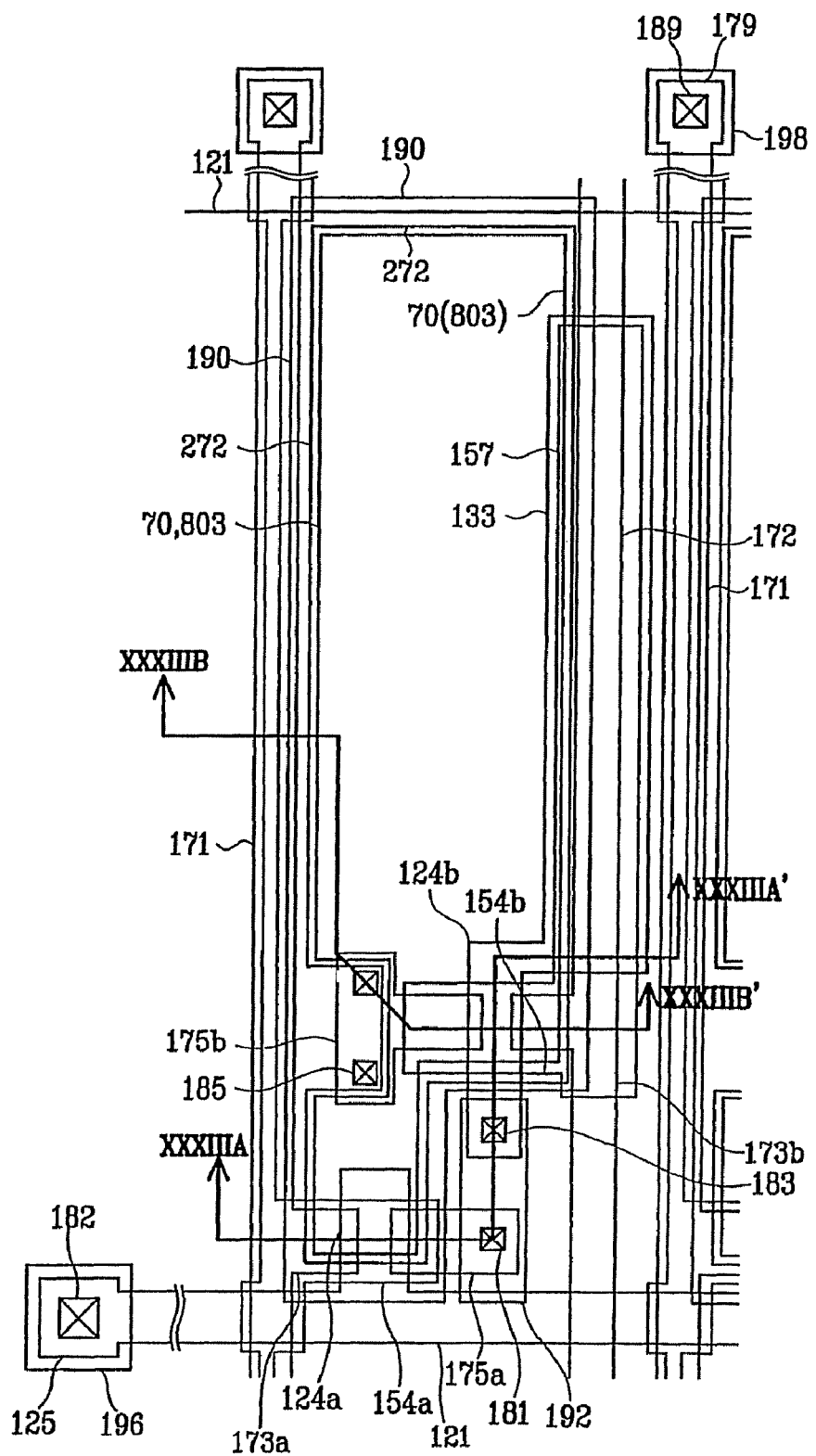
Figure 33A:
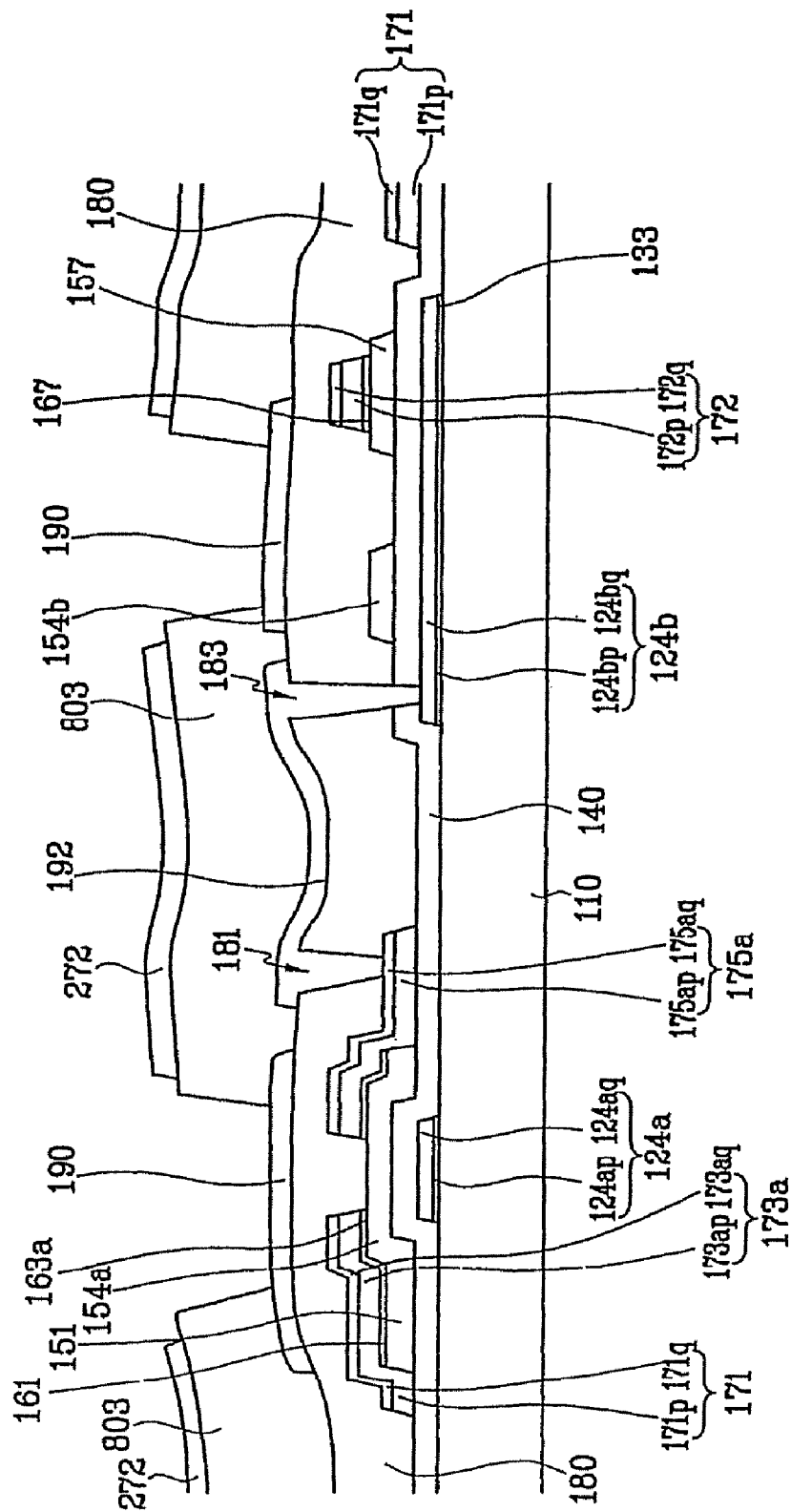
Figure 34:
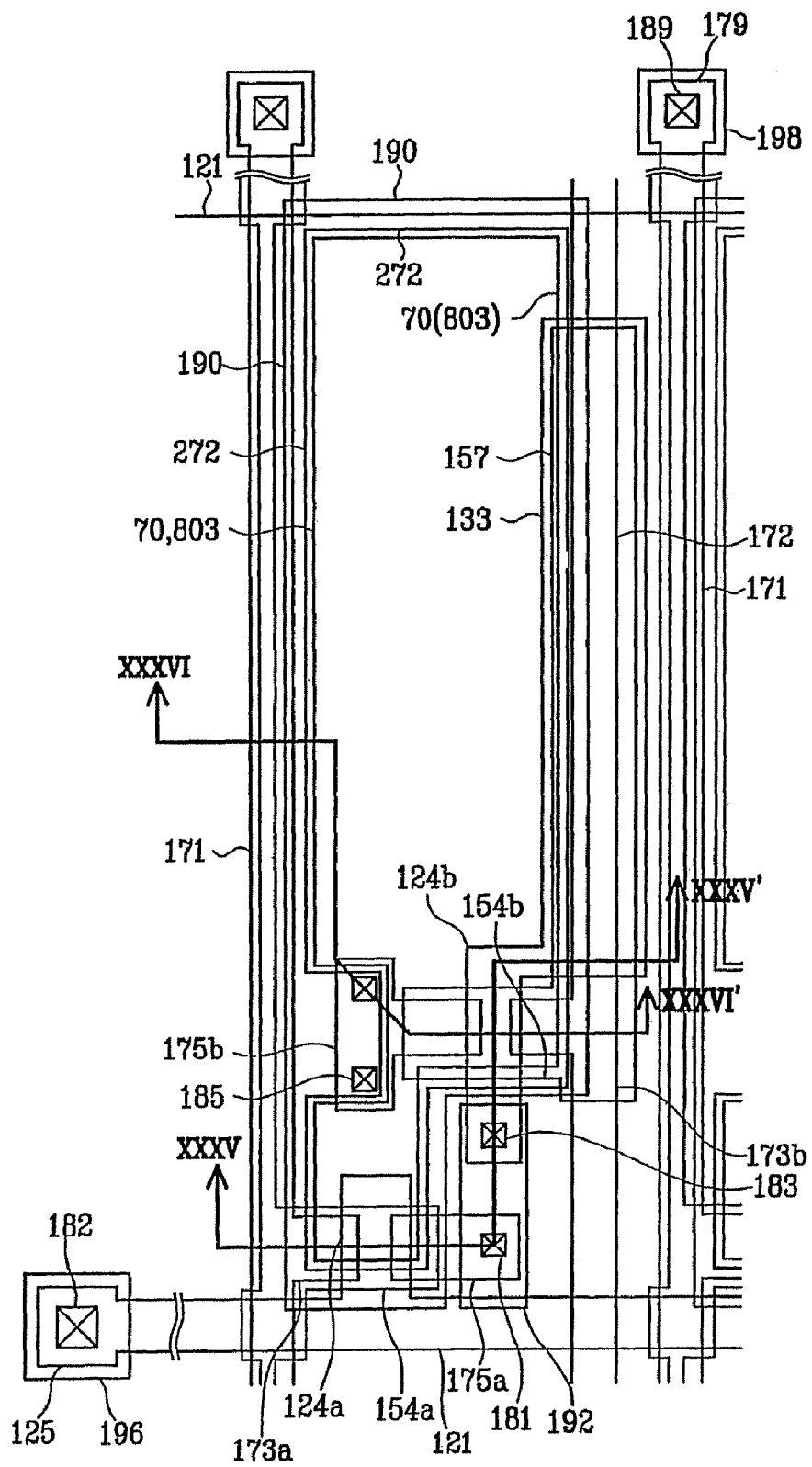
Figure 35:
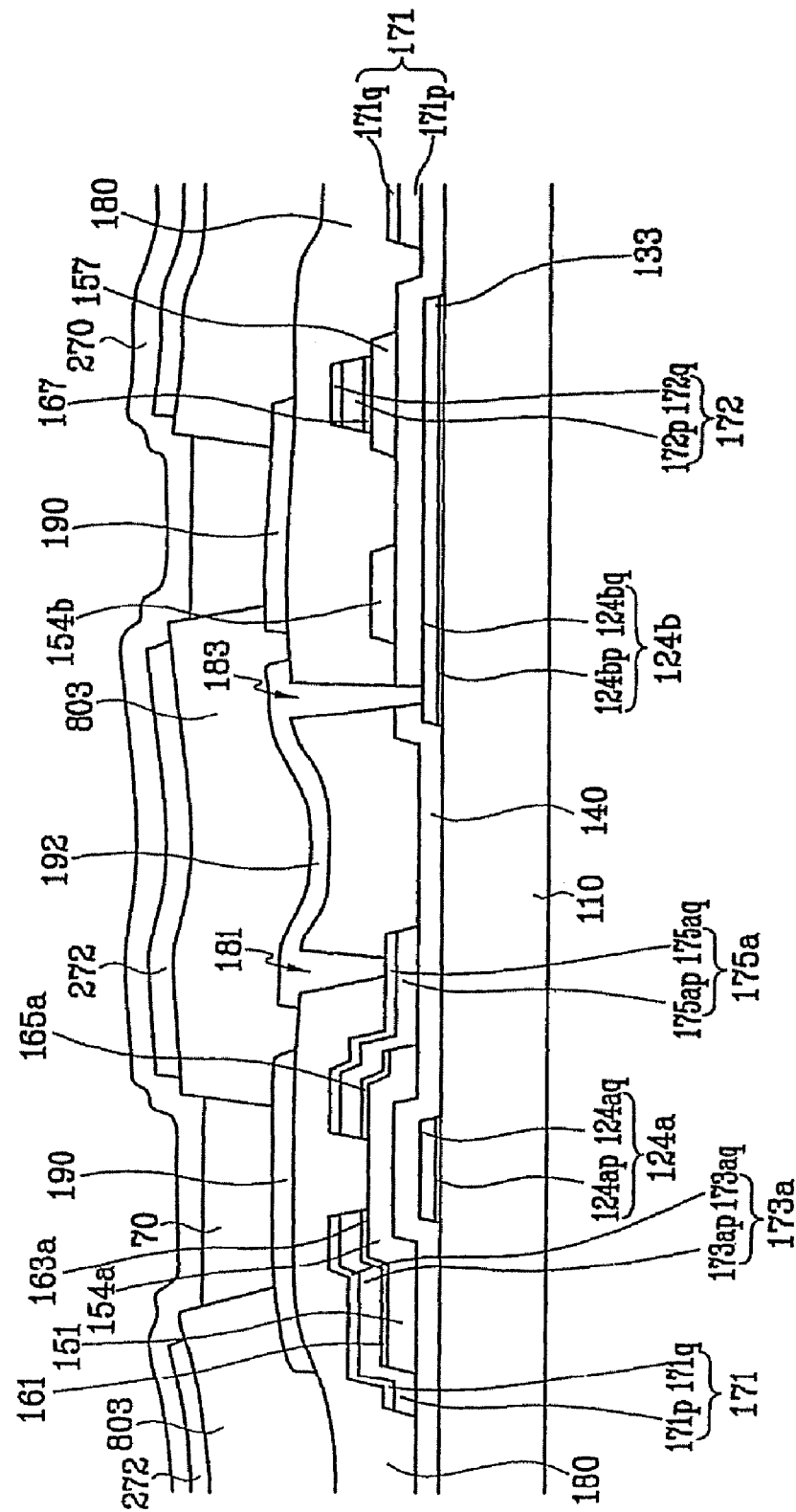
FIGS. 35 and 36 are sectional views of the TFT array panel shown in FIG. 34 taken along the lines XXXV-XXXV' and XXXVI-XXXVI'.
Figure 36:
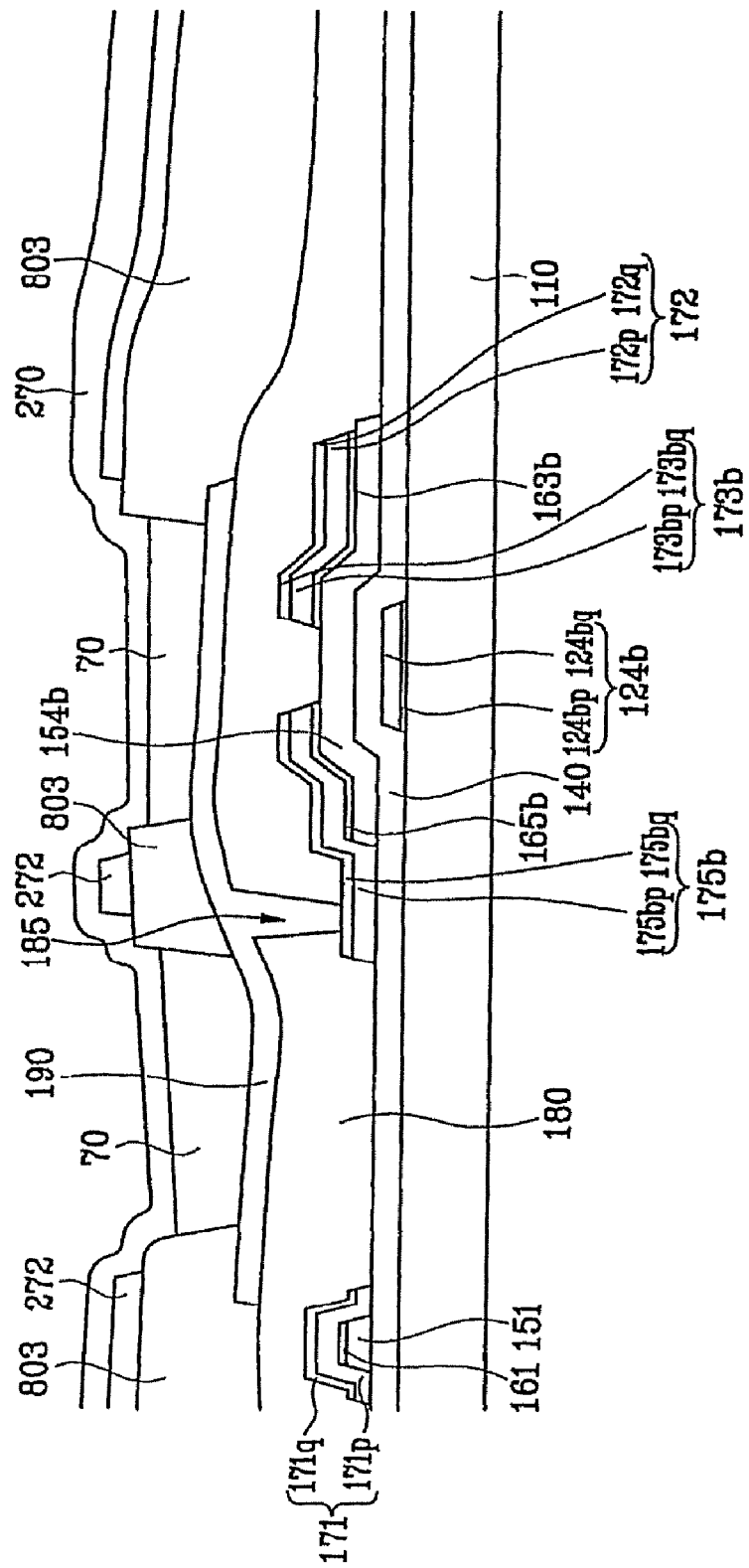

FIGS. 23A, 23B, and 23C are sectional views of the TFT array panel shown in FIG. 22 taken along the lines XXIIIa-XXIIIa', XXIIIb-XXIIIb', and XXIIIc-XXIIIc'. FIGS. 25A, 25B, and 25C are sectional views of the TFT array panel shown in FIG. 24 taken along the lines XXVa-XXVa', XXVb-XXVb', and XXVc-XXVc'. FIGS. 27A, 27B, 27C, and 27D are sectional views of the TFT array panel shown in FIG. 26 taken along the lines XXVIIa-XXVIIa', XXVIIb-XXVIIb', XXVIIc-XXVIIc', and XXVIId-XXVIId'. FIGS. 29A, 29B, 29C, and 29D are sectional views of the TFT array panel shown in FIG. 28 taken along the lines XXIXa-XXIXa', XXIXb-XXIXb', XXIXc-XXIXc', and XXIXd-XXIXd'. FIGS. 31A, 31B, 31C, and 31D are sectional views of the TFT array panel shown in FIG. 30 taken along the lines XXXIa-XXXIa', XXXIb-XXXIb', XXXIc-XXXIc', and XXXId-XXXId'. FIGS. 33A and 33B are sectional views of the TFT array panel shown in FIG. 32 taken along the lines XXXIIIa-XXXIIIa' and XXXIIIb-XXXIIIb'.

As shown in FIGS. 22, 23A, 23B, and 23C, gate metal layers are deposited on a substrate. The metal layers may be deposited using a Co-sputtering technique, wherein two targets may be installed in a same sputtering chamber. One of the targets may be made of Al or Al—Nd, and the other target is made of Cu.

A lower metal layer, which may be made of Al or an Al alloy, and an upper metal layer, which may be made of Cu and is thicker than the lower metal layer, are formed on an insulating substrate 110, which may be made of glass, by a Co-sputtering technique. For example, the upper metal layer may be about 2,000 Å thick and the lower metal layer may be about 300 Å thick.

The upper metal layer and lower metal layer are then simultaneously patterned to form a plurality of gate lines 121 having a plurality of first gate electrodes 124a, a plurality second electrodes 124b, and storage electrodes 133. For example, the upper layer and the lower layer are preferably etched by an etchant of $H_2O_2$ or an etchant containing $H_2O_2$, phosphoric acid ($H_3PO_4$), nitric acid ($HNO_3$), acetic acid ($CH_3COOH$), and deionized water. Specially, the etchant may include about 50% to about 80% of phosphoric acid, about 2% to about 10% of nitric acid, about 2% to about 15% of acetic acid, and deionized water to fill the residual quantity.

Referring to FIGS. 25, 26A, 26B, and 26C, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 and islands 154b including projections 154a on the gate insulating layer 140. For example, the gate insulating layer 140 is preferably made of silicon nitride with a thickness of about 2,000 Å to about 5,000 Å, and the deposition temperature is preferably in a range of about 250° C. to about 500° C.

Referring to FIGS. 26, 27A, 27B, 27C, and 27D, a first layer of Mo-alloy, a second layer of Al (or Al-alloy), and a third layer of Mo-alloy are sequentially deposited on the extrinsic semiconductor stripes 164 by a Co-sputtering technique. The first and third layers may be made of a molybdenum alloy (Mo-alloy), which is composed of molybdenum (Mo) and at least one of niobium (Nb), vanadium (V), and titanium (Ti). The three layers are etched using a photoresist (not shown) to form a plurality of data conductors that include a plurality of data lines 171 including first source electrodes 173a, a plurality of voltage transmission lines 172 including second source electrodes 173b, and a plurality of first and second drain electrodes 175a and 175b.

Before or after removing the photoresist, portions of the extrinsic semiconductor stripes 164, which are not covered with the data conductors 171, 172, 175a, and 175b, are removed by etching to complete a plurality of ohmic contact stripes 161 including projections 163a and a plurality of ohmic contact islands 163b, 165a, and 165b, and to expose portions of the intrinsic semiconductor stripes 151 and islands 154b.

Oxygen plasma treatment may then be performed to stabilize the exposed surfaces of the semiconductor stripes 151.

Referring to FIGS. 28, 29A, 29B, 29C, and 29D, a passivation layer 180 is deposited and patterned to form a plurality of contact holes 189, 185, 183, 181, and 182 exposing the first drain electrode 175A and the second drain electrode 175b, the second gate electrodes 124b, and the end portion 179 of the data line 171.

Referring to FIGS. 31, 32a, 32b, 32c, and 32d, a plurality of pixel electrodes 190, a plurality of connecting members 192, and contact assistants 196 and 198 are formed on the passivation layer 180 with ITO or IZO.

Referring to FIGS. 33a, 33b, 34, 35, and 36, a partition 803 and an auxiliary electrode 272 are formed by using a single photolithography operation.

A plurality of organic light emitting members 70, preferably including multiple layers, may then be formed in the openings by deposition or inkjet printing following a masking, and a common electrode 270 may then be formed as shown in FIGS. 22, 23A, 23B, 23C, and 24.

As discussed above, the invention provides TFT array panels having gate lines that include a lower layer of an Al containing metal and an upper layer of a Cu containing metal that is thicker than the lower layer. Such gate lines have low resistance and strong adhesiveness to the substrate. Since the lower layer of the Al containing metal and the upper layer of the Cu containing metal may be simultaneously etched by an etching process, a manufacturing process of the TFT array panel is simplified.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor array (TFT) panel, comprising:

forming a gate line on an insulating substrate, the gate line having a first layer including Al, a second layer including Cu and is thicker than the first layer, and a gate electrode;

sequentially depositing a gate insulating layer, a semiconductor layer, and an ohmic contact layer on the gate line;

patterning the semiconductor layer and the ohmic contact layer;

forming a drain electrode and a data line having a source electrode on the gate insulating layer and the ohmic contact layer, the drain electrode facing the source electrode with a gap formed therebetween;

forming a passivation layer having a contact hole that exposes the drain electrode, the passivation layer being formed on the data line and the drain electrode; and forming a pixel electrode on the passivation layer, the pixel electrode being coupled with the drain electrode through the contact hole, wherein the second layer is formed to be more than four times thicker than the first layer.

2. The method of claim 1, wherein forming the gate line on the insulating substrate comprises:

sequentially depositing the first layer and the second layer on the insulating substrate; and simultaneously patterning the first layer and the second layer via an etching process.

3. The method of claim 2, wherein the first layer and the second layer are etched by an etchant including $H_2O_2$.

4. The method of claim 3, wherein the etchant further contains at least one of phosphoric acid ($H_3PO_4$), nitric acid ($HNO_3$), and acetic acid ($CH_3COOH$).

5. The method of claim 2, wherein the first layer and the second layer are etched using an etchant containing phosphoric acid ($H_3PO_4$), nitric acid ($HNO_3$), and acetic acid ($CH_3COOH$).

6. The method of claim 5, wherein the etchant includes about 50% to about 80% of phosphoric acid, about 2% to about 10% of nitric acid, and about 2% to about 15% of acetic acid.

7. The method of claim 1, wherein forming the gate line on the insulating substrate comprises:

sequentially depositing the first layer and the second layer on a insulating substrate in sequence; and sequentially patterning the first layer and the second layer using a wet etching and a dry etching process.

8. The method of claim 1, wherein the data line and the semiconductor layer are formed by a photo-etching process using a photoresist pattern having a first portion, a second portion that is thicker than the first portion, and a third portion that is thinner than the first portion.

9. The method of claim 8, wherein the first portion is arranged between the source electrode and the drain electrode, and the second portion is arranged on the data line and the drain electrode.

10. The method of claim 1, further comprising:

forming a color filter on the insulating substrate before forming the passivation layer.

* * * * *